(12) United States Patent
Yoon et al.

(10) Patent No.: US 7,425,493 B2
(45) Date of Patent: Sep. 16, 2008

(54) METHODS OF FORMING DIELECTRIC STRUCTURES AND CAPACITORS

(75) Inventors: Kyoung-Ryul Yoon, Goyang-si (KR);
Han-Mei Choi, Seoul (KR);
Seung-Hwan Lee, Seoul (KR); Dae-Sik Choi, Seoul (KR); Ki-Yeon Park, Seoul (KR); Young-Sun Kim, Suwon-si (KR);
Sung-Tae Kim, Seoul (KR); Cha-Young You, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 11/059,449

(22) Filed: Feb. 17, 2005

(65) Prior Publication Data

US 2005/0170601 A1 Aug. 4, 2005

Related U.S. Application Data

(63) Continuation-in-part of application No. 11/046,876, filed on Feb. 1, 2005, now Pat. No. 7,279,392, which is a continuation-in-part of application No. 10/632,825, filed on Aug. 4, 2003, now Pat. No. 7,151,039.

(30) Foreign Application Priority Data

Aug. 17, 2002 (KR) .............................. 2002-48720
Nov. 29, 2004 (KR) ......................... 10-2004-98552
Dec. 31, 2004 (KR) ..................... 10-2004-0117785

(51) Int. Cl.
*H01L 21/20* (2006.01)
*H01L 21/31* (2006.01)

(52) U.S. Cl. ..................... 438/396; 438/763; 438/785

(58) Field of Classification Search ................. 438/396, 438/763, 785
See application file for complete search history.

(56) References Cited

U.S. PATENT DOCUMENTS 6,124,162 A * 9/2000 Lin ............................ 438/238

(Continued)

FOREIGN PATENT DOCUMENTS

KR 10-2001-0082118 8/2001

(Continued)

OTHER PUBLICATIONS

Hausmann et al., "Atomic Layer Deposition of Hafnium and Zirconium Oxides Using Metal Amide Precursors", Sep. 2002, American Chemical Society, Chem. Mater. No. 14, pp. 4350-4358.*

(Continued)

*Primary Examiner*—Evan Pert
(74) *Attorney, Agent, or Firm*—Harness, Dickey & Pierce, P.L.C.

(57) ABSTRACT

A capacitor including a dielectric structure, a lower electrode may be formed on a substrate. The dielectric structure may be formed on the lower electrode, and may include a first thin film, which may improve a morphology of the dielectric structure, and a second thin film, which may have at least one of an EOT larger than that of the first thin film and a dielectric constant higher than that of the first thin film. An upper electrode may be formed on the dielectric structure, and the dielectric structure may have an improved morphology and/or a higher dielectric constant.

37 Claims, 40 Drawing Sheets

U.S. PATENT DOCUMENTS

| | | |
|---|---|---|
| 6,207,528 B1 * | 3/2001 | Lee .............................. 438/398 |
| 6,270,572 B1 * | 8/2001 | Kim et al. ..................... 117/93 |
| 6,319,730 B1 | 11/2001 | Ramdani et al. |
| 6,348,386 B1 | 2/2002 | Gilmer |
| 6,407,435 B1 | 6/2002 | Ma et al. |
| 6,420,279 B1 | 7/2002 | Ono et al. |
| 6,660,660 B2 | 12/2003 | Haukka et al. |
| 6,709,989 B2 | 3/2004 | Ramdani et al. |
| 6,753,618 B2 | 6/2004 | Basceri et al. |
| 2002/0153579 A1 * | 10/2002 | Yamamoto ................. 257/412 |
| 2002/0190294 A1 | 12/2002 | Iizuka et al. |
| 2004/0012043 A1 * | 1/2004 | Gealy et al. ................. 257/303 |

FOREIGN PATENT DOCUMENTS

| | | |
|---|---|---|
| KR | 2002-0063525 | 8/2002 |
| KR | 10-2004-0016779 | 2/2004 |
| KR | 10-2004-0060443 | 7/2004 |
| KR | 1020040084700 | 10/2004 |

OTHER PUBLICATIONS

Korean Office Action dated May 11, 2005.

* cited by examiner

FAIG. 18A
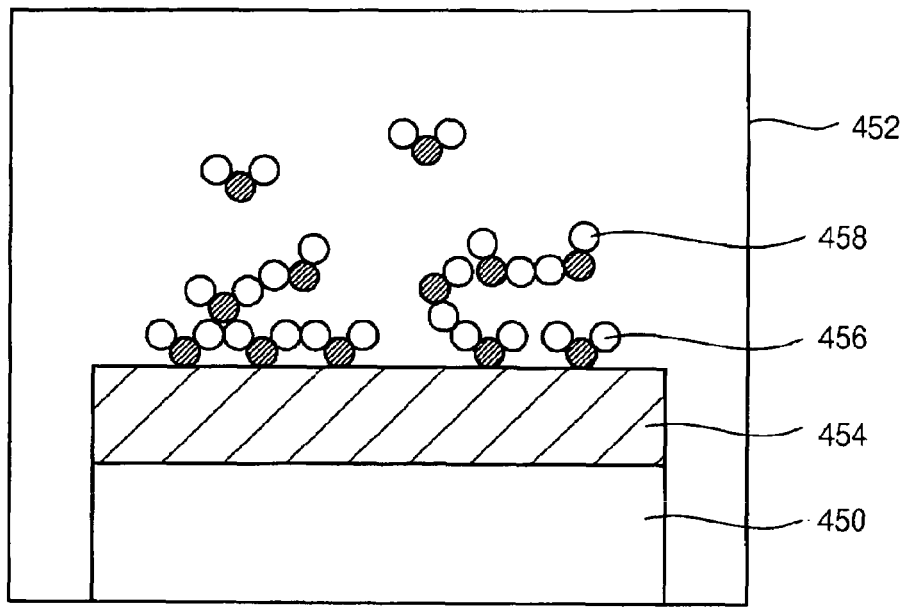
FIG. 18B
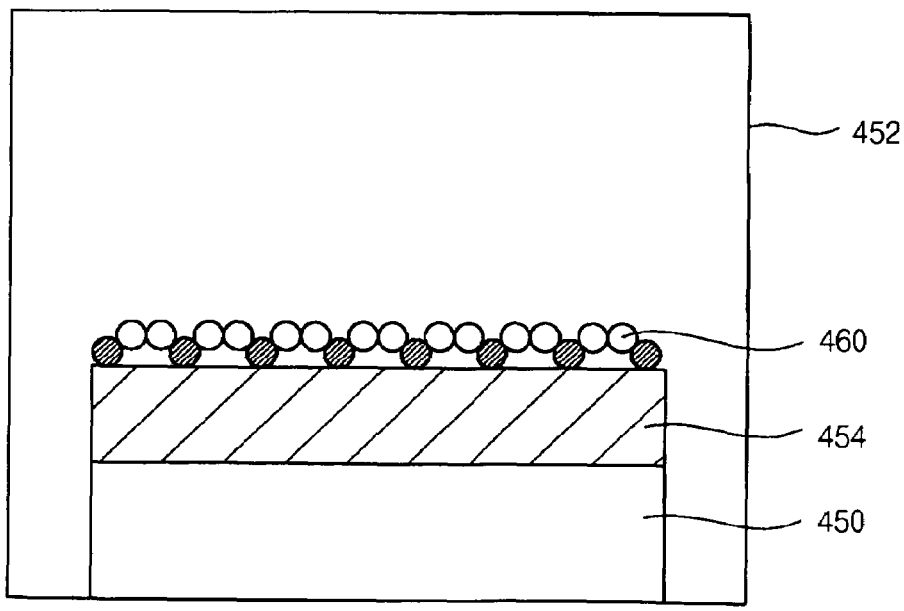

METHODS OF FORMING DIELECTRIC STRUCTURES AND CAPACITORS

RELATED APPLICATION

This application claims priority under 35 U.S.C. § 119 from Korean Patent Application No. 2004-117785, filed Dec. 31, 2004, and is a continuation-in-part application of and claims priority under 35 U.S.C. § 120 of U.S. patent application Ser. No. 11/046,876, filed on Feb. 1, 2005 now U.S. Pat. No. 7,279,392 and entitled "THIN FILM STRUCTURE, CAPACITOR, AND METHODS FOR FORMING THE SAME", which claims priority under 35 U.S.C. § 119 from Korean Patent Application No. 2004-98552, filed on Nov. 29, 2004, which is a continuation-in-part application of and claims priority under 35 U.S.C. § 120 of U.S. patent application Ser. No. 10/632,825, filed on Aug. 4, 2003 now U.S. Pat. No. 7,151,039 and entitled "METHOD OF FORMING OXIDE LAYER USING ATOMIC LAYER DEPOSITION METHOD AND METHOD OF FORMING CAPACITOR OF SEMICONDUCTOR DEVICE USING THE SAME", which claims priority under 35 U.S.C. § 119 from Korean Patent Application No. 2002-48720, filed on Aug. 17, 2002, the contents of all of which are hereby incorporated by reference in their entirety.

BACKGROUND OF THE INVENTION

1. Field of the Invention

Example embodiments of the present invention relate to methods of forming dielectric structures and capacitors using the same.

2. Description of the Conventional Art

A material, which may have a higher dielectric constant may be used for a gate insulation layer of, for example, a metal oxide semiconductor (MOS) transistor or a dielectric layer of a capacitor. A higher dielectric constant may have a thin equivalent oxide thickness (ETO) and may more efficiently reduce a leakage current generated between a gate electrode and a channel region or between a lower electrode and an upper electrode. Zirconium oxide ($ZrO_2$), for example, may be used as the material having the higher dielectric constant. For example, a method of forming a film including zirconium oxide may use TEMAZ (tetrakis methyl ethyl amino zirconium; $Zr[N(CH_3)(C_2H_5)]_4$) and a method of forming a zirconium oxide film for a dielectric layer of a capacitor may use zirconium chloride ($ZrCl_4$).

A multi-layered structure, which may include a zirconium oxide, may be used for a dielectric layer of a capacitor. A dielectric layer of a capacitor may include an aluminum oxide film and an oxide film or a composite film formed on the aluminum oxide film. The oxide film may include tantalum oxide, zirconium oxide or hafnium oxide, and the composite film may include hafnium-aluminum oxide or lanthanum-aluminum oxide.

In an alternative, a dielectric layer of a capacitor may include a silicate interface film and a higher dielectric film formed on the silicate interface film. The higher dielectric film may include a hafnium oxide film, a zirconium oxide film, a tantalum oxide film, an aluminum oxide film, a titanium oxide film, an yttrium oxide film, a barium-strontium-titanium oxide (BST) film or a plumbum-zirconate-titanate (PZT) film. In another alternative, a dielectric layer of a capacitor may include a silicon oxide film, a silicon nitride film, an aluminum oxide film, a tantalum oxide film, a titanium oxide film, a hafnium oxide film, a zirconium oxide film, a BST film or a PZT film.

The energy band gaps and dielectric constants of oxides such as $Ta_2O_5$, $Y_2O_3$, $HfO_2$, $ZrO_2$, $Nb_2O_5$, $BaTiO_3$ and $SrTiO_3$, which may be used as dielectric materials, are graphically illustrated in FIG. 1. A morphology of a thin film including zirconium oxide according to a conventional method of forming the thin film is illustrated in FIG. 16.

SUMMARY OF THE INVENTION

Example embodiments of the present invention provide capacitors, dielectric structures, methods of forming the capacitors and dielectric structures included therein.

An example embodiment of the present invention provides a method for forming a capacitor including a dielectric structure. A first electrode may be formed on a substrate. The dielectric structure may be formed on the first electrode. The dielectric structure may include a first thin film, which may improve the morphology of the dielectric structure, and a second thin film, which may have at least one of an equivalent oxide thickness larger than that of the first thin film and a dielectric constant higher than that of the first thin film. A second electrode may be formed on the dielectric structure.

Another example embodiment of the present invention may provide a method of forming a capacitor including a dielectric structure. A first electrode may be formed on a substrate, and a dielectric structure may be formed on the first electrode. The dielectric structure may include at least one first thin film, which may improve the morphology of the dielectric structure, and at least one second thin film having at least one of an equivalent oxide thickness larger than that of the first thin film and a dielectric constant higher than that of the first thin film. A second electrode may be formed on the dielectric structure.

Another example embodiment of the present invention provides a method of forming a dielectric structure. At least one first thin film and at least one second thin film may be formed. The at least one first thin film may improve a morphology of the dielectric structure, and the at least one second thin film may at least one of an equivalent oxide thickness larger than that of the first thin film and a dielectric constant higher than that of the first thin film.

In example embodiments of the present invention, the first electrode may include at least one of titanium nitride, ruthenium, tantalum nitride and tungsten nitride. The second electrode may include at least one of polysilicon, titanium nitride, ruthenium, tantalum nitride and tungsten nitride. The first and the second electrodes may be formed using an atomic layer deposition (ALD) process or a chemical vapor deposition (CVD) process.

In example embodiments of the present invention, one or more electrodes may be cylindrical.

In example embodiments of the present invention, the dielectric structure may be formed at a temperature of about 200° C. to about 400° C. and/or a pressure of about 0.1 Torr to about 3.0 Torr.

In example embodiments of the present invention, the first thin film may be formed on the first electrode using a first material that includes a precursor and a first oxidant for oxidizing the first material. The second thin film may be formed on the first thin film using a second material that includes a precursor and a second oxidant for oxidizing the second material.

In example embodiments of the present invention, the first material may include TMA (trimethyl aluminum), and the second material may include at least one of TEMAZ (tetrakis methyl ethyl amino zirconium) and zirconium-butyl oxide.

The first and the second oxidants may include at least one of ozone, oxygen, water vapor, oxygen plasma and remote oxygen plasma.

In example embodiments of the present invention, a first portion of the first material may be chemisorbed to the first electrode and a second portion of the first material may be physically absorbed to the chemisorbed first portion of the first material. The second portion of the first material may be removed, and the first oxidant may be provided on the chemisorbed first portion of the first material. A first metal oxide material may be formed on the first electrode by chemically reacting the first portion of the first material with the first oxidant, and an unreacted first oxidant may be removed. The chemisorbing the first portion of the first material, physically absorbing the second portion of the first material, removing the second portion of the first material, providing the first oxidant, forming the first metal oxide material and removing the unreacted first oxidant may be repeated at least once.

In example embodiments of the present invention, a first portion of the second may be chemisorbed to the first thin film and a second portion of the second material may be physically absorbed to the chemisorbed first portion of the second material. The second portion of the second material may be removed. The second oxidant may be provided on the chemisorbed first portion of the second material. A second metal oxide material may be formed on the first thin film by chemically reacting the first portion of the second material with the second oxidant, and an unreacted second oxidant may be removed. The chemisorbing the first portion of the second material, physically absorbing the second portion of the second material, removing the second portion of the second material, providing the second oxidant, forming the second metal oxide material and removing the unreacted second oxidant may be repeated at least once.

In example embodiments of the present invention, the dielectric structure may have a double-layered structure, which may include the first thin film and the second thin film.

In example embodiments of the present invention, the dielectric structure may have a laminated structure in which a plurality of first thin films and a plurality of second thin films may be alternately stacked. The first thin film may be formed on the first electrode, and the second thin film may be formed on the first thin film. A plurality of additional first thin films and a plurality of additional second thin films may be alternately formed on the second thin film.

In example embodiments of the present invention, the dielectric structure may have a structure in which the second thin film may be interposed between two of the first thin films or the first thin film may be interposed between two of the second thin films. The first thin film may be formed on the lower electrode, and the second thin film may be formed on the first thin film. An additional first thin film may be formed on the second thin film.

In example embodiments of the present invention, the second thin film may be formed on the first electrode, and the first thin film may be formed on the second thin film. An additional second thin film may be formed on the first thin film.

In example embodiments of the present invention, the first thin film may have a thickness of about 1 Å to about 100 Å, and/or the second thin film may have a thickness of about 5 Å to about 400 Å. The second thin film may have a dielectric constant of greater than or equal to about 30.

BRIEF DESCRIPTION OF THE DRAWINGS

Example embodiments of the present invention will become readily apparent along with the following detailed description when considered in conjunction with the accompanying drawings wherein:

FIGS. 18A to 18J are cross sectional views illustrating a method of forming a capacitor in accordance with an exemplary embodiment of the present invention;

DETAILED DESCRIPTION OF THE EXAMPLE EMBODIMENTS OF THE PRESENT INVENTION

Figure 1:
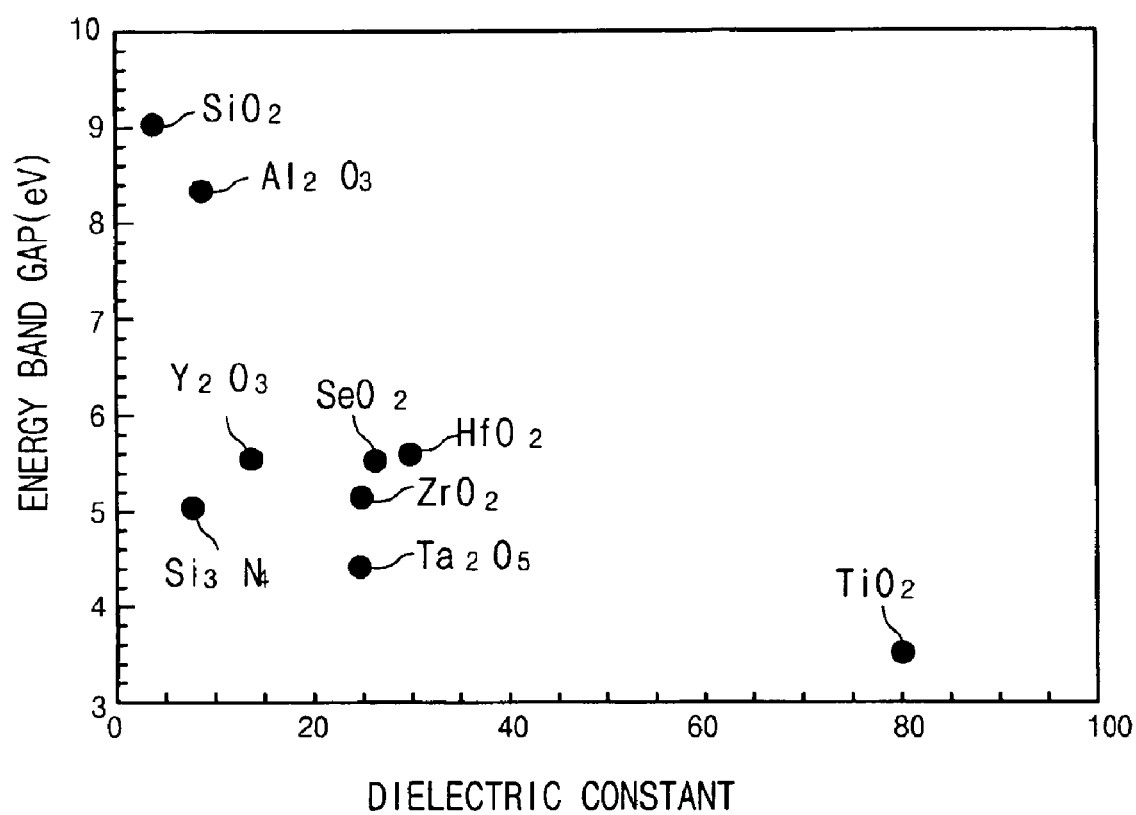
FIG. 1 illustrates the energy band gaps and dielectric constants of various materials.

Example embodiments of the present invention now will be described more fully hereinafter with reference to the accompanying drawings, in which example embodiments of the invention are shown. Example embodiments of the present invention may, however, be embodied in many different forms and should not be construed as limited to the example embodiments set forth herein; rather, these embodiments are provided so that this disclosure will be through and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

Figure 2A:
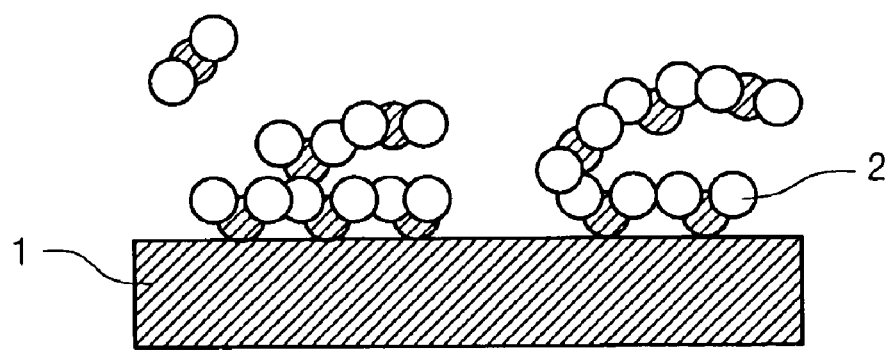
FIGS. 2A to 2E are cross sectional views illustrating a method of forming an oxide layer using an atomic layer deposition (ALD) process according to an exemplary embodiment of the present invention.

FIGS. 2A to 2E are cross-sectional views for explaining an example embodiment of forming an oxide layer using an atomic layer deposition (ALD) process. As illustrated in FIG. 2A, a substrate 1, such as a silicon wafer, is placed in a chamber in which a temperature of from about 100 to about 500° C. is maintained. The pressure of the chamber is controlled to about 0.4 Torr or less. In an example embodiment, the temperature range is from about 150 to about 350° C. A precursor containing one central metal or semimetal element and an amino functional group is introduced into the chamber using an inert carrier gas such as an argon (Ar) gas or a nitrogen ($N_2$) gas at a flow rate of about 50 to about 5,000 sccm (standard cubic centimeters per minute) for about 1 to about 3 seconds to form an absorption layer 2 on the substrate. In an example embodiment, the flow rate of the inert carrier gas is in a range of about 500 to about 1,500 sccm.

The precursor includes a compound represented by a chemical formula of $MX_n$, where M represents at least one atom of at least one element from Groups 2 and 3A including lanthanide, Group 4A, 5A, 3B, 4B or 5B of the periodic table. In an example embodiment, the element includes at least one element selected from strontium (Sr), barium (Ba), yttrium (Y), lanthanum (La), titanium (Ti), zirconium (Zr), hafnium (Hf), vanadium (V), niobium (Nb), tantalum (Ta), aluminum (Al), germanium (Ge), lead (Pb), arsenic (As), tin (Sn), silicon (Si) and bismuth (Bi). In addition, X represents —$NR_1R_2$ wherein $R_1$ and $R_2$ may be the same or different substituents selected from hydrogen and alkyl groups having 1 to 4 carbon atoms, such as methyl, ethyl, n-propyl, iso-propyl, n-butyl, iso-butyl and tert-butyl groups, and n represents an integer of 2 to 5.

In an example embodiment, the metal precursor is a hafnium metal compound containing hafnium and an amino functional group. Examples of such metal precursors include TEMAH (tetrakis ethyl methyl amino hafnium, $Hf[NC_2H_5CH_3]_4$), TDEAH (tetrakis-diethyl amino hafnium, $Hf[N(C_2H_5)_2]_4$), TDMAH (tetrakis-dimethyl amino hafnium, $Hf[N(CH_3)_2]_4$, $Hf[N(C_3H_7)_2]_4$ and $Hf[N(C_4H_9)_2]_4$. These compounds can be used alone or in a mixture. Other suitable precursors include, $Ti[N(CH_3)C_2H_5]_4$, $Zr[N(CH_3)C_2H_5]_4$, $Sn[N(CH_3)C_2H_5]_4$, $Si[N(CH_3)C_2H_5]_4$, $Ta[N(CH_3)C_2H_5]_5$, $Al[N(CH_3)C_2H_5]_3$ and $(CH_3)_2AlNH_2$.

In an example embodiment, a hafnium oxide ($HfO_2$) layer exhibiting good step coverage and a high dielectric constant is formed utilizing an ALD process for forming a thin film.

When the metal precursor is introduced onto the substrate 1, a portion of the metal precursor is,chemisorbed onto the surface portion of the substrate 1 to form a precursor layer while another portion of the metal precursor tends to be physically absorbed (i.e., physisorbed) onto the chemisorbed molecules or present as free molecules within the deposition chamber.

Figure 2B:
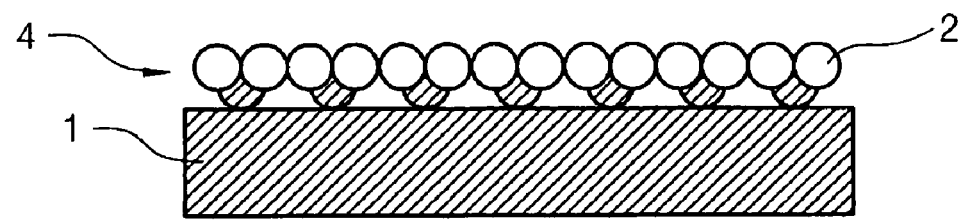

Referring to FIG. 2B, an inert gas such as an argon gas or a nitrogen gas is introduced to remove the portion of the metal precursor that has not been chemisorbed onto the substrate 1 using a purge and/or a vacuum purge process. In an example embodiment, a satisfactory period for maintaining the purge or the vacuum purge process is about 1 to about 20 seconds. In another example embodiment, the time period is 1 to about 4 seconds. During the purge process, the materials that are not chemisorbed are removed from the chamber leaving precursor molecules in a chemical absorption layer 4 on the substrate 1.

Figure 2C:
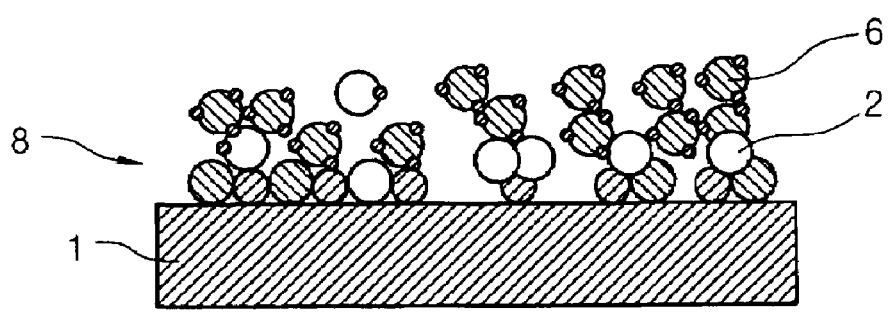

Referring to FIG. 2C, an oxidant 6 is then introduced into the chamber. In an example embodiment, the oxidant 6 is introduced into the chamber at a flow rate of about 500 sccm for about 2 to about 5 seconds. The chemical absorption layer 4 and the oxidant 6 chemically react with each other to form a metal oxide atomic layer 8 on the substrate 1. For example, the Hf contained in a chemisorbed hafnium precursor layer and oxygen originating from the oxidant 6 can react on the surface of substrate 1 to form an atomic layer of $HfO_2$.

The oxidant 6 may include one or more oxidants including activated oxidants that may produce an oxygen radical as well as oxidants containing a hydroxyl functional group. Examples of activated oxidants include ozone ($O_3$), which may be produced by a plasma generating instrument, plasma $O_2$, remote plasma $O_2$ and plasma $N_2O$. When oxygen gas is treated to form ozone, a portion of the $O_2$ gas is converted into $O_3$ to produce a mixed $O_2/O_3$ stream typically comprising about 5 to about 15 mole percent ozone. In addition, example oxidants include those that contain a hydroxyl function group, such as $H_2O$ and $H_2O_2$ and other oxygen containing compounds such as $N_2O$ and $NO_2$.

Figure 2D:
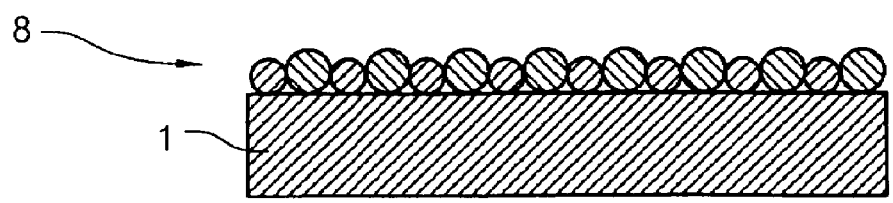

Referring to FIG. 2D, the unreacted oxidant may be removed from the chamber using a purge and/or a vacuum purge process with an inert gas such as argon gas or a nitrogen gas. In an example embodiment, a satisfactory period for maintaining the purge or the vacuum purge process is about 1 to about 20 seconds. In another example embodiment, the purge time period is 1 to about 4 seconds after forming metal oxide atomic layer 8.

Figure 2E:
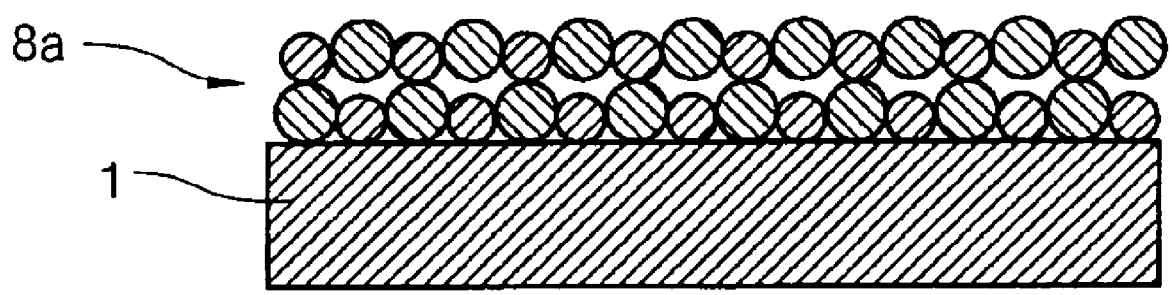

Referring to FIG. 2E, a thicker metal oxide atomic layer 8a having a desired thickness is formed on the substrate 1 by repeating the above-described steps of introducing the metal precursor onto the substrate to form a chemisorbed precursor layer, purging to remove the precursor compounds not included in the chemisorbed precursor layer, introducing an oxidant to oxidize the chemisorbed metal precursor layer and purging the chamber to remove the unreacted oxidant.

During implementing the above-described steps, an example temperature range within the chamber is about 100 to about 500° C. In another example embodiment, the temperature in the chamber is maintained at a temperature of about 150 to about 350° C. Through this temperature control, thermal damage to and/or the thermal budget of underlying layers can be reduced or minimized during the formation of metal oxide layers such as $HfO_2$.

A liquid source of the metal precursor containing an amino functional group utilized in example embodiments of the present invention have a relatively high vapor pressure when comparing with other precursors such as halogen precursors. This indicates that a larger number of metal precursors having an amino functional group will be available for reaction than corresponding halogen precursors at similar deposition conditions. Therefore, when the liquid source including an amino functional group is used as the precursor, a large amount of metal source gas is introduced into the evaporating chamber to increase the number of molecules directly supplied onto the bottom portion of structures having aspect ratios greater than about 1:10 or stepped portions. Accordingly, a thin film having improved step coverage can be formed using a metal precursor containing an amino functional group according to example embodiments of the present invention rather than using the conventional halogen precursor. In addition, the thickness and uniformity of the thin metal oxide layer (for instance less than about 30 Å) also can be controlled advantageously.

When implementing the step illustrated in FIG. 2C, any oxidant, including both activated oxidants that can produce oxygen radicals and oxidants containing a hydroxyl functional group can be used. In an example embodiment, ozone gas is used in order to form a dielectric layer having improved breakdown resistance characteristics. When $H_2O$ is used as the oxidant, an —OH bond may be created within the metal oxide film resulting in an increased likelihood of forming fixed or trapped charges and increased dielectric leakage.

In addition, the ability to purge $H_2O$ vapor may be inferior to the ability to purge $O_3$, resulting in a need to increase purge and/or evaporation times. Further, when $H_2O$ vapor is used as the oxidant, charge trapping may be induced at layer interfaces resulting in a deterioration or degradation of the interface characteristics. When these problems occur, the likelihood of soft errors in the resulting memory devices tends to be increased, compromising the reliability of the devices. However, when $O_3$ is used as the oxidant, the above-described problems are generally minimized or reduced and stable dielectric and leakage current characteristics may be obtained. In addition, the $O_3$ oxidant has a low dependency on an underlying layer and is, therefore, used in example embodiments of the present invention.

Figure 3:
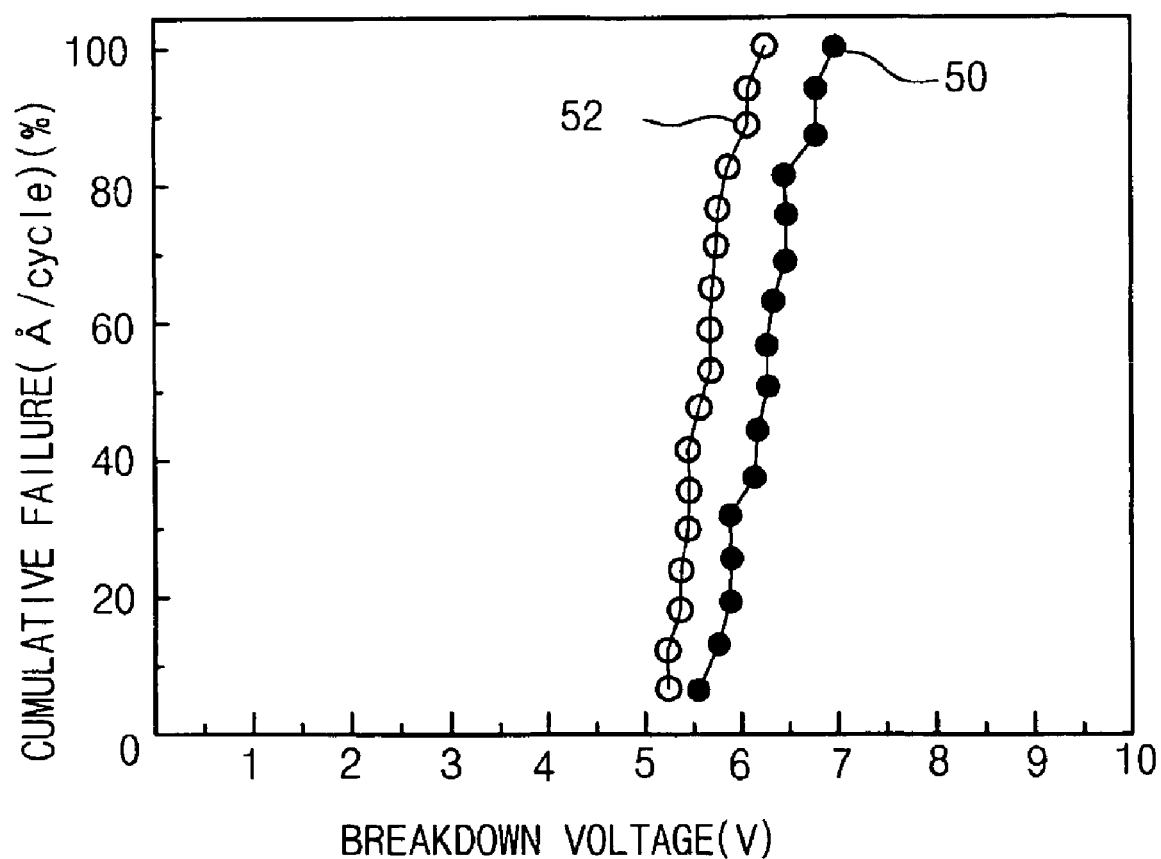
FIG. 3 illustrates cumulative failures obtained by measuring breakdown voltages at given positions of a substrate according to the kind of oxidants utilized during the formation of a $HfO_2$ layer according to exemplary embodiments of the present invention.

FIG. 3 is a graph illustrating cumulative failures obtained by measuring breakdown voltages at given positions on a substrate according to the kind of oxidants utilized during the formation of an $HfO_2$ layer according to example embodiments of the present invention. In FIG. 3, the dielectric layer is a composite layer of $Al_2O_3$ (~about 30 Å) and $HfO_2$ (~about 10 Å). Trace 50 corresponds to the dielectric layer formed by using an $O_3$ oxidant and trace 52 corresponds to the dielectric layer formed using an $H_2O$ oxidant.

Referring to FIG. 3, it is noted that the $HfO_2$ layer formed using the $O_3$ oxidant has a higher breakdown voltage by about 0.5V than another example $HfO_2$ layer formed using an $H_2O$ oxidant, and has a better stability as the dielectric layer.

Figure 4A:
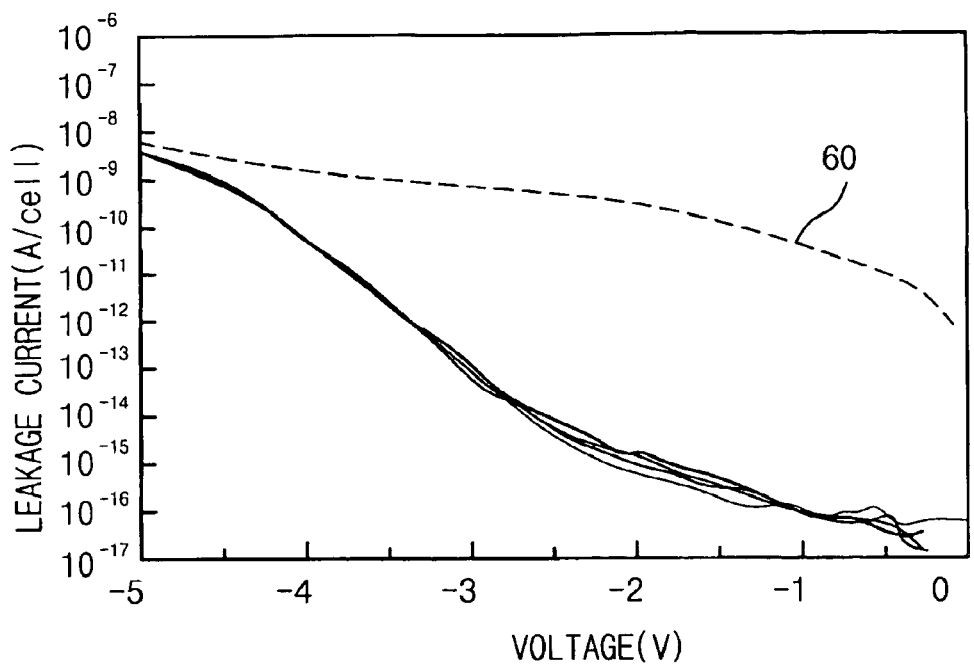
FIGS. 4A and 4B illustrate plots obtained by repeatedly measuring leakage currents with respect to voltages according to the kind of oxidants utilized during the formation of a $HfO_2$ layer according to exemplary embodiments of the present invention.
Figure 4B:
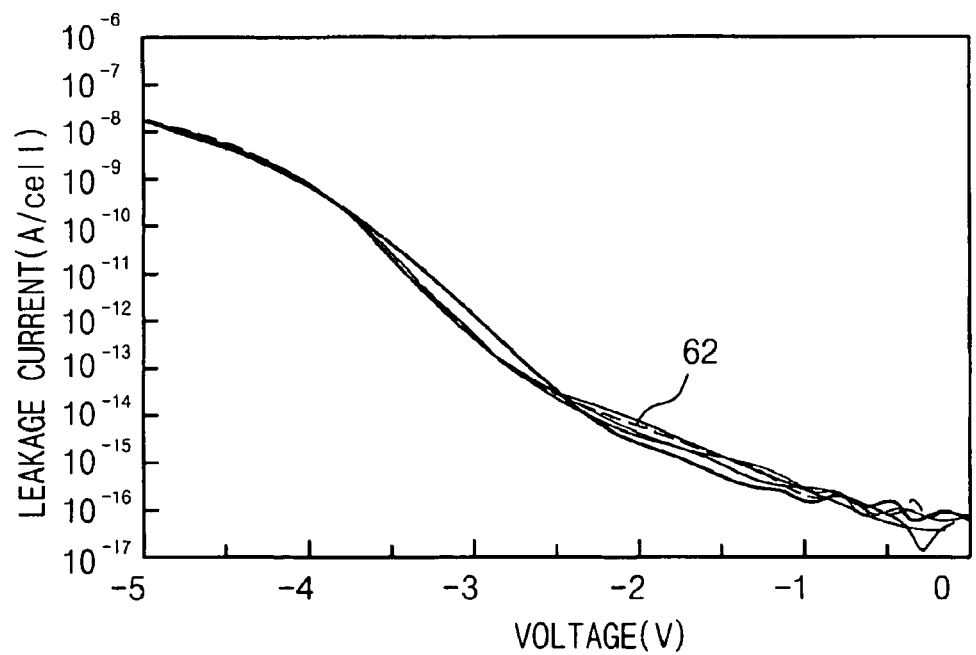

FIGS. 4A and 4B are graphs obtained by repeatedly measuring leakage currents with respect to voltages according to the kind of oxidants applied during forming a $HfO_2$ layer according to example embodiments of the present invention. FIG. 4A corresponds to traces for a dielectric layer formed using a $H_2O$ oxidant and FIG. 4B corresponds to traces for a dielectric layer formed using an $O_3$ oxidant. In FIGS. 4A and 4B, the dielectric layer was a composite layer of $Al_2O_3$ (about 30 Å) and $HfO_2$ (about 10 Å).

Referring to FIG. 4A, the traces were obtained by measuring leakage current five times white repeatedly sweeping the voltage from 0 to −5V. During the fourth voltage sweep, a deteriorated leakage current was detected (illustrated as trace 60) indicating that a breakdown was generated during the fifth repeated measurement.

Referring to FIG. 4B, the traces were obtained by measuring leakage current seven times while repeatedly sweeping the voltage from 0 to −5V. From this result, it may be confirmed that a stable leakage current is maintained as illustrated by trace 62 taken during the seven repeated sweepings that does not indicate any significant deterioration of the dielectric. Therefore, the dielectric layer formed using the $O_3$ oxidant illustrated a better performance under high voltage stress than a corresponding film formed using the $H_2O$ oxidant.

When the precursor containing the amino functional group is used to form a dielectric layer according to example embodiments of the present invention, the deposition rate and a dielectric properties of the resulting dielectric are improved over the conventional methods. Hereinafter, these properties will be described in more detail.

When the precursor containing the amino functional group is used for the formation of the $HfO_2$ layer according to example embodiments of the present invention, the deposition rate of the layer is increased when compared with methods using the conventional halogen precursors. When a layer is formed using an ALD process, factors determining the deposition rate include the reactivity of the precursor and the three-dimensional size of the precursor. When the reactivity of the precursor with the oxidant is not high, the reaction rate slows and lowers the deposition rate. Similarly, when the three-dimensional size of the precursor is large, reaction sites where the precursor must be absorbed may be shielded by other precursors previously absorbed on adjacent reaction site, lowering the reactant density, slowing the reaction rate and lowering the deposition rate.

In order to evaluate reactivity, the reaction mechanism of the precursors of TEMAH and tBH (i.e., $Hf(OtBu)_4$) with an $O_3$ oxidant will be compared. For the case of TEMAH, the Hf—N bond of $Hf(NC_2H_5CH_3)_4$ is broken by the $O_3$ oxidant and an Hf—O bond is produced during the reaction. For the case of the tBu precursor, the Hf—O bond or Hf—O—C bonds are broken by the $O_3$ oxidant during the reaction. At this time, the bonding states of the reacting elements H and C is Hf—O and C—O before/after the reaction. Therefore, the driving force of the reaction is not as large. Accordingly, TEMAH is a more reactive precursor than tBH.

The molecular structures of tBH and TEMAH will be compared. The three-dimensional size of TEMAH [Hf$(NC_3H_8)_4$] is smaller that that of tBH [Hf$(OC_4H_9)_4$]. Therefore, the surface coverage of the Hf element is higher when using the TEMAH liquid source than when using tBH source and will tend to increase the deposition rate.

Figure 5:
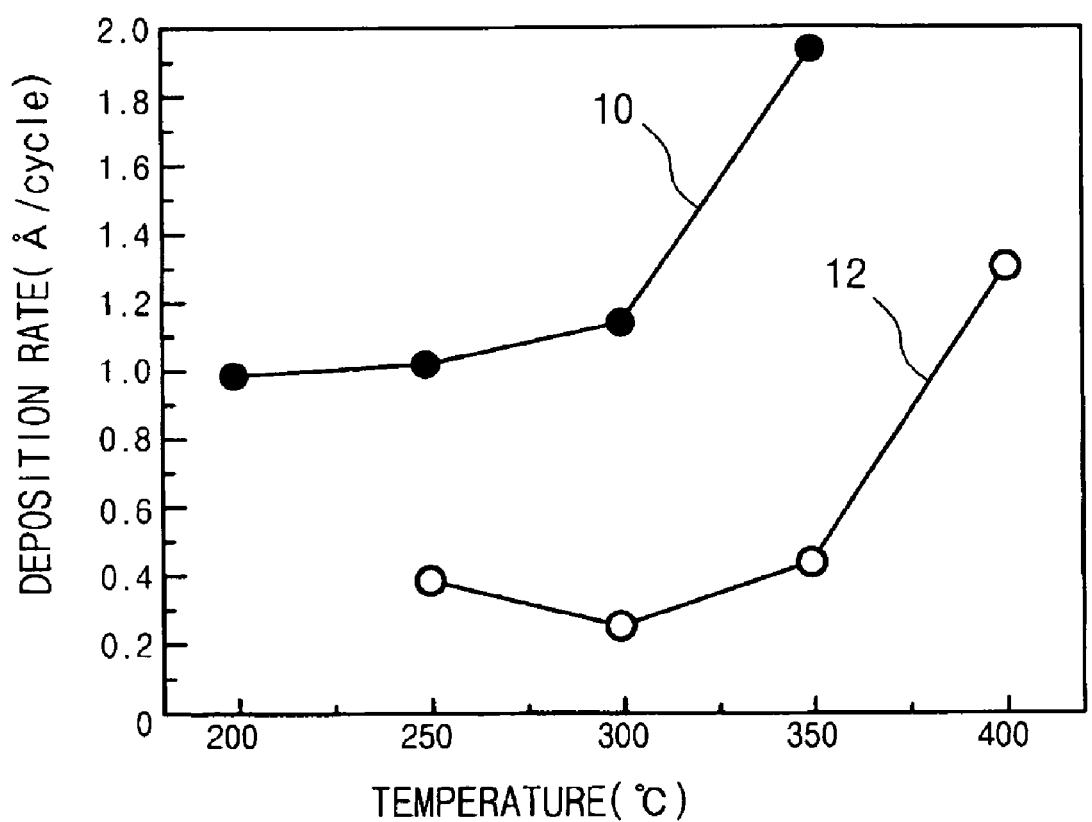
FIG. 5 illustrates deposition rates with respect to temperature for an ALD process according to exemplary embodiments of the present invention and according to a conventional method.

FIG. 5 illustrates graphs of deposition rates of $HfO_2$ layer with respect to temperatures during an ALD process according to example embodiments of the present invention and according to a conventional method using a metal alkoxide compound as a precursor. In FIG. 5, trace 10 was obtained by forming the $HfO_2$ layer by an example embodiment of the present invention and trace 12 was obtained through forming the $HfO_2$ layer by the conventional method.

In FIG. 5, the longitudinal axis represents the deposition temperature (° C.) and the vertical axis represents the thickness of the layer deposited per one cycle, that is, deposition rate (Å/cycle).

In particular, the precursor in these example embodiments, TEMAH, was introduced for about 2 seconds and an Ar purging gas was introduced for about 4 seconds. The oxidant, $O_3$, was then introduced for about 4 seconds and an Ar purging gas was introduced for about 4 seconds. This procedure was repeated at various temperatures and the deposition rate was measured for each temperature. The same procedure was then repeated using the precursor tBH (tetra-butoxy hafnium (Hf(OtBu)$_4$).

As reflected in trace 10 in FIG. 5, an ALD behavior is illustrated at the temperature range of about 200 to about 300° C. and the deposition rate within this range is almost constant during formation of the $HfO_2$ layer. However, a more chemical vapor deposition (CVD)-like behavior is observed at temperatures of above about 300° C. with the deposition rate increasing generally linearly with increasing temperature. At the reference temperature of about 200° C., the deposition rate was about 1 Å/cycle.

When referring to trace 12 obtained while forming the $HfO_2$ layer by the conventional method, the ALD process behavior is observed across the temperature range of about 250 to about 350° C. Further, the deposition rate at this temperature range is, at most, about 0.4 Å/cycle.

These results demonstrate that higher deposition rates for $HfO_2$ layers may be obtained by using metal precursors containing an amino functional group according to example embodiments of the present invention when compared with metal precursors containing alkoxide functional groups. In addition, according to the present invention, the $HfO_2$ layer can be formed using an ALD process at a temperature of about 300° C. or less.

Even though an example deposition temperature is about 300° C. or less, an $HfO_2$ layer having a good electric characteristic can be formed at temperatures of above about 300° C. In particular, when $H_2O$ is used as an oxidant, a metal layer having a good electric characteristic can also be formed using an ALD process at about 350° C. Based on this experimental result, an example temperature range for implementing the deposition may be about 100 to about 500° C.

It has also been confirmed that a good step coverage (that is, a thickness ratio between the film formed on a structure at an upper portion and a bottom portion) of about 80% or over was obtained for a structure having an aspect ratio of about 13:1 or more when a layer is formed using an ALD process with TEMAH according to example embodiments of the present invention.

Figure 6:
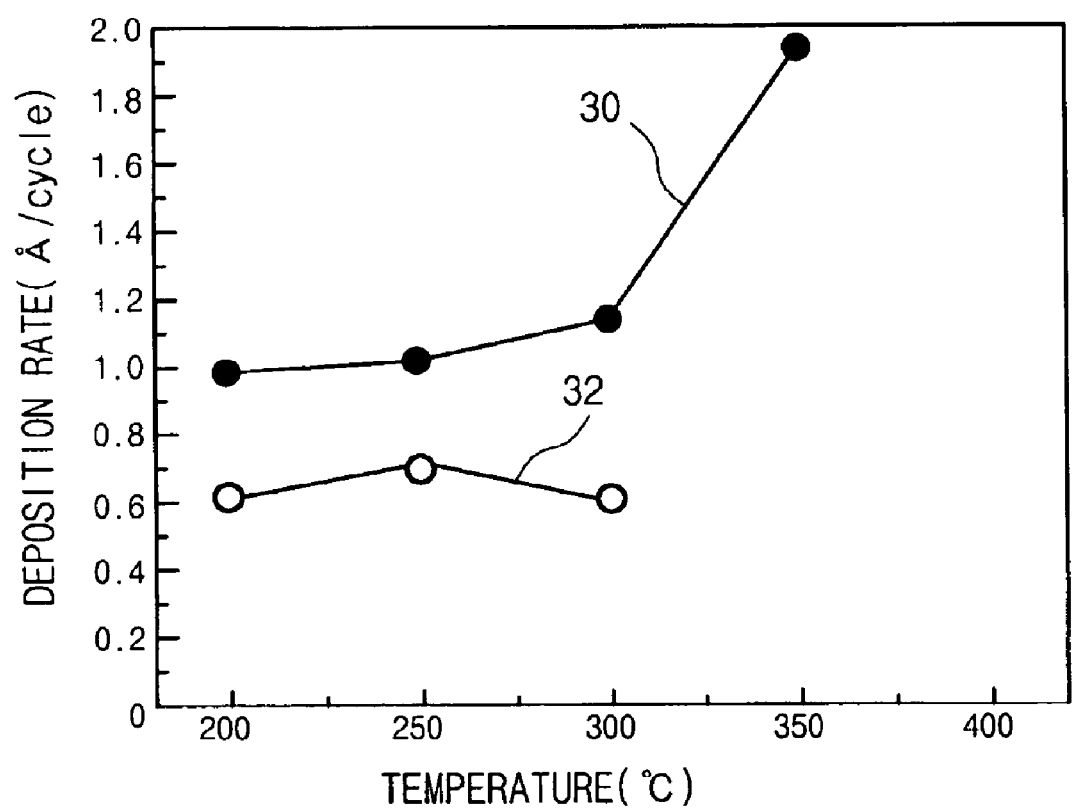
FIG. 6 illustrates deposition rates of a $HfO_2$ layer with respect to temperatures during implementation of an ALD process according to exemplary embodiments of the present invention on a planar plate and on a structure having a known aspect ratio.

FIG. 6 illustrates graphs of deposition rates of $HfO_2$ layer with respect to temperatures for implementing an ALD process according to example embodiments of the present invention on a planar plate and on a structure having a known aspect ratio. Trace 30 was obtained when forming the $HfO_2$ layer on the planar plate and trace 32 was obtained when forming the $HfO_2$ layer on the structure having a known aspect ratio.

In FIG. 6, the longitudinal axis represents deposition temperature (° C.) and the vertical axis represents the thickness of the layer deposited layer per cycle, that is, a deposition rate (Å/cycle).

In particular, the metal precursor TEMAH was introduced for about 2 seconds and an Ar purging gas was introduced for about 4 seconds. An $O_3$ oxidant was introduced for about 4 seconds and an Ar purging gas was introduced for about 4 seconds. This procedure was repeated at various temperatures for the two structures and the deposition rate was measured after completing the above-described steps once (one cycle).

Referring to FIG. 6, the deposition rate was almost constant in spite of the temperature variance. That is, an ALD processing behavior is observed for the planar plate and the structure having a higher aspect ratio across the temperature range. This means that a layer having good thickness uniformity may be formed according to example embodiments of the method of the present invention.

The deposition rate obtained at the temperature range of about 200 to about 300° C. will be compared. The deposition rate was about 1Å/cycle when forming the layer on the planar plate as illustrated in graph 30. On the contrary, the deposition rate was about 0.7Å/cycle when forming the layer on the structure having a higher aspect ratio as illustrated by trace 32. This suggests that a pattern loading ratio or effect due to the shape of the pattern of an underlying layer may be about 30%. The pattern-loading ratio is reflected in reduced ratio of deposition dependent on the shape of the substrate to which the film is being applied.

The deposition rate of the $HfO_2$ layer according to the temperature variance and the pattern loading ratio were compared for deposition processes implemented on a planar plate and on a structure having a high aspect ratio (greater that about 10:1) according to example embodiments of the method of the present invention and the conventional method. The result is illustrated in Table 1 as follows.

TABLE 1

| Process condition | On planar silicon | High aspect ratio structure | Pattern loading ratio (%) |
|---|---|---|---|
| Hf(OtBu)$_4$ + $O_3$ 300° C. | y = 0.25x | y = 0.125x | 50 |
| TEMAH(100° C.) + $O_3$ 250° C. | y = 1.01x | y = 0.75x | 26 |
| TEMAH(100° C.) + $O_3$ 200° C. | y = 0.98x | y = 0.633x | 35 |

Referring to Table 1, tBH (tetra-butoxy hafnium, Hf(OtBu)$_4$) was used as the precursor and $O_3$ was used as the oxidant in the conventional method. When using tBH as the metal precursor, ALD properties were obtained up to a temperature of about 350° C., and therefore, the processing temperature was set to about 300° C.

In the equation illustrated in Table 1, x represents a cycle number and y represents a thickness of a deposited layer. Each coefficient of x represents the measured deposition rate for each process under the indicated conditions. The deposition rate of $HfO_2$ layer formed on a planar silicon plate according to example embodiments of the present invention is about 4 times faster than that formed by the conventional method. Therefore, when forming the $HfO_2$ layer on the planar silicon plate, the processing time required for implementing example embodiments of the present invention is reduced by about 75% when compared with the conventional method.

In addition, the deposition rate of the $HfO_2$ layer formed on the silicon structure having a high aspect ratio according to example embodiments of the present invention was about six times faster than that formed by the conventional method. Therefore, when forming the $HfO_2$ layer on the silicon structure having the high aspect ratio, the processing time required for implementing example embodiments of the present invention is only about one sixth that required for the conventional method.

When forming a thin film by using the precursor containing the amino functional group, the carbon content in the thin film is relatively small. Carbon contained in a dielectric layer increases a leakage current of a capacitor and adversely affects the stability of the dielectric layer. Accordingly, when the carbon content of the dielectric layer decreases, the electric properties of the resulting capacitor are improved. This characteristic will be described in more detail below.

Figure 7:
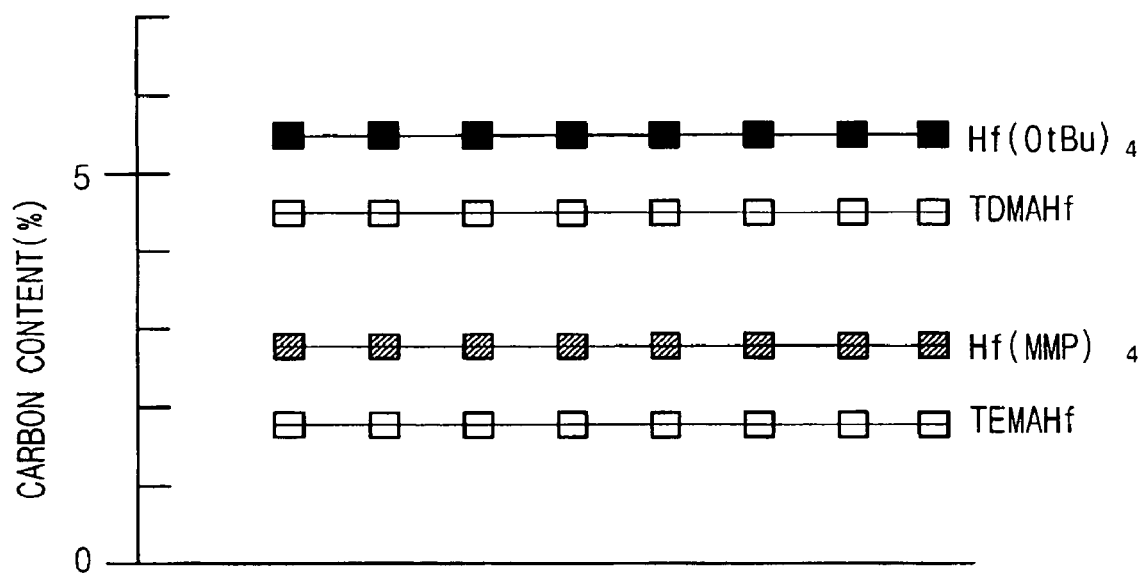
FIG. 7 illustrates carbon content of $HfO_2$ thin films formed using various precursor sources according to exemplary embodiments of the present invention when analyzed by a SIMS (second ion mass spectroscopy) analysis.

FIG. 7 illustrates the carbon content contained in a series of $HfO_2$ thin films formed through ALD processes using various precursor sources according to example embodiments of the present invention and tested using a SIMS (second ion mass spectroscopy) analysis. In FIG. 7 the traces illustrate the carbon content of the various dielectric layers formed using different precursors.

Referring to FIG. 7, the carbon content in the dielectric layer is highest when the thin film is formed using a tBH $[Hf(OtBu)_4]$ source. When inspecting the source having the molecular formula of $Hf(OBu)_4$, carbon is bonded to oxygen and the same O—C bonding is kept before/after carrying out a reaction with an oxidant. Accordingly, separation reaction of carbon from the bonding of Hf—O—C may be difficult and impede the removal of C—O bonds from a tBH source. On the contrary, the dielectric layer formed by deposition using the liquid source of TEMAH according to an example embodiment of the present invention illustrates the lowest carbon content of the layers tested.

When the dielectric layer is formed by means of the deposition process of the precursor containing the-amino functional group, nitrogen can be included in the dielectric layer without implementing any additional process. Recently, a thin film of $HfO_xN_y$ formed by adding nitrogen to an $HfO_2$ thin film is reported to have improved thin film properties.

For example, when $HfO_xN_y$ is used for the formation of a gate dielectric layer instead of $HfO_2$, the migration of boron ions and/or oxygen diffusion is suppressed and a thermal stability is good. Accordingly, the increase in the equivalent oxide thickness (EOT) for a layer due to a thermal budget is even smaller for gate dielectric layers formed using $HfO_xN_y$ when compared with gate dielectric layers formed using $HfO_2$.

In addition, it is reported that the thickness of an equivalent oxide layer ($E_{tox}$) of $HfO_xN_y$ is lower and a leakage current is better than $HfO_2$. Generally, the $HfO_xN_y$ layer is formed by depositing an HfN layer and then heat treating the layer in an oxidizing atmosphere to form an oxynitride layer.

However, when a precursor containing an amino functional group such as TEMAH is used to form the $HfO_2$ layer, nitrogen can be included in the resulting thin film without implementing a subsequent heat treatment. For example, it has been reported that an $HfO_2$ thin film formed using a low-pressure chemical vapor deposition (LPCVD) process using TEDAH $[Hf(N(C_2H_5)_2)_4]$ and $O_2$, contains about 7% nitrogen.

According to repeated experiments conducted by the present inventors, it has been confirmed that an $HfO_2$ thin film formed using an ALD process using TEMAH and an $O_3$ oxidant also includes about 2% nitrogen. Therefore, a dielectric layer having good properties and including nitrogen therein can be advantageously formed according to example embodiments of the method of the present invention.

Hereinafter, a method of manufacturing a semiconductor device will be described in order to explain a method of forming a capacitor according to an example embodiment of the present invention.

FIGS. 8A to 8E are cross-sectional views for explaining a method of forming a capacitor in a semiconductor process according to an example embodiment of the present invention.

Figure 8A:
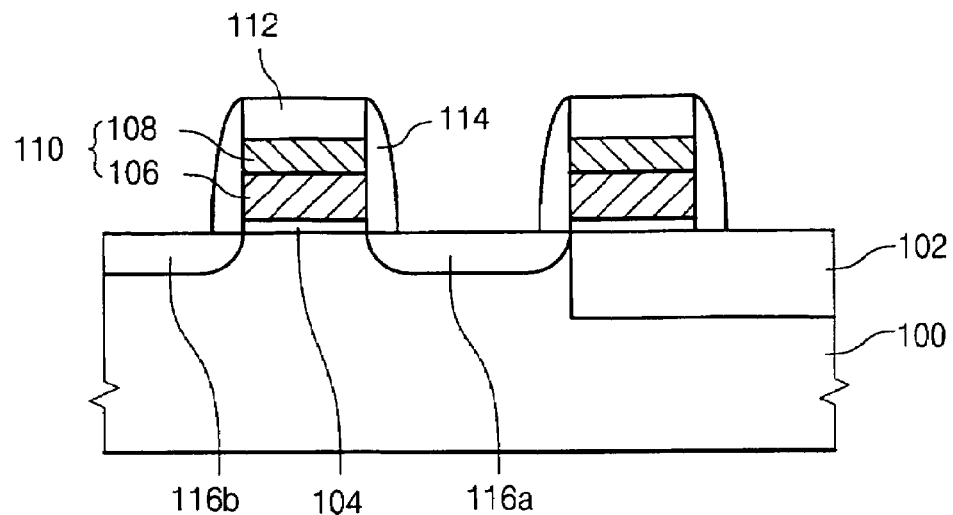
FIGS. 8A to 8E are cross sectional views illustrating a method of forming a capacitor in a semiconductor process according to an exemplary embodiment of the present invention.

Referring to FIG. 8A, an active region and a field region 102 are separately formed on a semiconductor substrate 100 by performing an isolation process. Thereafter, a transistor including a gate insulation layer 104, a gate electrode 110 and a source/drain region 116a and 116b, is formed on the substrate 100. A thin gate insulation layer 104 having a thickness of about 20 Å or less is required for the manufacture of a semiconductor device having a memory having a capacity of about 1 gigabit or more. However, the decrease in the gate insulation layer 104 may cause problems such as increased gate leakage current, penetration of dopant impurities in the gate, decreased threshold voltage, and the like. Therefore, the gate insulation layer 104 is preferably formed using a material having a high insulating property and a high dielectric constant by means of an ALD process according to example embodiments of the present invention.

That is, the gate insulation layer 104 including $HfO_2$ is formed by using a liquid source containing hafnium and an amino functional group and an oxidant using an ALD process as illustrated in FIGS. 2A to 2E. The liquid source containing hafnium and the amino functional group may include precursors such as TEMAH, TDEAH and TDMAH.

The oxidant may be an activated oxidant such as ozone ($O_3$) produced by a plasma generator, plasma $O_2$, remote plasma $O_2$, and plasma $N_2O$ or a compound containing a hydroxyl functional group such as $H_2O$ or $H_2O_2$. The gate electrode 110 may be formed with a polycide structure including an impurity doped polysilicon layer 106 and a metal silicide layer 108. The gate electrode 110 may also be formed with a structure that includes an impurity doped polysilicon layer 106 and a metal layer including a metal such as tungsten (W). At the upper portion and side portion of the gate electrode 110, a capping insulation layer 112 including silicon oxide and a sidewall spacer 114 including silicon nitride are formed, respectively.

Figure 8B:
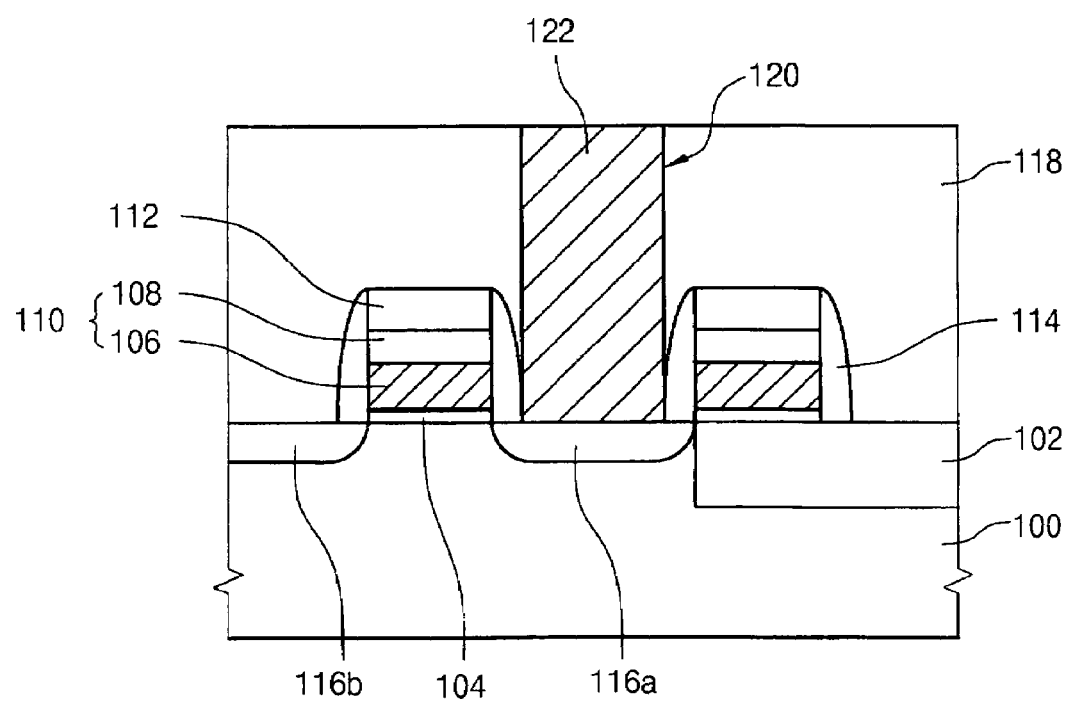

Referring to FIG. 8B, a first insulation layer 118, typically an oxide, is formed on the whole surface of the substrate 100 on which the transistor is formed. A contact hole 120 for exposing a portion of the source region 116a is formed by partially etching the first insulation layer 118 using a photolithography process. After that, a contact plug 122 is formed in the contact hole 120 by depositing a phosphorous (P) doped polysilicon layer to form a first conductive layer that fills up the contact hole 120 and is formed on the first insulation layer 118. The upper portion of the first conductive layer is then removed with an etch back process or a chemical mechanical polishing (CMP) process to leave the conductive plug 122.

Figure 8C:
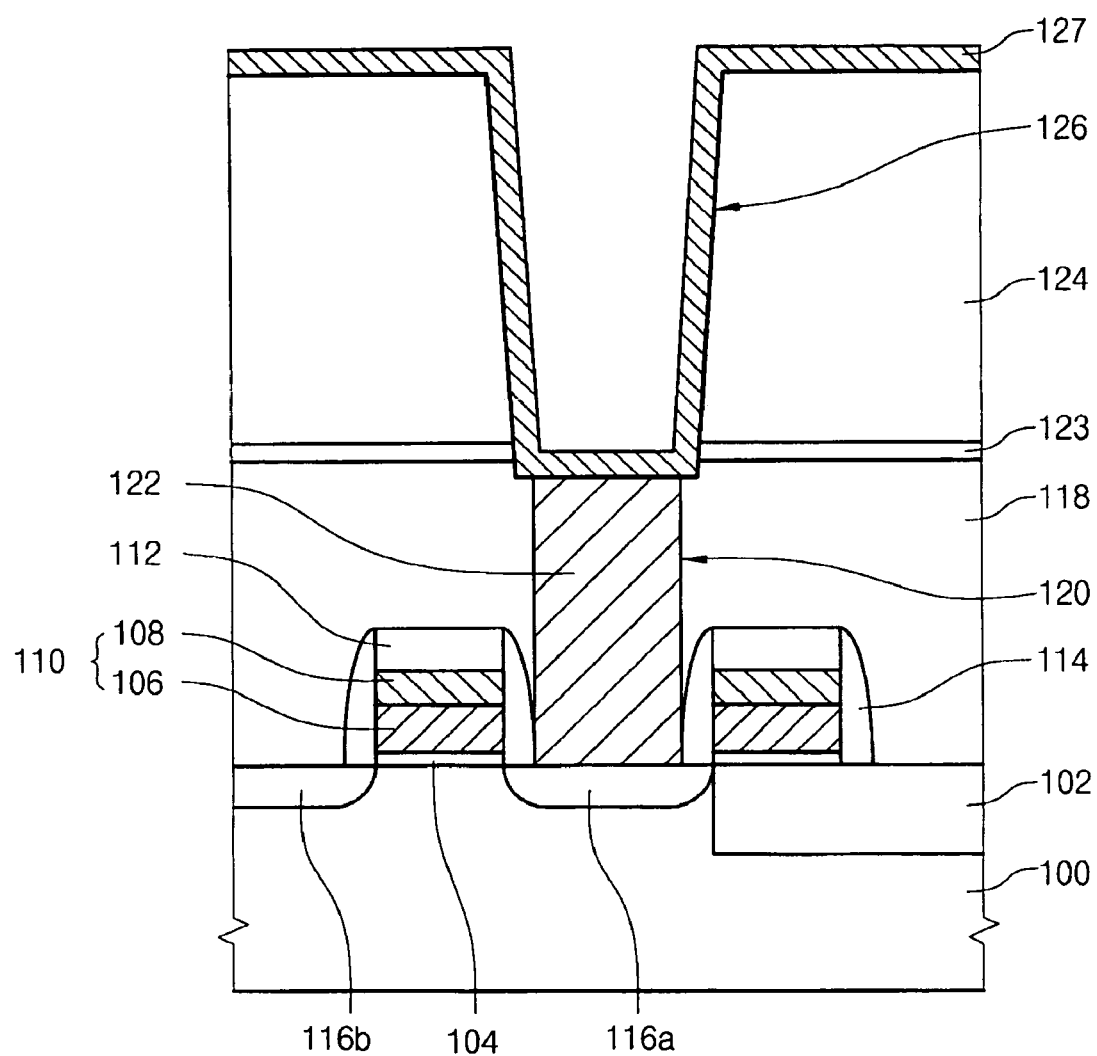

Referring to FIG. 8C, an etch stop layer 123 is formed on the contact plug 122 and the first insulation layer 118. The etch stop layer 123 is selected to provide a high etching selectivity with respect to the first insulation layer 118 such as a silicon nitride ($Si_xN_y$) layer or a silicon oxynitride (SiON) layer.

A second insulation layer 124, typically an oxide, is formed on the etch stop layer 123 and then etched to form an opening 126 to expose the contact plug 122. In particular, the second insulation layer 124 is etched until the etch stop layer 123 is exposed. After that, the etch stop layer 123 is etched to form the opening 126 and expose the contact plug 122 and an adjacent portion of the first insulation layer 118. The opening 126 may be formed with a vertical inclination resulting in the bottom portion of the opening 126 being narrower than the upper open portion thereof. This shape may be obtained in part due to a loading effect during the etch process in which the etch rate at the bottom portion is slower than that at the upper portion of the opening 126.

A second conductive layer 127 is formed on the side portion and bottom portion of the opening 126 and on the second insulation layer 124. The second conductive layer 127 may be formed from a semiconductor material such as doped polysilicon, a metal such as ruthenium (Ru), platinum (Pt) and iridium (Ir), a conductive metal nitride compound such as titanium nitride (TiN), tantalum nitride (TaN) and tungsten nitride (WN), or a composite structure of two or more of these materials.

Figure 8D:
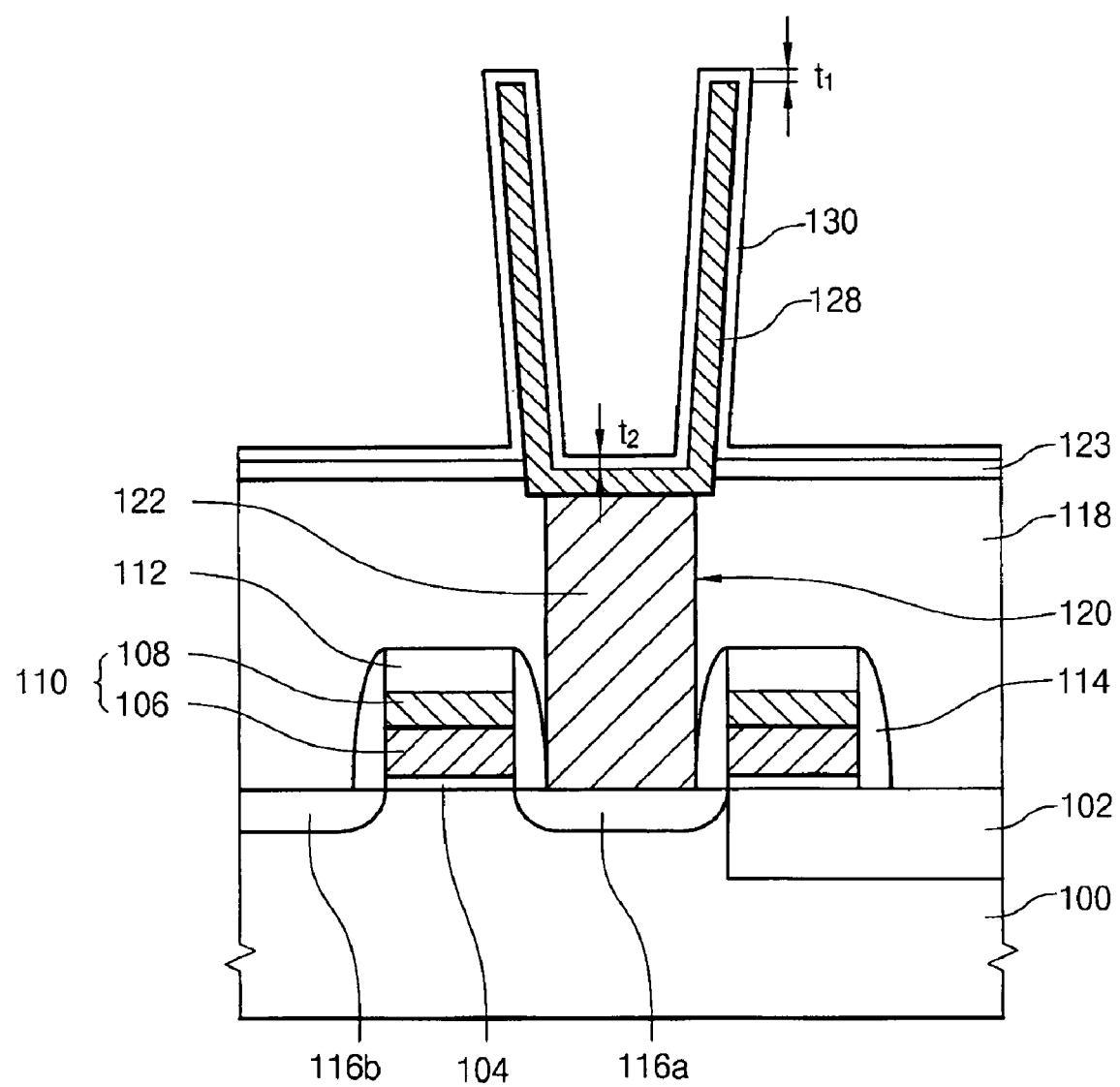

Referring to FIG. 8D, a sacrificial layer (not shown) is formed on the second conductive layer 127 and the opening 126. The upper portion of the sacrificial layer is then etched back so that the second conductive layer 127 may remain on the side portion and bottom portion of the opening 126. The second conductive layer 127 deposited on the surface portion of the second insulation layer 124 is removed. The second conductive layer 127 deposited along the profile of the inner portion of the opening portion 126 is then separated with the cell unit to form a lower electrode 128 of a capacitor at each cell region. After that, the sacrificial layer may be removed using a wet etch process. The lower electrode 128 may be formed to have a generally cylindrical shape in which the inlet portion is wide and bottom portion is narrow having a height of about 10,000 to about 17,000 Å.

On the lower electrode 128, a dielectric layer 130 including $HfO_2$ is formed using a liquid source containing hafnium and an amino functional group and an oxidant, and an ALD process for example as illustrated in FIGS. 2A to 2E. More particularly, the dielectric layer 130 of the capacitor may be formed by depositing $HfO_2$ and by reacting TEMAH and $O_3$ using an ALD process. When forming the $HfO_2$ layer using TEMAH and $O_3$ with an ALD process, a dielectric layer 130 having a good step coverage can be achieved on the lower electrode 128 having an aspect ratio of about 13:1 or more. The ratio of the upper thickness ($t_1$) and the lower thickness ($t_2$) of thus formed dielectric layer 130 is about 1:0.8.

The dielectric constant of $HfO_2$ may be as high as about 20 to about 25. A capacitor including a dielectric layer formed using $HfO_2$ will have a relatively high storage capacity when comparing with a capacitor using a dielectric layer formed using a similar thickness of a material having a relatively low dielectric constant. In addition, since the capacitor including $HfO_2$ has a relatively high energy band gap, a stable leakage current characteristic may be more easily obtained.

The dielectric layer 130 may be formed as a single layer of $HfO_2$ or may be formed as a composite layer including two or more layers of metal oxides that are alternately deposited. For example, the dielectric layer 130 may be formed by alternately depositing the layers of $Al_2O_3$ and $HfO_2$ by changing the precursors introduced into the chamber during the ALD process.

In particular, an $Al_2O_3$ layer having a thickness of about 35 Å may be formed using a TMA precursor and an $O_3$ oxidant. After that, an $HfO_2$ layer having a thickness of about 35 Å may be formed on the $Al_2O_3$ layer using a TEMAH precursor instead of the TMA precursor and applying the same ALD process conditions to form a dielectric layer 130 having an alternately deposited structure of the $Al_2O_3/HfO_2$. A dielectric layer having an alternate structure of $Al_2O_3/HfO_2/Al_2O_3/HfO_2$ or $HfO_2/Al_2O_3$ also can be formed instead of the $Al_2O_3/HfO_2$ layer by modifying the deposition sequence.

When the lower electrode 128 is formed of polysilicon, silicon contained in the lower electrode 128 and oxygen will tend to react during heat treatments and oxidize the lower electrode 128. Therefore, before forming the dielectric layer 130, the surface portion of the lower electrode 128 may be nitrified by a rapid thermal process (RTP) under an atmosphere containing nitrogen to reduce or prevent a reaction between the dielectric layer 130 and the lower electrode. A silicon nitride (SiN) or silicon oxynitride (SiON) layer formed by the nitrification reaction at the surface portion of the lower electrode 128 functions as a portion of the dielectric layer of the capacitor along with the $HfO_2$ layer. Accordingly, the dielectric layer may be formed including an alternate structure of nitride layer/$Al_2O_3/HfO_2$ or nitride layer/$HfO_2$.

Figure 8E:
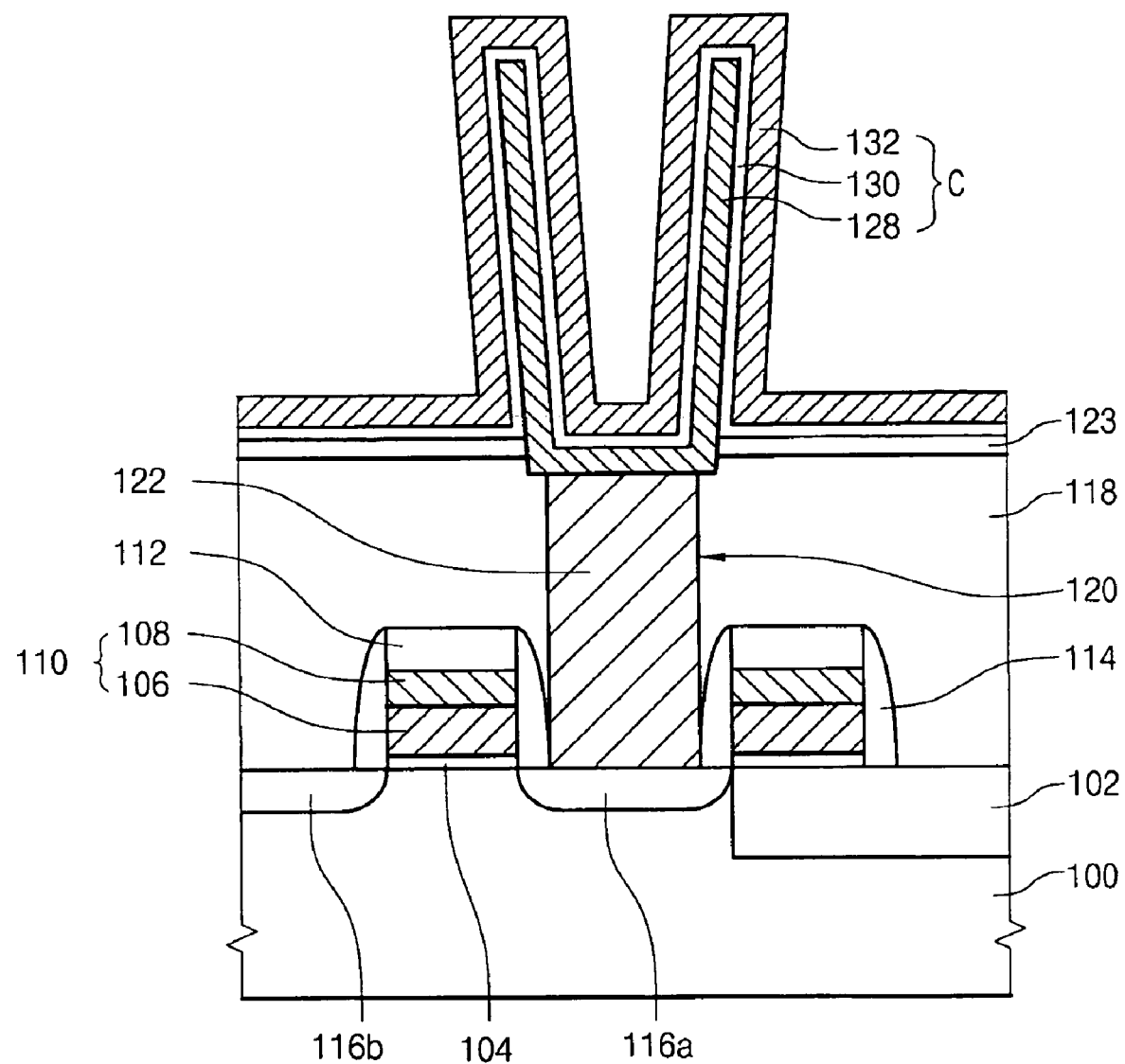

Referring to FIG. 8E, after being formed, the dielectric layer may be heat treated to remove contaminants formed on or incorporated in the dielectric layer and to cure oxygen defects. The heat treatment may be implemented under an atmosphere of untraviolet-$O_3$(UV-$O_3$), plasma $O_2$, remote plasma $O_2$, nitrogen gas or vacuum.

An upper electrode 132 is formed on the dielectric layer 130 to form a capacitor C including the lower electrode 128, the dielectric layer 130 and the upper electrode 132. The upper electrode 132 may be formed using a semiconductor material including polysilicon, a metal such as ruthenium (Ru), platinum (Pt) or iridium (Ir), a conductive metal nitride such as TiN, TaN or WN, or a composite of two or more such materials. In an example embodiment, the upper electrode 132 has a stacked structure with layers of both TiN and polysilicon.

Figure 9:
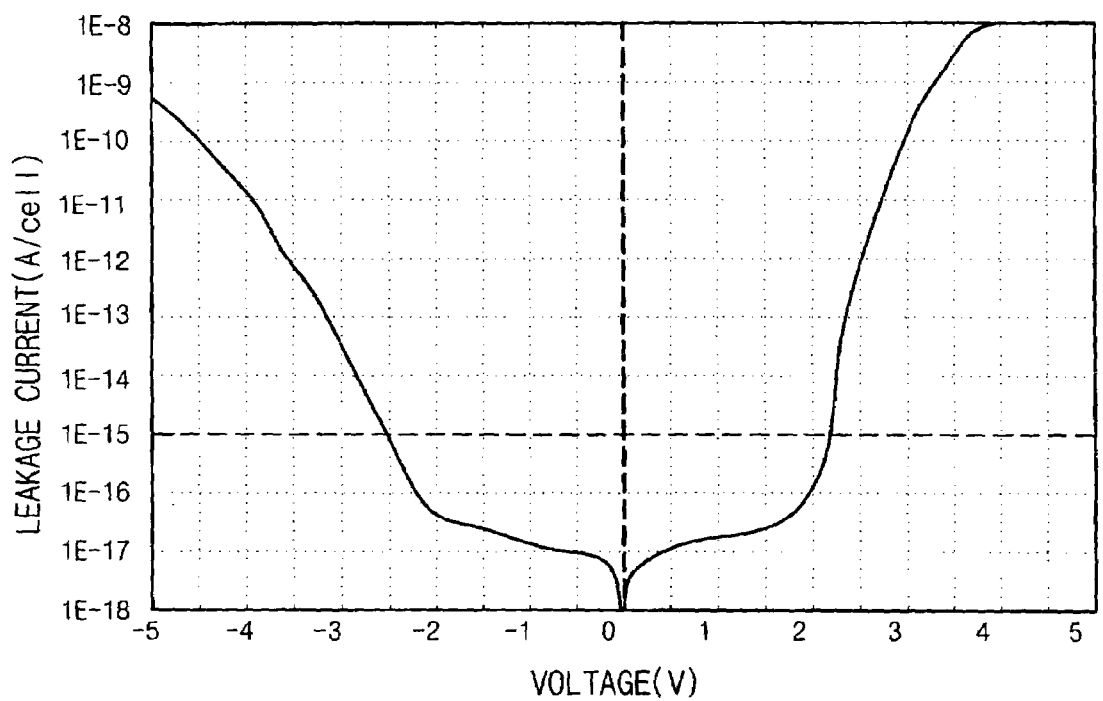
FIG. 9 illustrates leakage current with respect to voltage of a capacitor having a dielectric layer formed by an ALD method according to an exemplary embodiment of the present invention.

FIG. 9 is a graph illustrating a leakage current with respect to a voltage of a capacitor having a dielectric layer formed by an ALD process according to an example embodiment of the present invention. In this graph, the longitudinal axis represents a voltage (V) and the vertical axis represents a leakage current (A/cell).

The capacitor may be formed, for example, by the above-described method as illustrated in FIGS. 8A to 8E. More particularly, a nitrification process may be carried out by means of an RTP process using $N_2$ or $NH_3$ gas on the surface portion of the lower electrode of phosphorus (P) doped polysilicon. On the lower electrode, an $Al_2O_3$ layer having a thickness of about 35 Å was formed and an $HfO_2$ layer having a thickness of about 10 Å was formed on the $Al_2O_3$ layer to form a composite dielectric layer. The $HfO_2$ layer was formed using TEMAH and $O_3$ at a temperature range of about 100 to about 300° C., using an ALD process. After forming the $HfO_2$ layer, a heat treatment at about 750° C., under vacuum was implemented for about 2 seconds. An equivalent oxide thickness (EOT) of thus formed dielectric layer was about 20 to about 30 Å.

The EOT represents a thickness of silicon oxide layer having the same capacitance with that of a capacitor including a dielectric layer formed by depositing materials other than silicon dioxide. Therefore, when two capacitors having different dielectric layers have the same capacitance, a dielectric layer having a lower EOT has a higher dielectric constant. The capacitance is inversely proportional to the thickness of the oxide layer and is proportional to the dielectric constant.

Therefore, a dielectric layer having a low EOT has a high dielectric constant. In FIG. 9, the dielectric layer had an EOT of about 29.7 Å. After completing the above-described processes, a TiN layer was formed through a deposition process using $TiCl_4$ and $NH_3$ gas on the $HfO_2$ layer. A phosphorous-doped polysilicon layer was then formed as the upper electrode having a TiN/polysilicon structure.

As can be noted from FIG. 9, the capacitor manufactured by an example embodiment of the present invention illustrates a leakage current of about 1 fA/cell or lower at a voltage of 1V. The capacitor formed by the example embodiment of the method of the present invention illustrates a stable leakage current characteristic even though being formed on a structure having an aspect ratio of about 13:1 or more.

Figure 10:
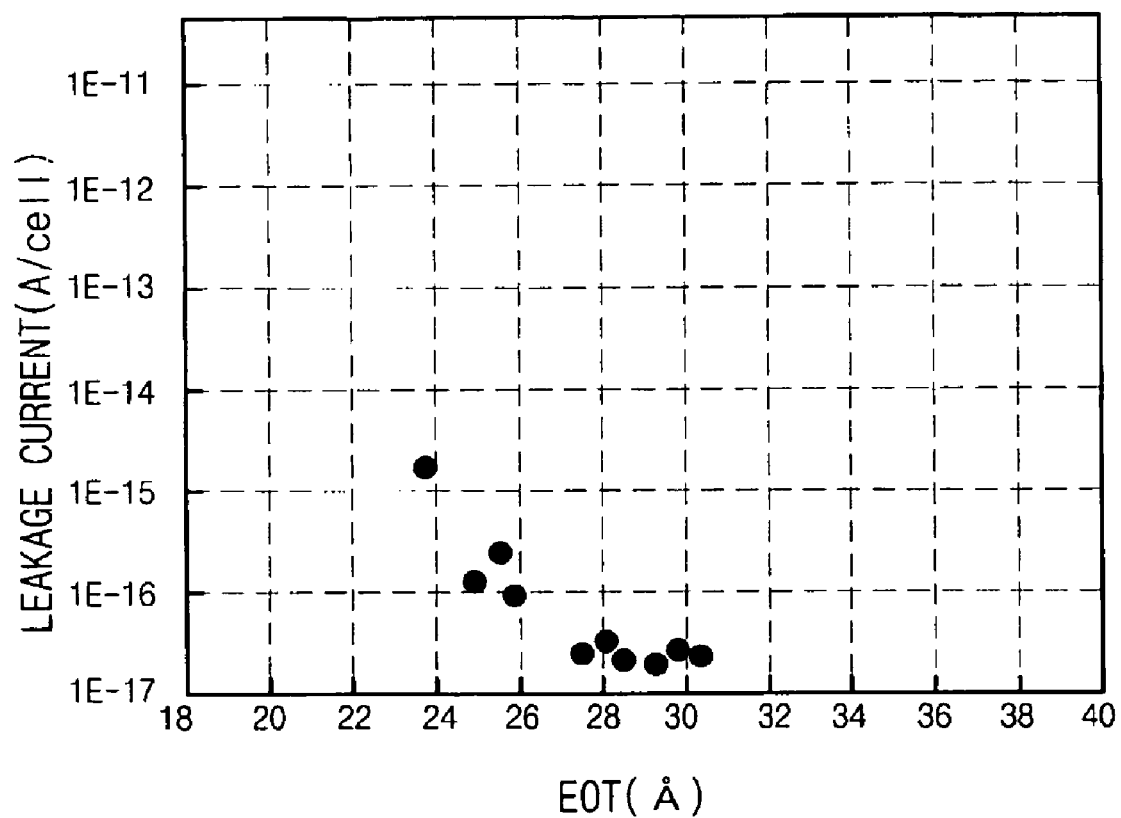
FIG. 10 illustrates leakage current with respect to an EOT (equivalent oxide thickness) of a capacitor having a dielectric layer formed using an ALD method according to an exemplary embodiment of the present invention.

FIG. 10 is a graph illustrating a leakage current with respect to an EOT of a capacitor having a dielectric layer formed by an ALD process according to example embodiments of the present invention. In FIG. 10, the longitudinal axis represents an equivalent oxide thickness (Å) of the dielectric layer and the vertical axis represents a leakage current (A/cell). The dielectric layer of the capacitor is formed as a complex layer of $Al_2O_3/HfO_2$ and the leakage current was measured with a voltage of 1.2V applied to the capacitor.

Referring to FIG. 10, the measured leakage current was 1 fA/cell or less when the EOT of the dielectric layer of the capacitor was about 24 to about 30 Å. Accordingly, the capacitors formed using the above-described example processes illustrate a stable leakage current.

FIGS. 11A to 11J are cross sectional views illustrating a method of forming a thin film structure in accordance with an example embodiment of the present invention.

Figure 11A:
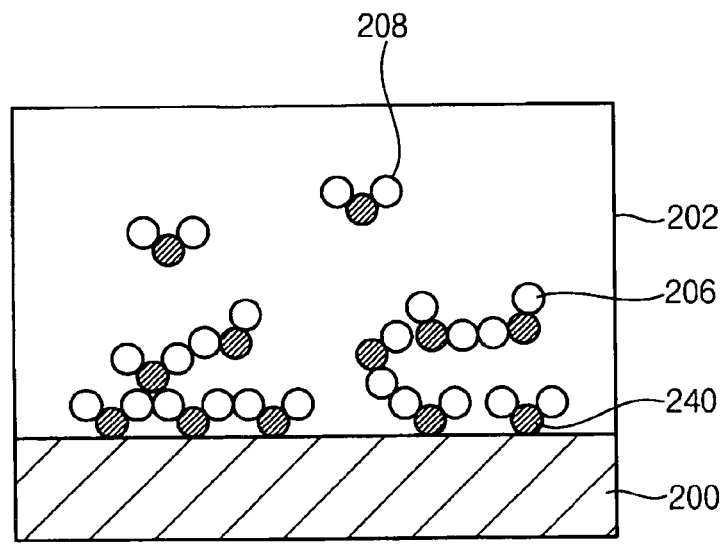
FIGS. 11A to 11J are cross sectional views illustrating a method of forming a thin film structure in accordance with an exemplary embodiment of the present invention.

Referring to FIG. 11A, a substrate 200, such as a silicon wafer, may be placed in a chamber 202. Although discussed herein as a silicon wafer, the substrate 200 may be any suitable material.

When the chamber 202 has a temperature of below approximately 200° C., a first reactant may be introduced into the chamber 202 and may not suitably reactive. When the chamber 202 has a temperature of above approximately 400° C., ingredients in a thin film formed on the substrate 200 may be crystallized. A thin film structure 232 (see FIG. 11J) may be formed on the substrate 200, for example, using an ALD process when the chamber 202 has a temperature of below approximately 400° C. to suppress (e.g., prevent) the thin film structure 232 from forming during, for example, a chemical vapor deposition (CVD) process. Although the ALD and the CVD processes are discussed herein, it will be understood that any suitable process may be used in connection with example embodiments of the present invention. The chamber 202 may have a temperature of approximately 200° C. to approximately 400° C., inclusive, to form the thin film which may have improved characteristics (i.e., suitable characteristics). The chamber 202 may have a temperature of approximately 300° C., and the thin film structure 232 may be formed, for example, on the substrate 200 using an ALD process.

The chamber 202 may have a pressure of below approximately 0.1 Torr, and the reactant introduced into the chamber 202 may not be suitably reactive. A pressure within the chamber 202 of above about 3.0 Torr may not be suitable for controlling processing conditions. The chamber 202 may have a pressure of approximately 0.1 Torr to approximately 3.0 Torr, inclusive, to form (e.g., precisely form) the thin film structure 232 having improved characteristics (e.g., suitable characteristics) according to an example embodiment of the present invention.

The pressure and the temperature of the chamber 202 may be controlled, and a first reactant may be provided onto the substrate 200 disposed in the chamber 202. The first reactant may have a gas phase through the use of, for example, a bubbler. Although a bubbler is discussed herein, it will be understood that any suitable apparatus for providing a first reactant in a gas phase may be used. The first reactant may be a zirconium precursor such as, for example, TEMAZ (tetrakis-methyl ethyl amino zirconium, $Zr[N(CH_3)(C_2H_5)]_4$) or zirconium butyl oxide ($Zr(O-tBu)_4$). The zirconium precursor may include a mixture of, for example, TEMAZ and/or zirconium butyl oxide. Although TEMAZ, zirconium butyl oxide or a combination thereof is described herein, it will be understood that any suitable precursor may be used. The first reactant may be provided onto the substrate 200 for approximately 0.5 seconds to approximately 3 seconds, inclusive.

When the first reactant is provided onto the substrate 200, a first portion 204 of the first reactant may be chemisorbed on the substrate 200. A second portion 206 of the first reactant may be physically absorbed to the chemisorbed first portion 204 and/or that the second portion 206 of the first reactant may drift in the chamber 202.

Figure 11B:
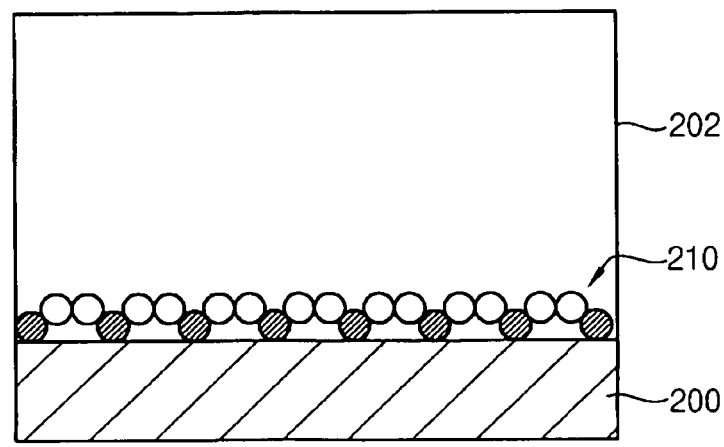

Referring to FIG. 11B, a first gas (e.g., a first purge gas) may be introduced into the chamber, for example, after providing the first reactant onto the substrate 200. The first gas may include an inert (or inactive) gas such as an argon (Ar) gas and/or a nitrogen ($N_2$) gas. The first gas may be provided into the chamber 202 for approximately 0.5 seconds to approximately 20 seconds, inclusive.

When the first gas is provided into the chamber 202, the second portion 206 of the first reactant may be removed from the chamber 202. The drifting second portion 208 and the physically absorbed second portion 206 may be removed from the substrate 200 and the chamber 202. The chemisorbed first portion 204 of the first reactant may remain on the substrate 200.

In an example embodiment of the present invention, the drifting second portion 208 and the physically absorbed second portion 206 may be removed from the substrate 200 and the chamber 202 by vacuumizing the chamber 202 for approximately 2 seconds to approximately 10 seconds, inclusive.

In another example embodiment of the present invention, the drifting second portion 208 and the physically absorbed second portion 206 may be removed from the substrate 200 and the chamber 202 by introducing the first gas into the chamber 202 and vacuumizing the chamber 202, for example, simultaneously.

Figure 11C:
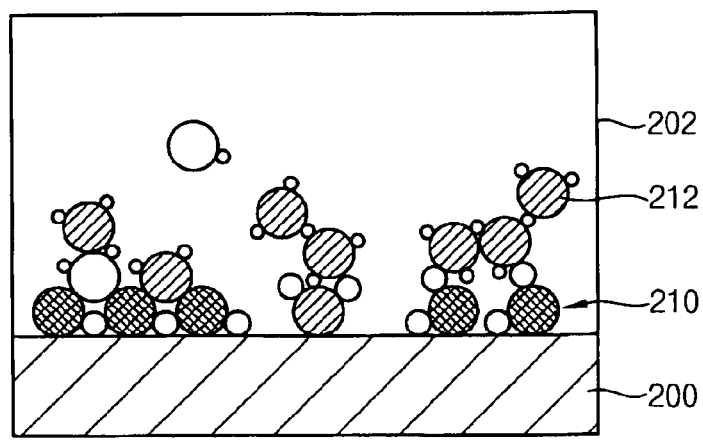

Referring to FIG. 11C, an oxidant 212 may be introduced into the chamber 202, for example, after removing the drifting second portion 208 and the physically absorbed second portion 206. The oxidant 212 may include, for example, an ozone ($O_3$) gas, an oxygen ($O_2$) gas, a water ($H_2O$) vapor, an oxygen plasma, a remote oxygen plasma, etc. These gases or plasmas may be used independently. Alternatively, a mixture of these gases and/or plasmas may be used as the oxidant 212. Although an ozone ($O_3$) gas, an oxygen ($O_2$) gas, a water ($H_2O$) vapor, an oxygen plasma, a remote oxygen plasma, it will be understood that any suitable gas or combination of gases may be used in connection with example embodiments of the present invention. The first oxidant 212, which may include the ozone gas ($O_3$) may be provided into the chamber 202 for approximately 1 second to approximately 7 seconds, inclusive.

When the oxidant 212 is provided on the substrate 200, a chemisorbed zirconium precursor 210 in the first portion 204 of the first reactant may be chemically reacted with the oxidant 212, and the chemisorbed zirconium precursor 210 may be oxidized.

Figure 11D:
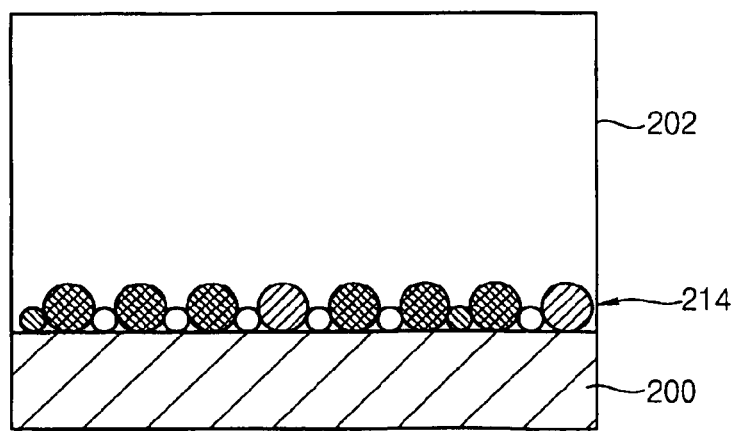

Referring to FIG. 11D, a second gas (e.g., a second purge gas) may be introduced into the chamber 202, for example, after oxidizing the chemisorbed zirconium precursor 210. The second gas may be the same, or substantially the same, as the first purge gas. The second gas may be provided into the chamber 202 for the same, or substantially the same, time to that of the first gas.

When the second gas is provided into the chamber 202, a remaining portion of the oxidant 212 that may not have reacted with the chemisorbed zirconium precursor 210 may be removed from the chamber 202. A solid-phased material (e.g., a metal oxide material) 214, which may include zirconium oxide ($ZrO_2$), may be formed on the substrate 200.

Figure 11E:
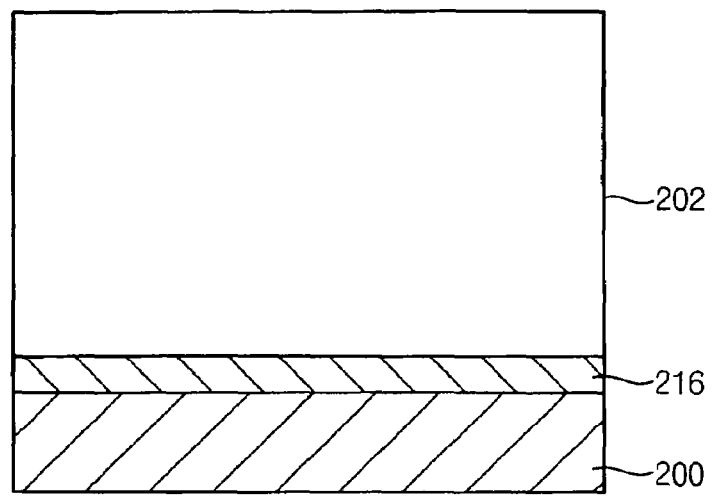
Figure 11F:
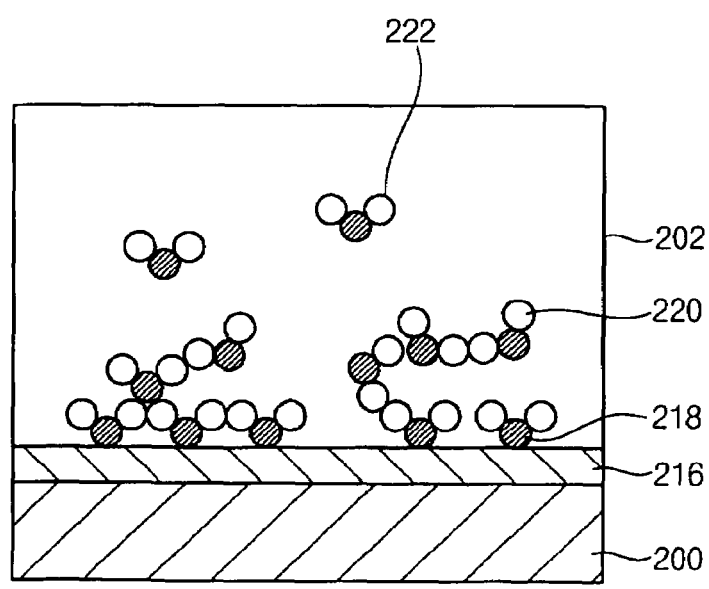

Referring to FIG. 11E, the process described with reference to FIGS. 11A to 11D may be repeated at least once. A first thin film 216, which may include the first solid-phase material (e.g., a metal oxide material) 214 of zirconium oxide may be formed on the substrate 200, that is, a zirconium oxide film may be formed on the substrate 200 as the first thin film 216.

Figure 12:
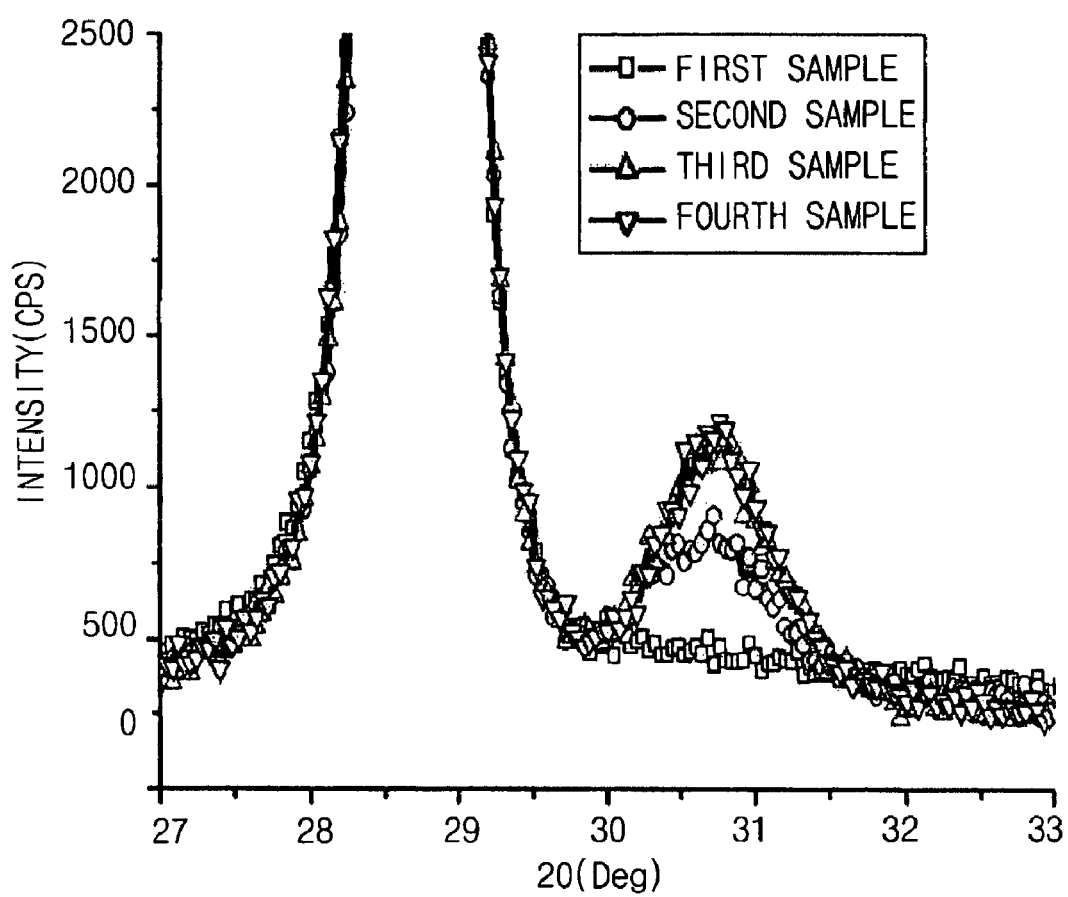
FIG. 12 is a graph illustrating crystalline structures of thin films formed in accordance with an exemplary embodiment of the present invention.

FIG. 12 is a graph illustrating example crystalline structures of thin films relative to thermal treatment temperature in accordance with an example embodiment of the present invention.

In FIG. 12, a silicon oxide film, a polysilicon film and a titanium nitride film may be formed (e.g., sequentially formed) on a bare silicon wafer, and a zirconium oxide film, which may correspond to the first thin film may be formed on the titanium nitride film by, for example, an example embodiment of the present invention as described with reference to FIGS. 11A to 11E. The silicon oxide film may have a thickness of approximately 1,000 Å, the polysilicon film may have a thickness of approximately 5,000 Å, and the titanium nitride film may have a thickness of approximately 300 Å. The zirconium oxide film may have a thickness of approximately 100 Å. A first sample, which may include the zirconium oxide film, may be prepared. A second sample, which may include the zirconium oxide film, may be prepared by, for example, by thermally treating the first sample at a temperature of approximately 400° C. for approximately 5 minutes, and a third sample, which may include the zirconium oxide film, may be prepared by thermally treating the first sample at a temperature of approximately 500° C. for approximately 5 minutes. Additionally, a fourth sample, which may include the zirconium oxide film, may be prepared by thermally treating the first sample at a temperature of approximately 600° C. for approximately 5 minutes.

Referring to FIG. 12, crystalline structures of the first to fourth samples may be observed using, for example, an X-ray diffractometer. The first sample may include the zirconium oxide film, which may not have any crystalline structure. The second to the fourth samples may include the zirconium oxide films, which may have respective crystalline structures. The zirconium oxide film may be crystallized at a temperature of, for example, greater than approximately 400° C. The zirconium oxide film may have a higher dielectric constant of approximately 35 and a thin equivalent oxide thickness (EOT), however, the zirconium oxide film alone may not be used for a dielectric layer of a capacitor, due to the crystallization of the zirconium oxide film at a lower temperature. In example embodiments of the present invention, a second thin film may be formed on the first thin film 216 to suppress (e.g., prevent) crystallization of the first thin film 216.

Referring to FIG. 11E, a second reactant may be provided on the first thin film 216 formed on the substrate 200. The chamber 202 may have the same, or substantially the same, temperature and/or a pressure as described with reference to FIG. 11A.

The second reactant may include, for example, a hafnium (Hf) precursor or an aluminum (Al) precursor. The hafnium precursor may include, for example, TEMAH (Hf$[NC_2H_5CH_3]_4$) or hafnium butyl oxide (Hf(O-tBu)$_4$). The hafnium precursor may include a mixture of, for example, TEMAH and hafnium butyl oxide. The aluminum precursor may include, for example, TMA (trimethyl aluminum, Al(CH$_3$)$_3$). Although the second reactant has been described herein as a hafnium or aluminum precursor, it will be understood that any suitable precursor may be used. The second reactant may have a gas phase through the use of a bubbler, or any suitable apparatus for providing the second reactant in a gas phase. The second reaction gas may be provided onto the first thin film 216 for about 0.5 seconds to about 3 seconds, inclusive.

Figure 11G:
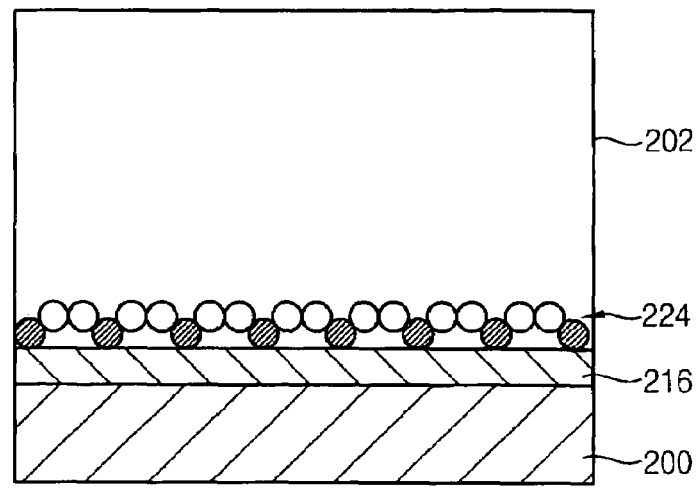

Referring to FIG. 11G, a third gas (e.g., a third purge gas) may be introduced into the chamber 202 and may remove a drifting second portion 222 of the second reactant and the physically absorbed second portion 220 of the second reactant, and the chemisorbed first portion 218 of the second reactant may remain on the first thin film 216. The remaining first portion 218 of the second reactant may correspond to precursor molecules 224.

Figure 11H:
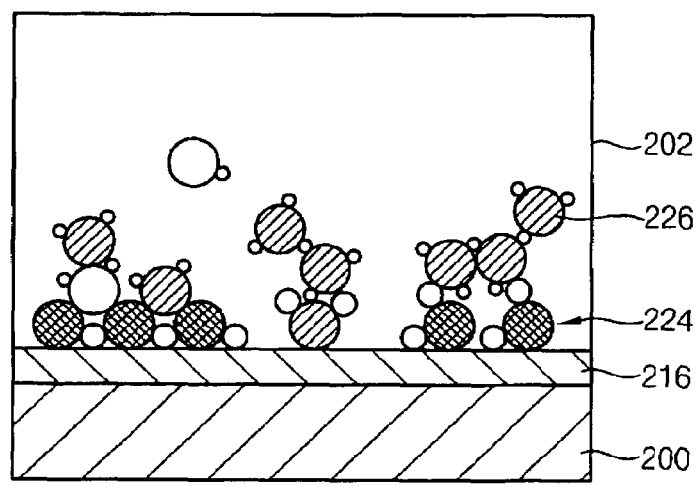

Referring to FIG. 11H, an oxidant 226 may be provided on the chemisorbed first portion 218 of the second reactant. The oxidant 226 may be introduced into the chamber 202 for the same, or substantially the same, time as the oxidant 212. The oxidant 226 may include the same, or substantially the same, gases and/or plasmas as the oxidant 212.

When the oxidant 226 is provided onto the chemisorbed first portion 218 of the second reactant, the oxidant 226 may be chemically reacted with the chemisorbed first portion 218 of the second reactant, for example, the oxidant 226 may oxidize the precursor molecules 224. When the second reactant includes the hafnium precursor, the precursor molecules 224 may be hafnium precursor molecules. When the second reactant includes the aluminum precursor, the precursor molecules 224 may be aluminum precursor molecules.

Figure 11I:
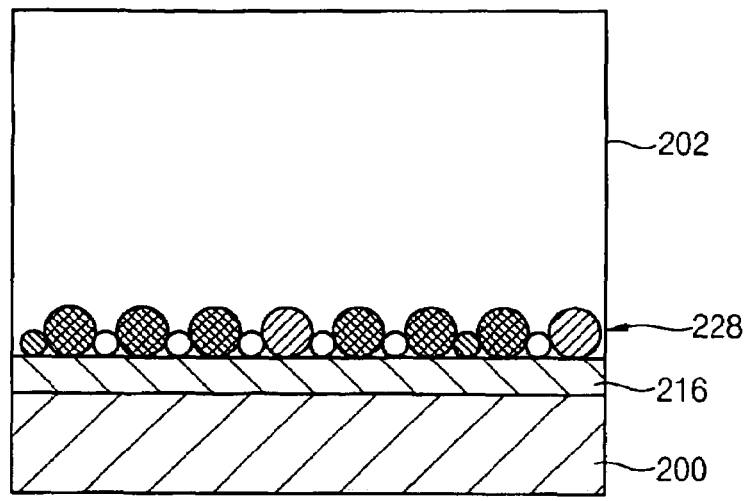

Referring to FIG. 11I, a fourth gas (e.g., a fourth purge gas) may be introduced into the chamber 202 for about 0.5 seconds to about 20 seconds, inclusive, and may remove a remaining portion of the oxidant 226, which may not chemically react with the chemisorbed first portion 218 of the second reactant. The fourth gas may include an inert (or inactive) gas, for example, an argon (Ar) gas or a nitrogen (N$_2$) gas. When the unreacted oxidant 226 is removed from the chamber 202, a second solid-phased material 228 may be formed on the first thin film 216. The second solid-phased material (e.g., metal oxide material) 228 may include, for example, hafnium oxide or aluminum oxide. Although the second solid-phased material (e.g., metal oxide material) 228 has been described herein as hafnium oxide or aluminum oxide, it will be understood that any suitable metal oxide material may used.

Figure 11J:
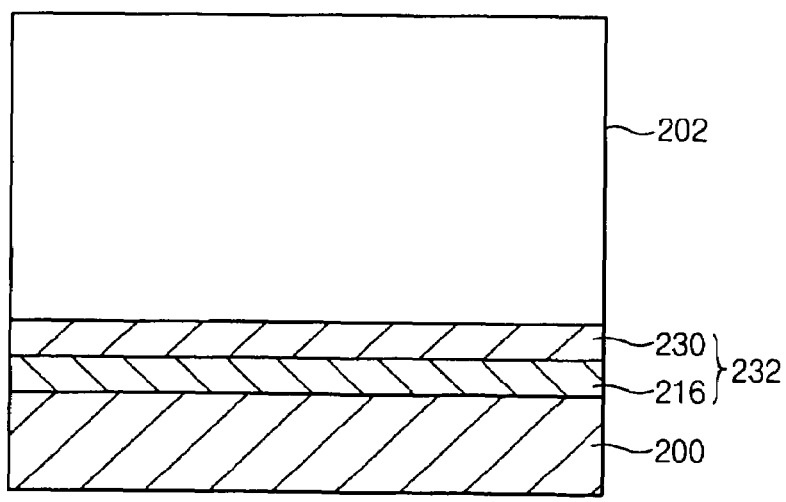

Referring to FIG. 11J, the process as described with reference to FIGS. 11F to 11I may be repeated at least once so that a second thin film 230 including the second solid-phased material (e.g., metal oxide material) 228 may be formed on the first thin film 216. The second thin film 230 may include, for example, hafnium oxide or aluminum oxide. As a result, the thin film structure 232, which may have the first thin film 216 and the second thin film 230, may be formed on the substrate 200.

The thin film structure 232 may have the first thin film 216 including, for example, zirconium oxide and the second thin film 230 including, for example, hafnium oxide or aluminum oxide. When the second thin film 230 includes hafnium oxide, the second thin film 230 may sufficiently suppress, (e.g., prevent) crystallization of the first thin film 216 because the second thin film 230 may have a higher crystalline temperature of, for example, greater than about 500° C. When the second thin film 230 includes aluminum oxide, the second thin film 230 may suppress (e.g., prevent) crystallization of the first thin film 216 because the second thin film 230 may have a higher crystalline temperature of greater than about 600° C. The thin film structure 232 may have a higher dielectric constant and/or a higher crystalline temperature because the first thin film 216 may provide the higher dielectric constant and/or a thin equivalent oxide thickness (EOT) and the second thin film 230 may provide the higher crystalline temperature. The thin film structure 232 may include the first thin film 216 having a first thickness and the second thin film 230 having a second thickness. The thin film structure may have a double-layered structure in which the first thin film 216 and the second thin film 230 may be formed (e.g., sequentially formed) on the substrate 200. When the double-layered thin film structure 232 is utilized in a dielectric layer of a capacitor, the first thin film 216 may have a first thickness of about 50 to about 150 Å, inclusive, and the second thin film 230 may have a second thickness of about 1 to about 30 Å, inclusive. When the second thin film 230 includes hafnium oxide, the second thickness may be in a range of about 1 to about 30 Å, inclusive. The second thin film 230 may have the second thickness of about 1 to about 20 Å, inclusive, when the second thin film 230 may include, for example, aluminum oxide.

Figure 13:
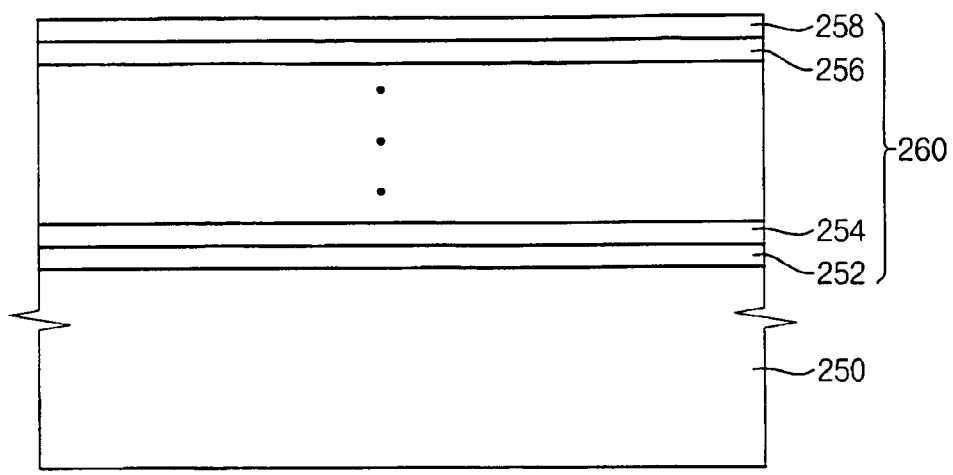
FIG. 13 is a cross sectional view illustrating a thin film structure in accordance with an exemplary embodiment of the present invention.

FIG. 13 is a cross sectional view illustrating a thin film structure in accordance with another example embodiment of the present invention.

Referring to FIG. 13, a first thin film 252 may be formed on a substrate 250 through the same, or substantially the same, processes as described with reference to FIGS. 11A to 11D. A second thin film 254 may be formed on the first thin film 252 by the same, or substantially the same, processes as described with reference to FIGS. 11F to 11I. The first thin film 252 may include, for example, zirconium oxide and the second thin film 254 may include, for example, hafnium oxide or aluminum oxide. However, the first thin film 252 and the second thin film 254 may be any suitable metal oxide material.

When forming additional first thin films 256 and additional second thin films 258, a thin film structure 260, which may include a plurality of first thin films 252 and 256 and a plurality of second thin films 254 and 258, may be formed on the substrate 250. All, or substantially all, of the first thin films 252 and 256 may be formed by the same, or substantially the same, processes as described with reference to FIGS. 11A to 11D. All, or substantially all, of the second thin films 254 and 258 may be formed using the same, or substantially the same, processes as described with reference to FIGS. 11F to 11I.

The thin film structure 260 may have a laminated structure in which a plurality of first thin films 252 and 256 and a plurality of second thin films 254 and 258 may be formed (e.g., alternately formed) on the substrate 250. When the thin film structure 260 with a laminated structure is included in a dielectric layer of a capacitor, all, or substantially all, of the thickness of the first thin films 252 and 256 may be in a range of about 50 to about 150 Å, inclusive, and all, or substantially all, of the thickness of the second thin films 254 and 258 may be about 1 to about 30 Å, inclusive. For example, the entire thickness of the second thin films 254 and 258 may be about 1 to about 30 Å when the second thin films 254 and 258 include hafnium oxides. In another example embodiment of the present invention, the second thin films 254 and 258 may include aluminum oxides, and the entire thickness of the second thin films 254 and 258 may be in a range of about 1 to about 20 Å.

The first thin films 252 and 256 may have a different thickness in accordance with the number of repetitions of the process for forming the first thin films 252 and 256. Each of the second thin films 252 and 256 may have a different thickness in accordance with the number of cycles of the processing steps for forming the second thin films 252 and 256.

Figure 14:
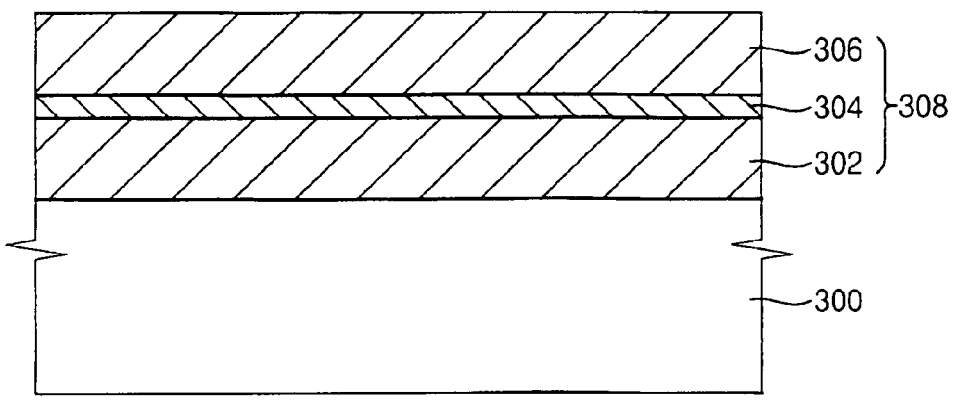
FIG. 14 is a cross sectional view illustrating a thin film structure in accordance with an exemplary embodiment of the present invention.

FIG. 14 is a cross sectional view illustrating a thin film structure in accordance with another example embodiment of the present invention.

Referring to FIG. 14, a first thin film 302 may be formed on a substrate 300 by the same, or substantially the same, processes as described with reference to FIGS. 11A to 11D. A second thin film 304 may be formed on the first thin film 302 by the same, or substantially the same, processes as described with reference to FIGS. 11F to 11I. An additional first thin film 306 may be formed on the second thin film 304 using the same, or substantially the same, processes as used in forming the first thin film 302. The first thin film 302 may include zirconium oxide, and the additional first thin film 306 may also include zirconium oxide. However, the first thin films 302 and/or 306 may be any suitable metal oxide material. The second thin film 304 may include hafnium oxide, aluminum oxide, or any other suitable metal oxide material. A thin film structure 308 may have a sandwich structure in which the second thin film 304 may be interposed between the first thin film 302 and the additional first thin film 306.

When the thin film structure 308 having such as structure is included in a dielectric layer of a capacitor, all, or substantially all, of the thickness of the first thin film 302 and the additional first thin film 306 may be about 50 to about 150 Å, inclusive, and a thickness of the second thin film 304 may be in a range of about 1 to about 30 Å, inclusive. For example, the second thin film 304 may include hafnium oxide, and the thickness of the second thin film 304 may be about 1 to about 30 Å, inclusive. In another example, when the second thin film 304 may include aluminum oxide, and the thickness of the second thin film 304 may be about 1 to about 20 Å, inclusive.

In an example embodiment of the present invention, a thin film structure may have another sandwich structure in which a first thin film including zirconium oxide may be interposed between two of second thin films, which may include, for example, hafnium oxides or aluminum oxide. However, the first and second thin films may be any suitable metal oxide material.

FIGS. 15A to 15E are cross sectional views illustrating a method of forming a capacitor in accordance with another example embodiment of the present invention.

Figure 15A:
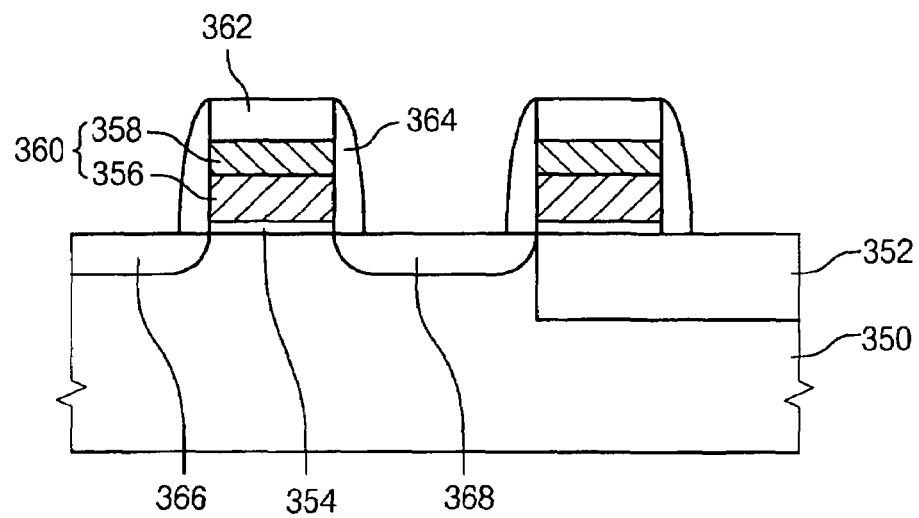
FIGS. 15A to 15E are cross sectional views illustrating a method of forming a capacitor in accordance with an exemplary embodiment of the present invention.

Referring to FIG. 15A, an active region and a field region 352 may be formed on a substrate (e.g., semiconductor substrate) 350, for example, through an isolation process such as a shallow trench isolation (STI) process, although any suitable process may be used.

A gate insulation layer pattern 354 and a gate electrode 360 may be formed on the substrate 350. The gate electrode 360 may include, for example, a polysilicon layer pattern 356 and a metal silicide layer pattern 358.

A capping layer pattern 362 may be formed on the gate electrode 360. The capping layer pattern 362 may include, for example, an oxide such as silicon oxide or a nitride such as silicon nitride, however, any suitable oxide or nitride may be used.

Source/drain regions 366 and 368 may be formed at portions of the active regions, which may be adjacent to the gate electrode 360. The source/drain regions 366 and 368 may be formed, for example, by implanting impurities into the portions of the active region using, for example, the gate electrode 360 as an implantation mask.

A spacer 364 may be formed on sidewalls of the gate electrode 360 and the capping layer pattern 362. The spacer 364 may be formed using a nitride such as silicon nitride, however, any suitable nitride may be used.

Figure 15B:
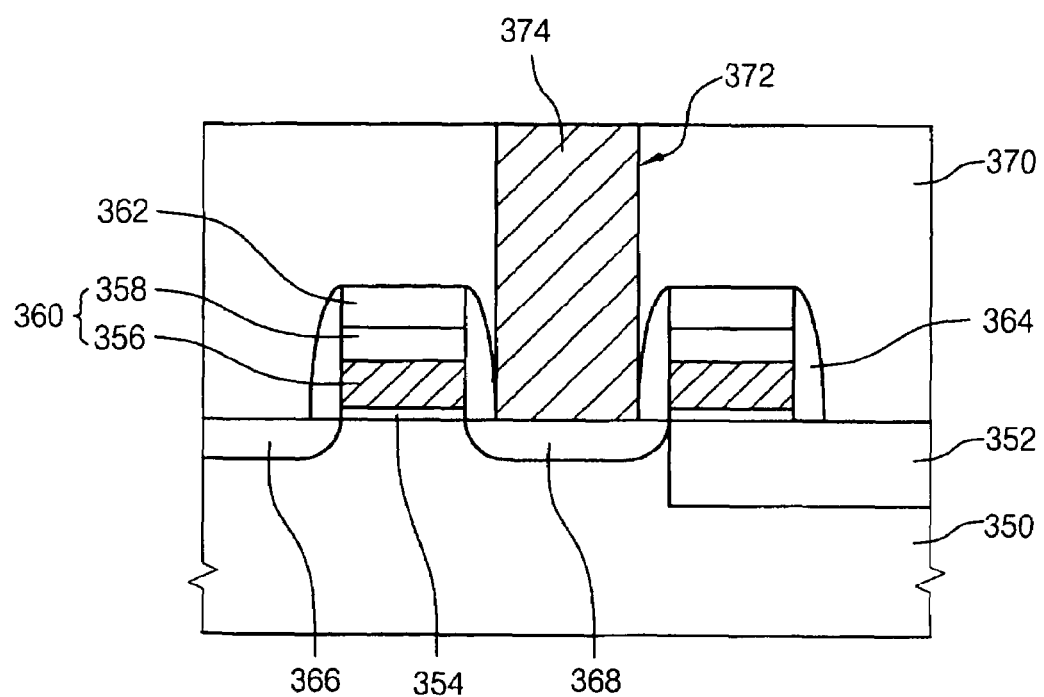

Referring to FIG. 15B, a first insulation layer 370 may be formed on the substrate 350, and may cover the capping layer pattern 362 positioned on the gate electrode 360. The first insulation layer 370 may be formed using oxide, however, any suitable insulating material may be used.

The first insulation layer 370 may be etched (e.g., partially etched) to form a first contact hole 372, which may expose (e.g., partially expose) the source/drain regions 366 and 368.

A first conductive layer may be formed on the first insulation layer 370 and may fill (e.g., sufficiently fill) the first contact hole 372. The first conductive layer may include a conductive material such as doped polysilicon, metal, or any suitable conductive material.

The first conductive layer may be removed by, for example, a CMP process, an etch back process or a combination process of CMP and etch back until the first insulation layer 370 may be exposed. A plug (e.g., a contact plug) 374 may be formed in the first contact hole 372. The plug 374 may contact (e.g., electrically contact) the source/drain regions 366 and 368.

Figure 15C:
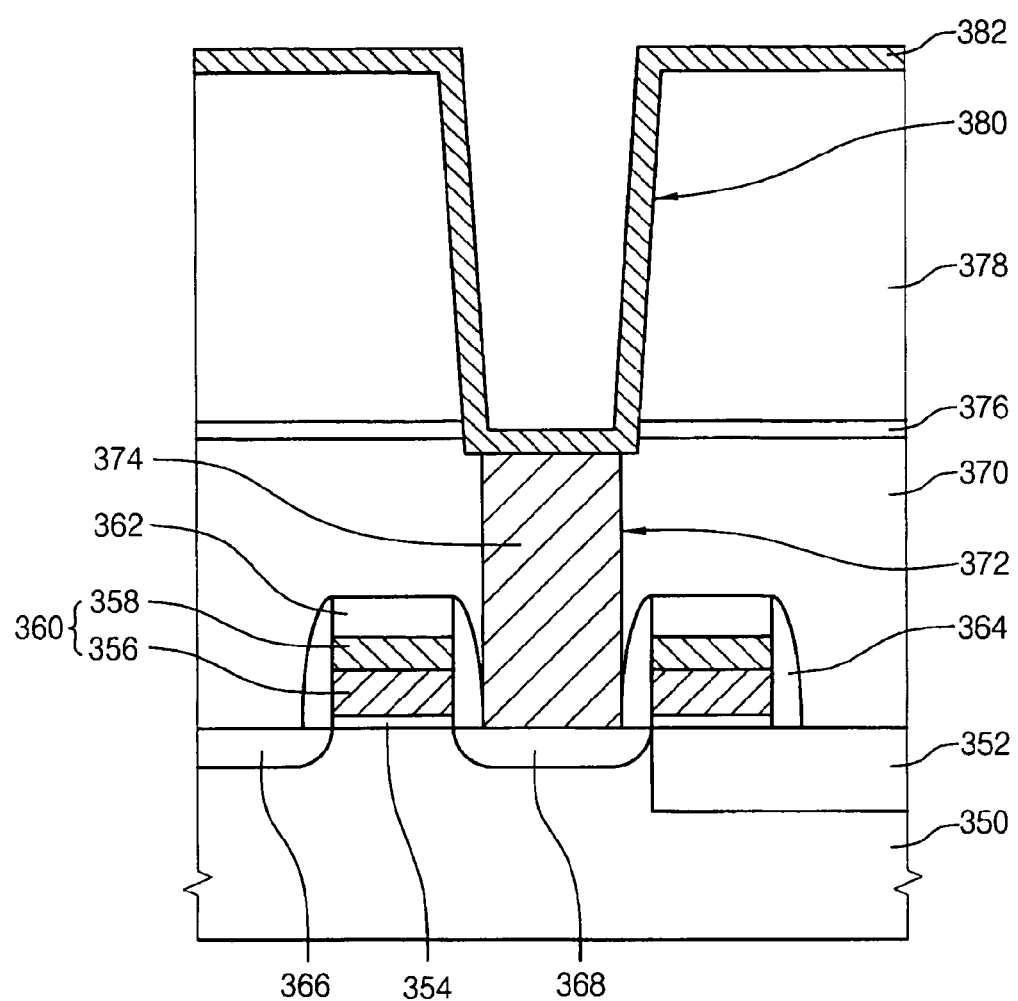

Referring to FIG. 15C, an etch stop layer 376 may be formed on the plug 374 and the first insulation layer 370. The etch stop layer 376 may include a material having an etch rate higher, or substantially higher, than that of the first insulation layer 370. For example, the etch stop layer 376 may include a nitride such as silicon nitride, an oxynitride such as silicon oxynitride, or any other suitable nitride or oxynitride.

A second insulation layer 378 may be formed on the etch stop layer 376. The second insulation layer 378 may include an oxide. The second insulation layer 378 and the etch stop layer 376 may be partially etched to form a second contact hole 380 which may expose the plug 374. When the second contact hole 380 is formed, the second insulation layer 378 may be etched to expose, for example, a portion of the etch stop layer 376. The exposed portion of the etch stop layer 376 may be etched, which may form the second contact hole 380 through the second insulation layer 378 and the etch stop layer 376. The second contact hole 380 may have a lower portion and an upper portion. A rate of etching the second insulation layer 378 may decrease (e.g., gradually decrease) from the etching of the upper portion of the second insulation layer 378 to the lower portion of the second insulation layer 378, and the upper portion may have a diameter larger, or substantially larger, than that of the lower portion.

A second conductive layer 382 may be formed on the second insulation layer 378, the exposed contact plug 374, and an inside of the second contact hole 380. The second conductive layer 382 may include a conductive material such as titanium nitride (TiN), ruthenium (Ru), tantalum nitride (TaN), tungsten nitride (WN), a mixture thereof, or any suitable conductive material. The second conductive layer may include titanium nitride, for example, when a first thin film 386 of a dielectric layer 390 includes zirconium oxide.

Figure 15D:
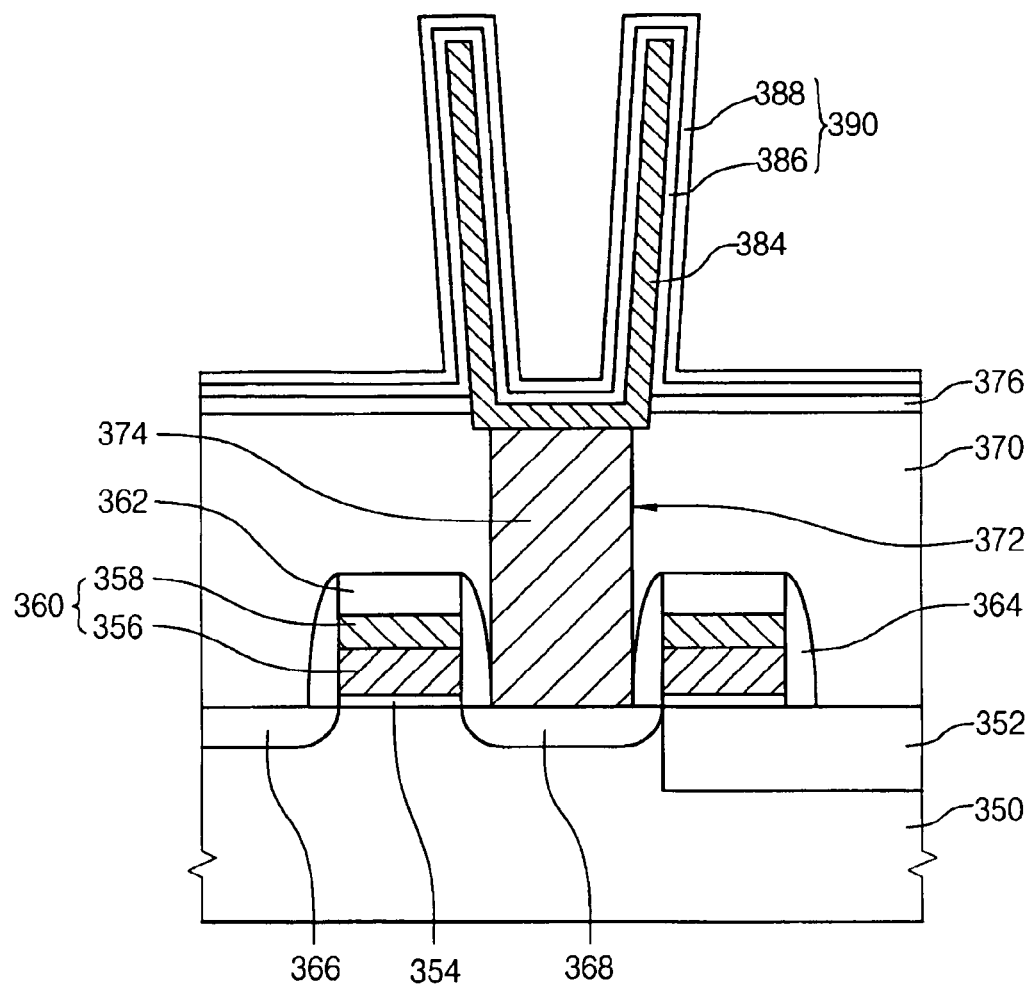

Referring to FIG. 15D, a sacrificial layer (not shown) may be formed on the second conductive layer 382 to fill the second contact hole 380, and the sacrificial layer and the second conductive layer 382 may be removed (e.g., partially removed), for example, until the second insulation layer 378 may be exposed. A lower electrode 384 may be formed on the inside of the second contact hole 380 and the exposed portion of the plug 374. A sacrificial layer pattern filling the second contact hole 380 may be formed on the lower electrode 384. The sacrificial layer pattern may be removed, which may create the lower electrode 384 contacting the plug 374. The lower electrode 384 may have, for example, a cylindrical structure of which an upper diameter may be larger, or substantially larger, than a lower diameter, however, any suitable structure and/or diameter may be used. For example, the lower electrode 384 may have a height of about 10,000 to about 17,000 Å, inclusive.

The dielectric layer 390 having a double-layered structure may be formed on the lower electrode 384. The dielectric layer 390 may include the first thin film 386 having a higher dielectric constant and a second thin film 388 having a higher crystalline temperature. The first thin film 386 may include, for example, zirconium oxide and the second thin film 388 may include, for example, hafnium oxide or aluminum oxide. The second thin film 388 may suppress (e.g., prevent) the first thin film 386 from crystallizing. The first and second thin films 386 and 388 may be formed through processing steps identical, or substantially identical, to those described above.

As described above, the dielectric layer 390 may have a laminated structure that includes a plurality of first thin films and a plurality of second thin films alternately formed on a lower electrode. Alternatively, the dielectric layer 390 may have a sandwich structure in which a first thin film may be formed between two of second thin films, or a second thin film may be interposed between two of first thin films.

The first thin film 386 of the dielectric layer 390 may have a first thickness of about 50 to about 150 Å, inclusive, and the second thin film 388 of the dielectric layer 390 may have a second thickness of about 1 to about 30 Å, inclusive. When the second thin film 388 includes hafnium oxide, the second thin film 388 has the second thickness of about 1 to about 30 Å. Otherwise, the second thin film 388 may have the second thickness of about 1 to about 20 Å, inclusive, when the second thin film 388 includes, for example, aluminum oxide.

When the second thin film 388 includes hafnium oxide, the second thin film 388 of hafnium oxide may have, for example, a thickness thinner, or substantially thinner, than that of the second thin film 388 of aluminum oxide because aluminum oxide has a dielectric constant lower, or substantially lower, than that of hafnium oxide. A capacitance of a capacitor C' may be in inverse proportion to the thickness of the dielectric layer 390, the capacitor C' may have a constant capacitance by adjusting, for example, the second thickness of the second thin film 388.

The dielectric layer 390 may include the first thin film 386 and the second thin film 388, and the capacitor C' may have a sufficient capacitance due to the first thin film 386 having the higher dielectric constant. A crystallization of the dielectric layer 390 may be suppressed (e.g., prevented) by the second thin film 388 having the higher crystalline temperature for reducing (e.g., preventing) the first thin film 386 from crystallizing. Successive processes for forming the capacitor C' may be more easily carried out while suppressing (e.g., preventing), damage to the dielectric layer 390. Although the successive processes may be performed at higher temperatures of about 500 to about 600° C., inclusive, the dielectric layer 390 may not be crystallized due to the second thin film 388.

Figure 15E:
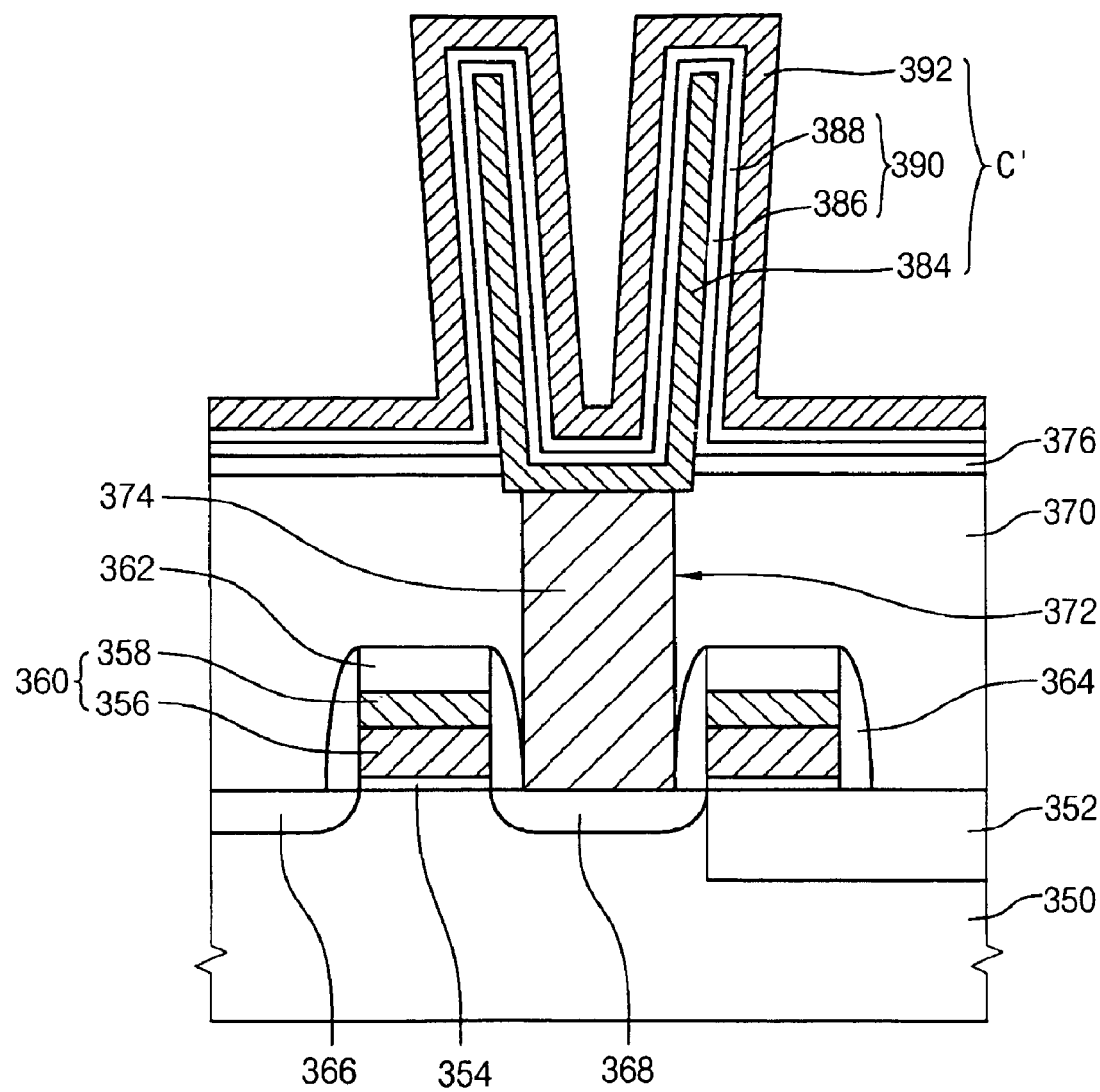
Figure 16:
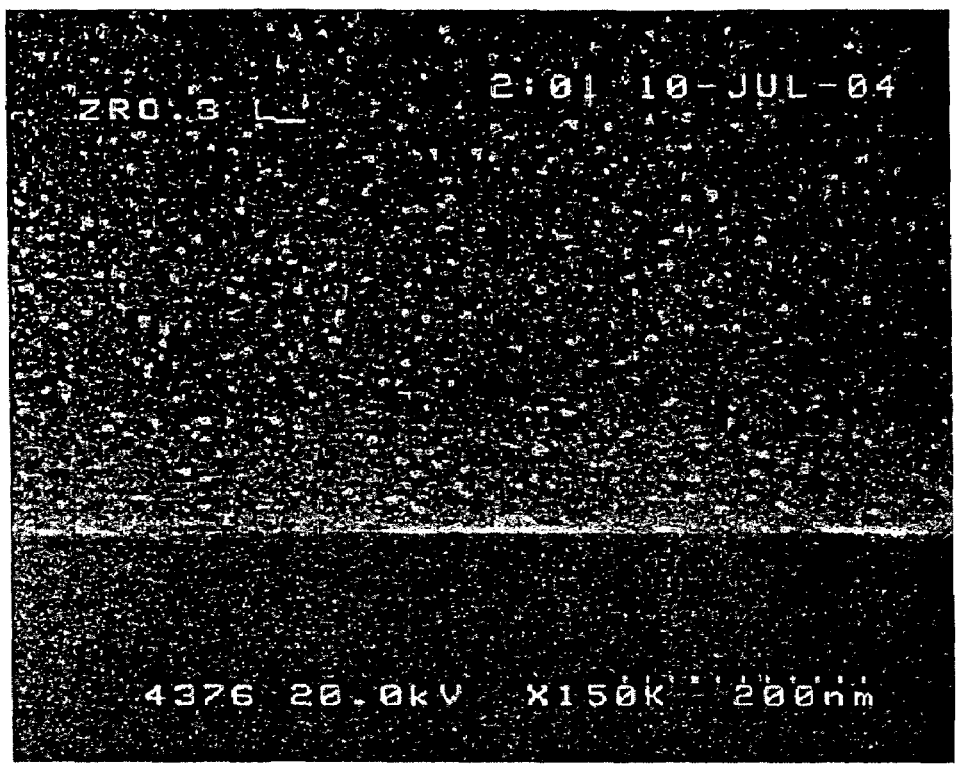
FIG. 16 illustrates a morphology of a thin film including zirconium oxide according to a conventional method of forming the thin film.

Referring to FIG. 15E, the dielectric layer 390 including the first and second thin films 386 and 388 may be formed on the lower electrode 384, and the dielectric layer 390 may be thermally treated to cure the dielectric layer 390 and to remove impurities contained in the dielectric layer 390. For example, the dielectric layer 390 may be thermally treated using an ultra violet ray, an ozone gas or plasma. The dielectric layer 390 may include the second thin film 388, and the dielectric layer 390 may be thermally treated without crystallization thereof.

An upper electrode 392 may be formed on the dielectric layer 390 to form the capacitor C' including the lower electrode 384, the dielectric layer 390 and the upper electrode 392 over the substrate 350. The upper electrode 392 may include a conductive material such as doped polysilicon, metal or metal nitride. For example, the upper electrode 392 may include titanium nitride (TiN), ruthenium (Ru), tantalum nitride (TaN), tungsten nitride (WN) or a mixture thereof. When the second thin film 388 of the dielectric layer 390, the upper electrode 392 may include titanium nitride.

The dielectric layer 390 may include the first thin film 386 of zirconium oxide and the second thin film 388 of hafnium oxide or aluminum oxide. The dielectric layer 390 may have a higher dielectric constant and/or a higher crystalline temperature.

In an example embodiment of the present invention, a dielectric layer of a capacitor may have, for example, a laminated structure in which a plurality of first thin films and a plurality of second thin films may be formed, (e.g., alternately formed) on a lower electrode of the capacitor. In another example embodiment of the present invention, a dielectric layer of a capacitor may have a sandwich structure in which a second thin film may be formed between two of first thin films or a first thin film may be disposed between two of second thin films.

Figure 17:
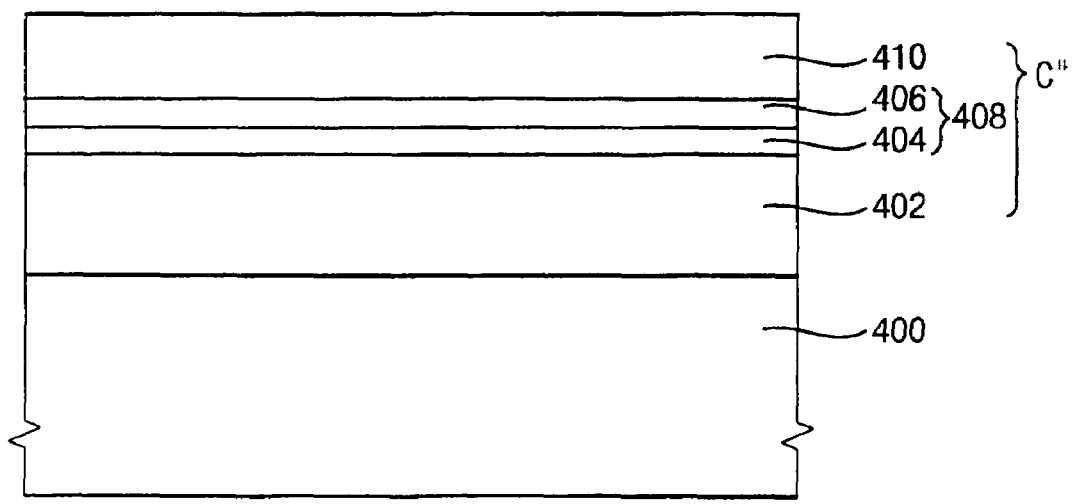
FIG. 17 is a cross sectional view illustrating a method of forming a capacitor in accordance with an exemplary embodiment of the present invention.

FIG. 17 is a cross sectional view illustrating an example embodiment of a method of forming a capacitor according to the present invention.

Referring to FIG. 17, a capacitor C'' may be formed on a substrate 400. The substrate 400 may be, for example, a silicon wafer or any other suitable substrate material. The capacitor C'' may include a lower electrode 402 formed on the substrate 400, a dielectric structure 408 formed on the lower electrode 402, and an upper electrode 410 formed on the dielectric structure 408. The dielectric structure 408 may include a thin film 404 formed on the lower electrode 402 and a thin film 406 formed on the thin film 404. The thin film 404 may include, for example, aluminum oxide and may improve the morphology of the dielectric structure 410. The thin film 406 may have an equivalent oxide thickness (EOT), which may be smaller, or substantially smaller, and may have a dielectric constant higher, or substantially higher, than that of the thin film 404. The thin film 406 may include, for example, zirconium oxide.

The thin film 404 may have a dielectric constant of, for example, less than or equal to about 10, and the thin film 406 may have a dielectric constant of greater than or equal to about 30.

The thin film 404 may be formed using a first material and a first oxidant for oxidizing the first material. The thin film 406 may be formed using a second material and a second oxidant for oxidizing the second material. For example, the first material for forming the thin film 404 may include TMA (Al(CH$_3$)$_3$), and the second material for forming the thin film 406 may include TEMAZ (Zr[N(CH$_3$)(C$_2$H$_5$)]$_4$), zirconium butyl oxide (Zr(O-tBu)$_4$), a mixture of TEMAZ and zirconium butyl oxide, or any other suitable material, or combination of materials may also be used for forming the thin film 406. The first and second oxidants may include, for example, ozone (O$_3$), oxygen (O$_2$), oxygen plasma, remote oxygen plasma, a mixture thereof, or any other suitable oxidant.

FIGS. 18A to 18J are cross sectional views illustrating an example embodiment of a method of forming a capacitor according to the present invention.

Referring to FIG. 18A, a lower electrode 454 may be formed on a substrate 450. For example, the lower electrode 454 may be formed using polysilicon, and during formation of the dielectric structure 480, silicon contained in the lower electrode 454 may diffuse into a dielectric structure 480 (see FIG. 18J). The lower electrode 454 may include titanium nitride (TiN), ruthenium (Ru), tantalum nitride (TaN), tungsten nitride (WN) or a mixture thereof and the diffusion of the lower electrode 454 into the dielectric structure 480 may be suppressed. The lower electrode 454 may be formed using, for example, a chemical vapor deposition (CVD) process or an atomic layer deposition (ALD) process. For example, the lower electrode 454 may be formed with TiN using an ALD process.

The substrate 450 including the lower electrode 454 formed thereon may be placed in a chamber 452. When the chamber 452 has a temperature of less than or equal to about 200° C., the reactivities of a first material and a second material provided into the chamber 452 for forming a thin film 466 and a thin film 478 may be suppressed. The dielectric structure 480 may crystallize, for example, when the chamber 452 has a temperature of greater than or equal to about 400° C. In example embodiments of the present invention, the chamber 452 may have a temperature of about 200° C. to about 400° C., inclusive. For example, when the chamber 452 has a temperature of about 300° C., the dielectric structure 480 may be formed on the lower electrode 454 utilizing one or more ALD processes and the dielectric structure 480 may have improved characteristics.

When the chamber 452 has a pressure of below about 0.1 Torr, the reactivities of the first material and the second material provided into the chamber 452 for forming the thin film 466 and/or the thin film 478 may also be suppressed. For example, the chamber 452 may have a pressure of greater than or equal to about 3.0 Torr, and the thin film 466 and the thin film 478 may not be formed, or sufficiently formed, on the lower electrode 454. In example embodiments of the present invention, the chamber 452 may have a pressure of about 0.1 Torr to about 3.0 Torr, inclusive.

The chamber 452 may have the above-described temperature and/or pressure, and the substrate 450 including the lower electrode 454 formed thereon may be inserted into the chamber 452. The first material, for example, TMA may be introduced into the chamber 452 to form the thin film 466 on the lower electrode 454. The first material may be provided on the substrate 450 in, for example, a gas state using a bubbler or any other similar apparatus. The first material may be provided on the lower electrode 454 for about 0.5 seconds to about 3 seconds, inclusive.

A portion 456 of the first material may be chemically absorbed (e.g., chemisorbed) to the lower electrode 454, and another portion 458 of the first material may be physically absorbed to the first portion 456 or may drift in the chamber 452.

Referring to FIG. 18B, a first purge gas may be provided into the chamber 452. The first purge gas may include an inert gas such as, for example, an argon gas, a nitrogen gas, or any other suitable inert gas. The first purge gas may be provided for about 0.5 seconds to about 20 seconds, inclusive.

The first purge gas may remove the physically absorbed and/or drifting portion 458 of the first material from the chemisorbed portion 456 and/or the chamber 452, while precursor molecules (e.g., aluminum precursor molecules) 460 of the chemisorbed portion 456 may remain on the lower electrode 454. In example embodiments of the present invention, the portion 458 may be removed from the chemisorbed portion 456 and/or the chamber 452, for example, by vacuumizing the chamber 452 for about 2 seconds to about 10 seconds, inclusive. The portion 458 of the first material may also be removed from the chemisorbed portion 456 and/or the chamber 452, for example, by introducing the first purge gas into the chamber 452 and vacuumizing (e.g., simultaneously vacuumizing) the chamber 452.

Figure 18C:
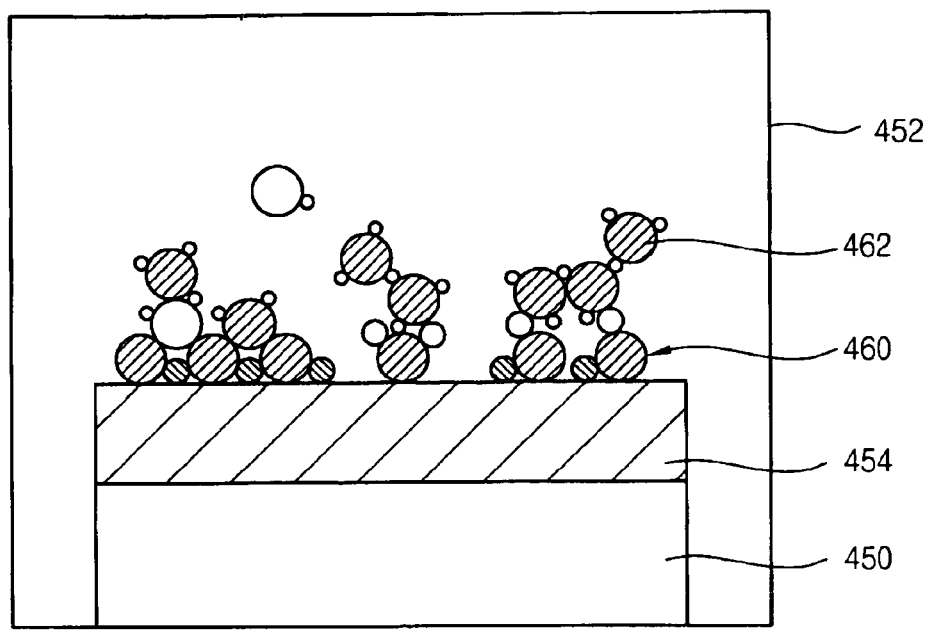

Referring to FIG. 18C, an oxidant 462 may be introduced into the chamber 452 for about 1 second to about 7 seconds, inclusive. The oxidant 462 may include ozone ($O_3$), or any other suitable gas. When the oxidant 462 is provided into the chamber 452, the oxidant 462 may react with the precursor molecules 460 of the chemisorbed portion 456, which may oxidize the precursor molecules 460 of the chemisorbed portion 456.

Figure 18D:
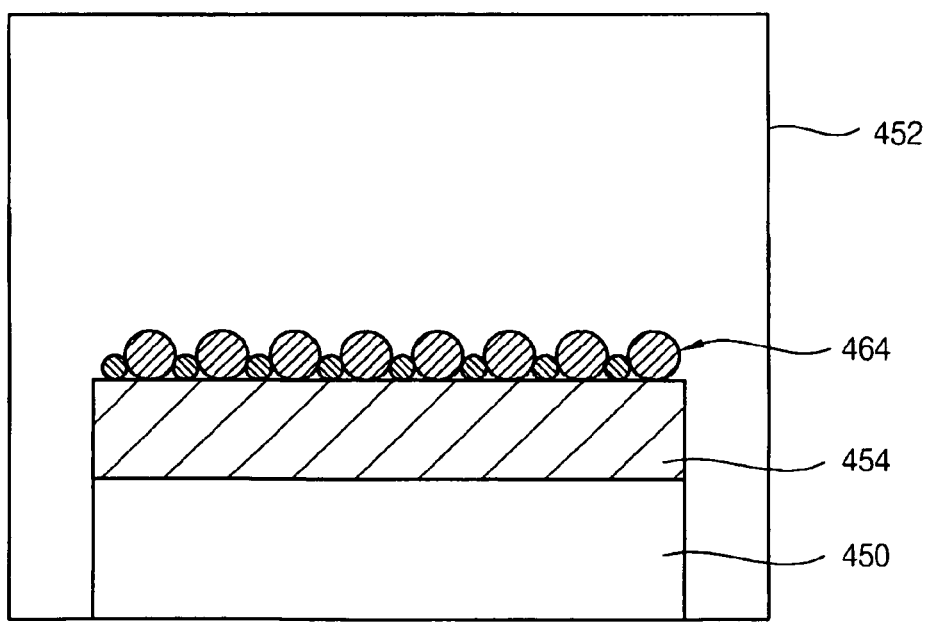

Referring to FIG. 18D, a second purge gas may be introduced into the chamber 452. The second purge gas may be the same, or substantially the same, as the first purge gas. The second purge gas may be provided into the chamber 452 for about 0.5 seconds to about 20 seconds, inclusive. When the second purge gas is provided into the chamber 452, the unreacted portion of the oxidant 462 may be removed from the chamber 452, and a metal oxide material 464, which may include, for example, aluminum oxide may be formed on the lower electrode 454.

Figure 18E:
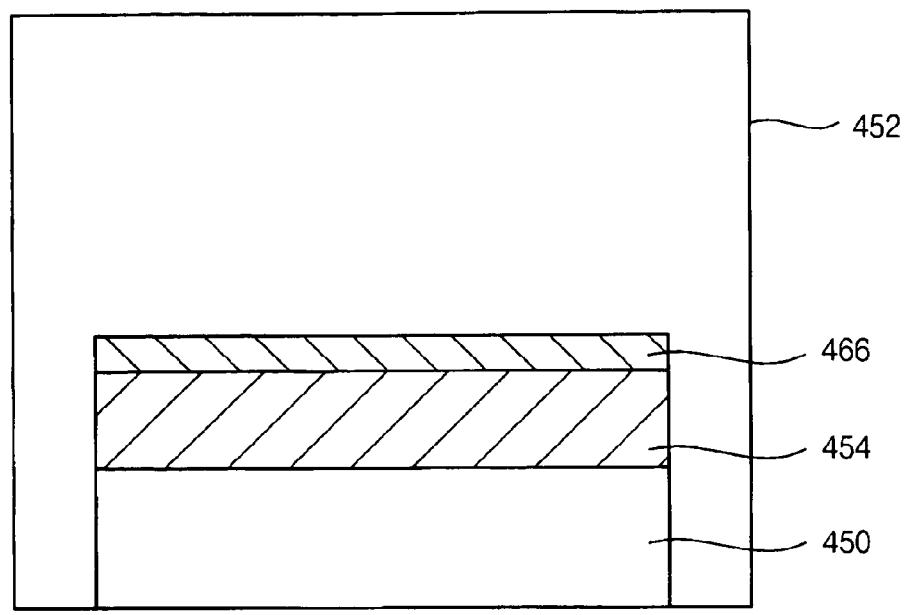

Referring to FIG. 18E, the processes described with reference to FIGS. 18A to 18D may be repeated at least once and/or until the metal oxide material 464 has a desired thickness. The metal oxide material 464 may form the thin film 466 on the lower electrode 454. The thin film 466 may include aluminum oxide.

In example embodiments of the present invention, the thin film 466 may have a thickness of about 1 Å to about 100 Å, inclusive, which may improve the morphology of the dielectric structure 480, and may increase the dielectric constant of the dielectric structure 480.

Figure 18F:
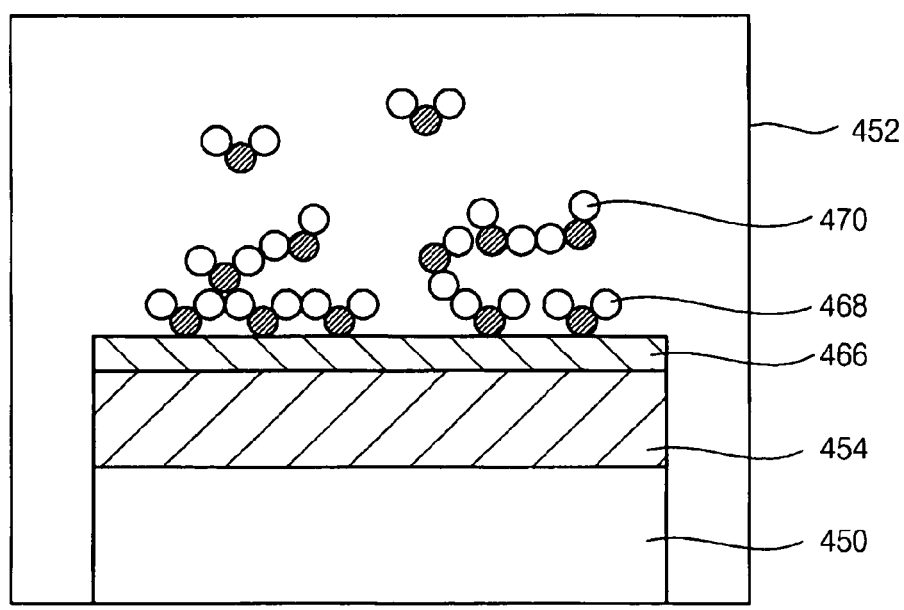

Referring to FIG. 18F, a second material may be introduced into the chamber 452. The second material may include, for example, TEMAZ or zirconium butyl oxide. The second material may be provided into the chamber 452 and may have a gas state using a bubbler, or any similar apparatus. The chamber 452 may have a temperature of about 200° C. to about 400° C., inclusive and a pressure of about 0.1 Torr to about 3.0 Torr, inclusive, and the second material may be provided into the chamber 452 for about 0.5 seconds to about 3 seconds, inclusive.

When the second material is provided into the chamber 452, a portion 468 of the second material may be chemically absorbed (e.g., chemisorbed) to the thin film 466, and another portion 470 of the second material may be physically absorbed to the chemisorbed portion 468 or may drift in the chamber 452.

Figure 18G:
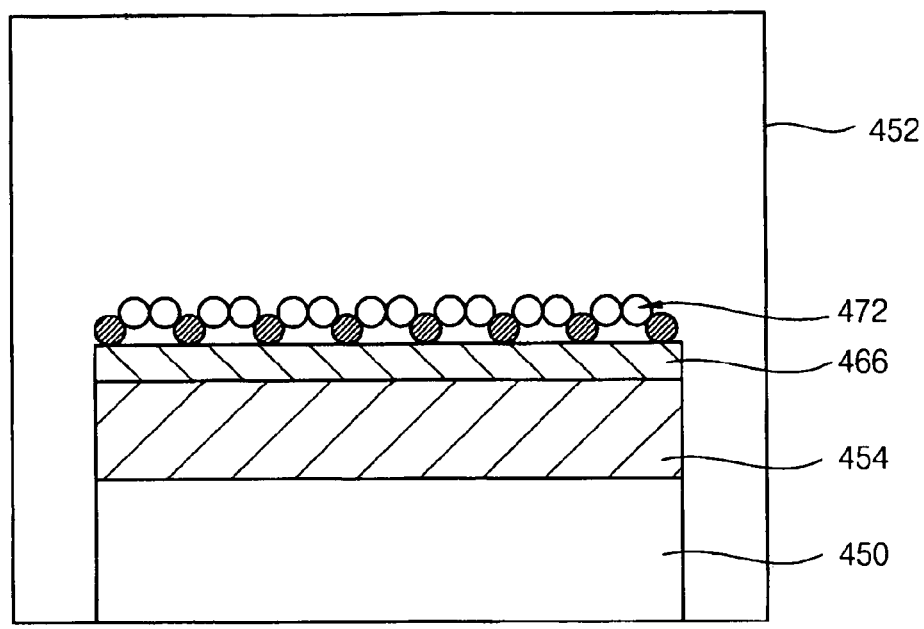

Referring to FIG. 18G, a third purge gas may be introduced into the chamber 452 and may remove the physically absorbed and/or drifting portion 470 of the second material from the chemisorbed portion 468 and/or the chamber 452. The third purge gas may be provided into the chamber for about 0.5 seconds to about 20 seconds and may be the same, or substantially the same, as the first purge gas. The third purge gas may be introduced into the chamber 452, and precursor molecules 472 of the chemisorbed portion 468 may remain on the thin film 466.

Figure 18H:
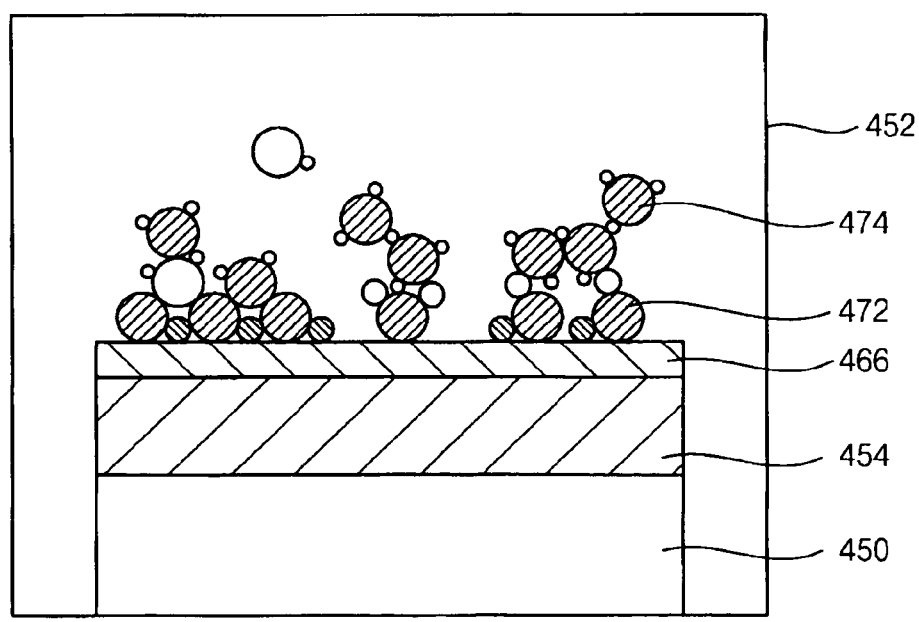

Referring to FIG. 18H, an oxidant 474 may be introduced into the chamber 452 for about 1 second to about 7 seconds, inclusive. The oxidant 474 may be the same, or substantially the same, as the oxidant 463. When the oxidant 474 is provided into the chamber 452, the oxidant 474 may oxidize the precursor molecules 472 through a chemical reaction.

Figure 18I:
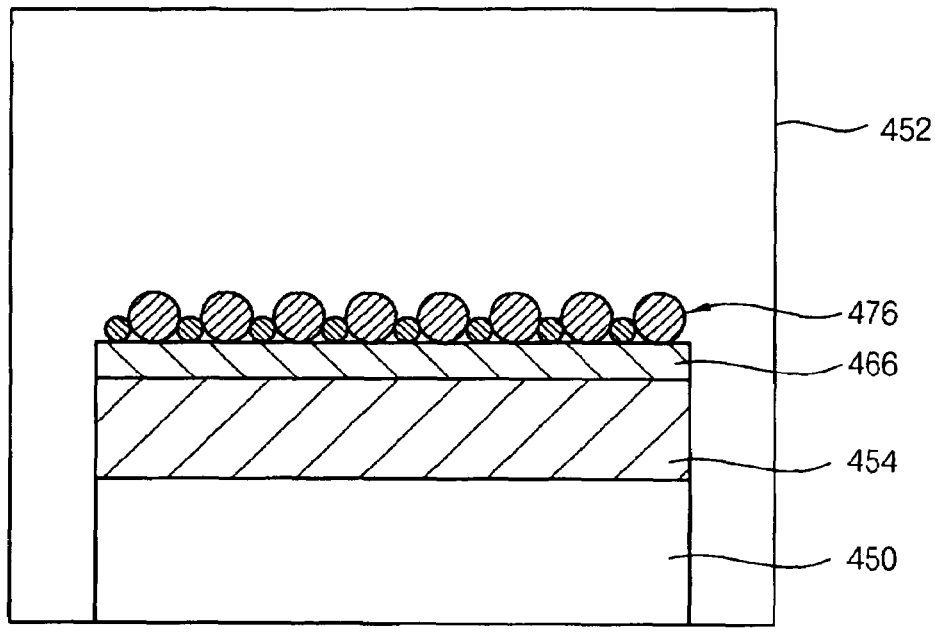

Referring to FIG. 18I, a fourth purge gas may be introduced into the chamber 452 for about 0.5 seconds to about 20 seconds, inclusive, and may remove unreacted portions of the oxidant 474 from the chamber 452. The fourth purge gas may be the same, or substantially the same, as the first purge gas. The fourth purge gas may be introduced into the chamber 452, and a metal oxide 476, which may include zirconium oxide, may be formed on the thin film 466.

Figure 18J:
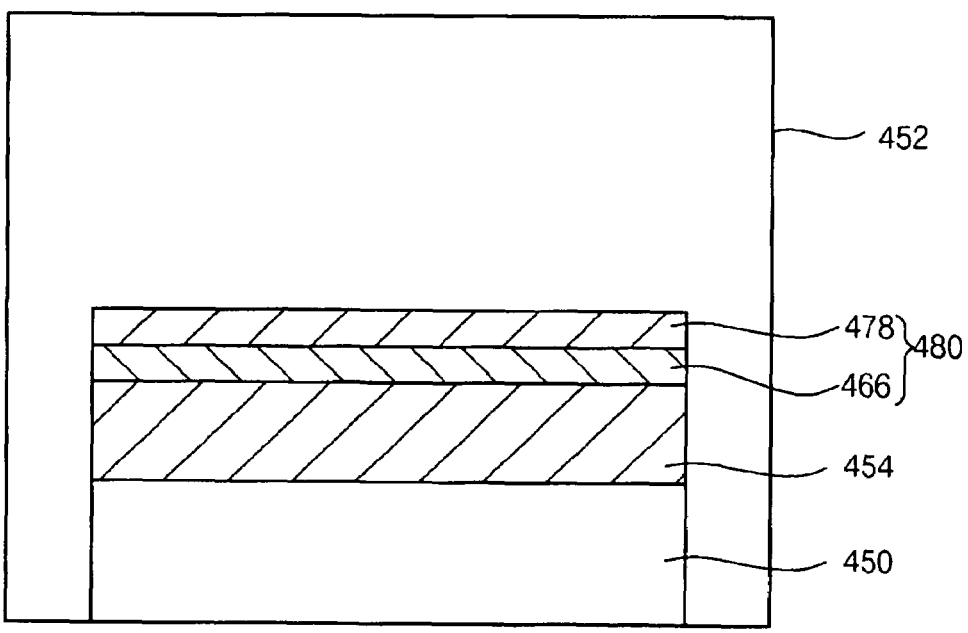

Referring to FIG. 18J, the introducing of the material, the purge gas, the oxidant and the purge,gas (as described with respect to FIGS. 18F-18I) may be repeated at least once and/or until the thin film reaches a desired thickness. The thin film 478 may be formed on the thin film 466, and may include zirconium oxide. The thin films 466 and/or 478 may form the dielectric structure 480 on the lower electrode 454.

The thin film 478 may have a thickness of about 5 Å to about 400Å, inclusive, may have a smaller equivalent oxide thickness and/or a higher dielectric constant. The dielectric structure 480 may include the thin film 466, which may improve the morphology of the dielectric structure 480 and/or the thin film 478, which may increase the dielectric constant of the dielectric structure 480.

An upper electrode (not shown) may be formed on the dielectric structure 480. The upper electrode may be positioned on the dielectric structure 480, and the upper electrode may include, for example, polysilicon. The upper electrode may also be formed using, for example, TiN, Ru, TaN, WN a mixture thereof, or any other suitable material, and may be formed using a CVD process, an ALD process, a combination thereof, or any other suitable process. For example, the upper electrode may be formed via an ALD process using TiN.

When the upper electrode is formed on the dielectric structure 480, a capacitor, which may include the lower electrode 454, the dielectric structure 480 and/or the upper electrode, may be formed on the substrate 450. The dielectric structure 480 may have, for example, a double-layered structure in which the thin film 466 and the thin film 478 may be formed (e.g., successively formed) on the lower electrode 454.

Figure 19:
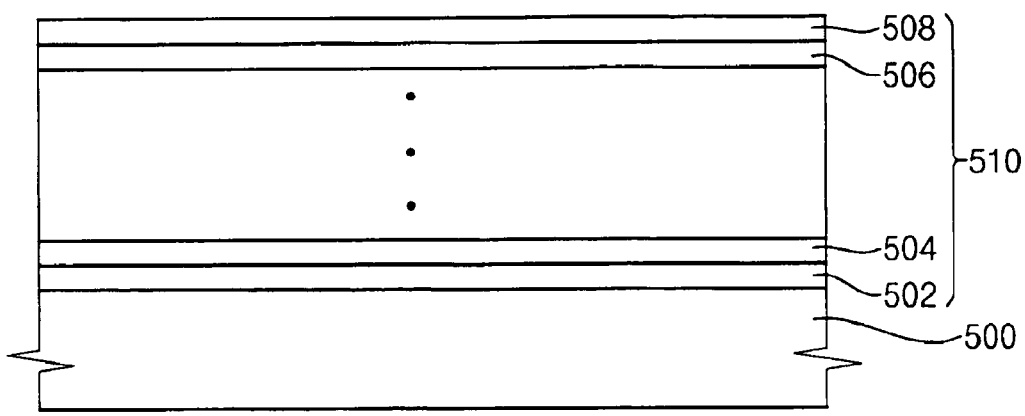
FIG. 19 is a cross sectional view illustrating a method of forming a capacitor in accordance with an exemplary embodiment of the present invention.

FIG. 19 is a cross sectional view illustrating an example embodiment of the method of forming a capacitor according to the present invention.

Referring to FIG. 19, a thin film 502 may be formed on a substrate 500 using the same, or substantially the same, process as described with reference to FIGS. 18A to 18D. A thin film 504 may be formed on the thin film 502 using the same, or substantially the same, process as described with reference to FIGS. 18F to 18I. The thin film 502 may include, for example, aluminum oxide, and the thin film 504 may include, for example, zirconium oxide. However, the thin film 502 and the thin film 504 may be any suitable metal oxide material or combination of metal oxide materials.

Additional thin films 506 and 508 may be formed and a dielectric structure 510, which may include a plurality of thin films 502, 504, 506, and 508 may be formed on the substrate 500. In example embodiments of the present invention, one or both of the thin films 502 and 506 may be formed using the same, or substantially the same, process as described with reference to FIGS. 18A to 18D, and one or both of the thin films 504 and 508 may be formed using the same, or substantially the same, process as described with reference to FIGS. 18F to 18I. However, it will be understood that the thin films 502, 504, 506, and 508 may be formed using either the process as described above with respect to FIGS. 18A-18D, FIGS. 18F-18I, or any other suitable process.

In another example embodiment of the present invention, the dielectric structure 510 may have a laminated structure in which a plurality of thin films 502 and 506 and a plurality of thin films 504 and 508 may be formed (e.g., alternately formed) on the substrate 500. The dielectric structure 510 with the laminated structure may be included in a capacitor, one or both of the thin films 502 and 506 may have a thickness in a range of about 1 Å to about 100 Å, inclusive, and one or both of the thin films 504 and 506 may have a thickness of about 5 Å to about 400Å, inclusive.

Figure 20:
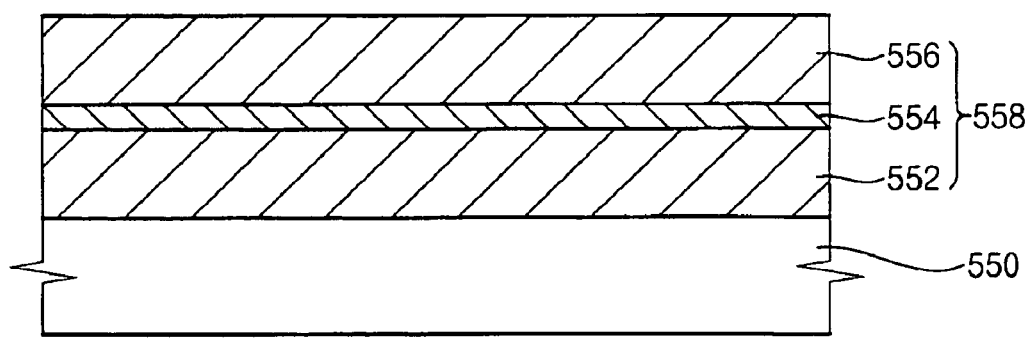
FIG. 20 is a cross sectional view illustrating a method of forming a capacitor in accordance with an exemplary embodiment of the present invention.

FIG. 20 is a cross sectional view illustrating an example embodiment of a method of forming a capacitor according to the present invention.

Referring to FIG. 20, a thin film 552 may be formed on a substrate 550 using the same, or substantially the same, process as described with reference to FIGS. 18A to 18D. A thin film 554 may be formed on the thin film 552 using the same, or substantially the same, process as described with reference to FIGS. 18F to 18I. An additional thin film 556 may be formed on the thin film 554 using the same, or substantially the same, process as used to form the thin film 552. The thin film 552 may include, for example, zirconium oxide, and the additional thin film 556 may also include, for example, zirconium oxide. However, the thin films 552 and/or 556 may be any suitable metal oxide material or combination of any suitable metal oxide material. The thin film 554 may include, for example, aluminum oxide. However, the thin films 552 and/or 556 may be any suitable metal oxide material or combination of any suitable metal oxide material. A dielectric structure 558 may have, for example, a sandwich structure in which the thin film 554 may be interposed between the thin film 552 and the additional thin film 554. The dielectric structure 558 having a sandwich structure may be included in, for example, a capacitor, one or both of the thin films 552 and 556 may have a thickness of about 1 Å to about 100 Å, inclusive, and the thickness of the thin film 554 may be in a range of about 5 Å to about 400Å, inclusive.

In another example embodiment of the present invention, a dielectric structure may have another sandwich structure in which a thin film including, for example, zirconium oxide may be interposed between two of thin films, which may include, for example, aluminum oxide. However, the thin films may be any suitable metal oxide material of combination of any suitable metal oxide materials.

FIGS. 21A to 21E are cross sectional views illustrating an example embodiment of the method of forming a capacitor according to the present invention.

Figure 21A:
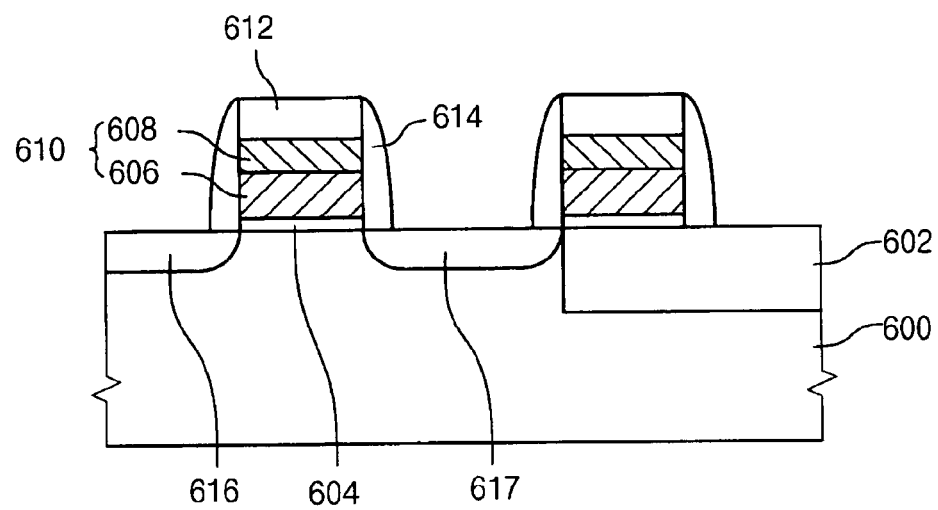
FIGS. 21A to 21E are cross sectional views illustrating a method of forming a capacitor in accordance with an exemplary embodiment of the present invention.

Referring to FIG. 21A, an active region and a field region 602 may be formed on a substrate (e.g., silicon wafer or any other suitable substrate) 600, for example, via an isolation process such as a shallow trench isolation (STI) process, although any suitable process or combination of processes may be used. A gate insulation layer pattern 604 and a gate electrode 610 may be formed on the substrate 600. The gate electrode 610 may include, for example, a polysilicon layer pattern 606 and a metal silicide layer pattern 608, however, the patterns 606 and/or 608 may include any suitable material or combination of materials. A capping layer pattern 612 may be formed on the gate electrode 610. The capping layer pattern 612 may include, for example, an oxide such as silicon oxide or a nitride such as silicon nitride, however, any suitable oxide, nitride, or combination thereof may be used.

Source/drain regions 616 and 617 may be formed at portions of the active regions, which may be adjacent to the gate electrode 610. The source/drain regions 616 and 617 may be formed, for example, by implanting impurities into the portions of the active region using, for example, the gate electrode 610 as an implantation mask. However, it will be understood that the source/drain regions 616 and/or 617 may be formed using any suitable process. The source/drain regions 616 and 617 may have, for example, shallow junction depths. A spacer 614 may be formed on sidewalls of the gate electrode 610 and the capping layer pattern 612. The spacer 614 may be formed using a nitride such as silicon nitride, however, any suitable nitride may be used.

Figure 21B:
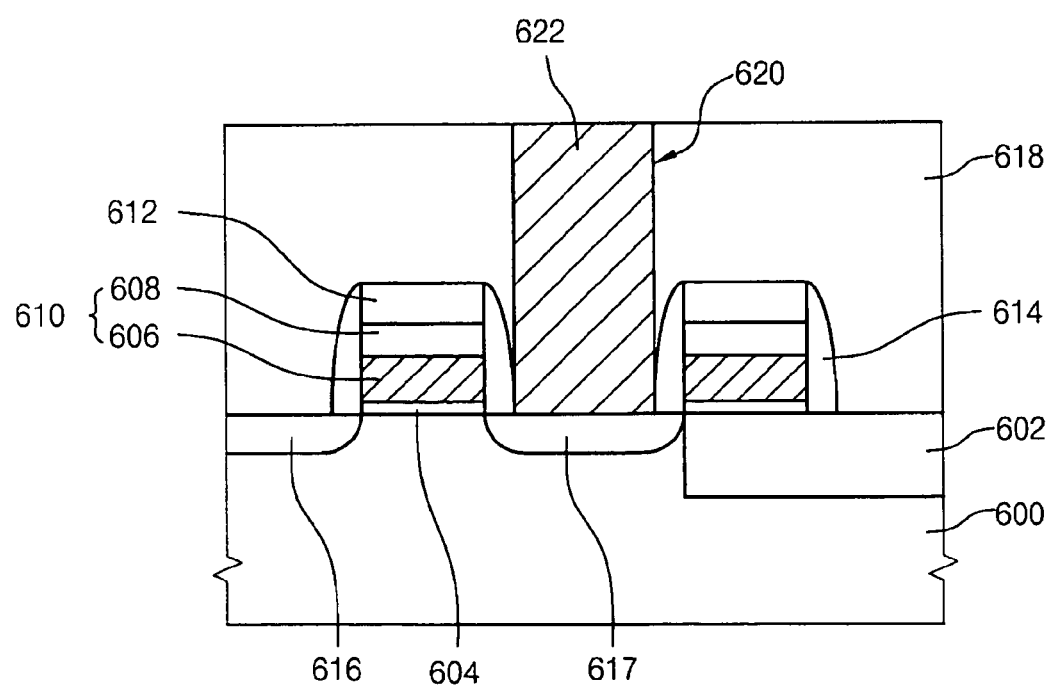

Referring to FIG. 21B, an insulation layer 618 may be formed on the substrate 600, and may cover the capping layer pattern 612 positioned on the gate electrode 610. The insulation layer 618 may be formed using an oxide material, however, any suitable insulating material may be used. The insulation layer 618 may be etched (e.g., partially etched) to form a contact hole 620, which may expose at least one of the source/drain regions 616 and/or 617. A conductive layer, which may fill, or sufficiently fill, the contact hole 620, may be formed on the insulation layer 618. The conductive layer may include a conductive material such as doped polysilicon, metal, or any suitable conductive material. The conductive layer may be removed by, for example, a chemical mechanical polishing (CMP) process, an etch back process, a combination thereof, or any other suitable process, until the insulation layer 618 may be exposed. A plug 622 may be formed in the contact hole 620, and may electrically contact the source/drain regions 616 and/or 617.

Figure 21C:
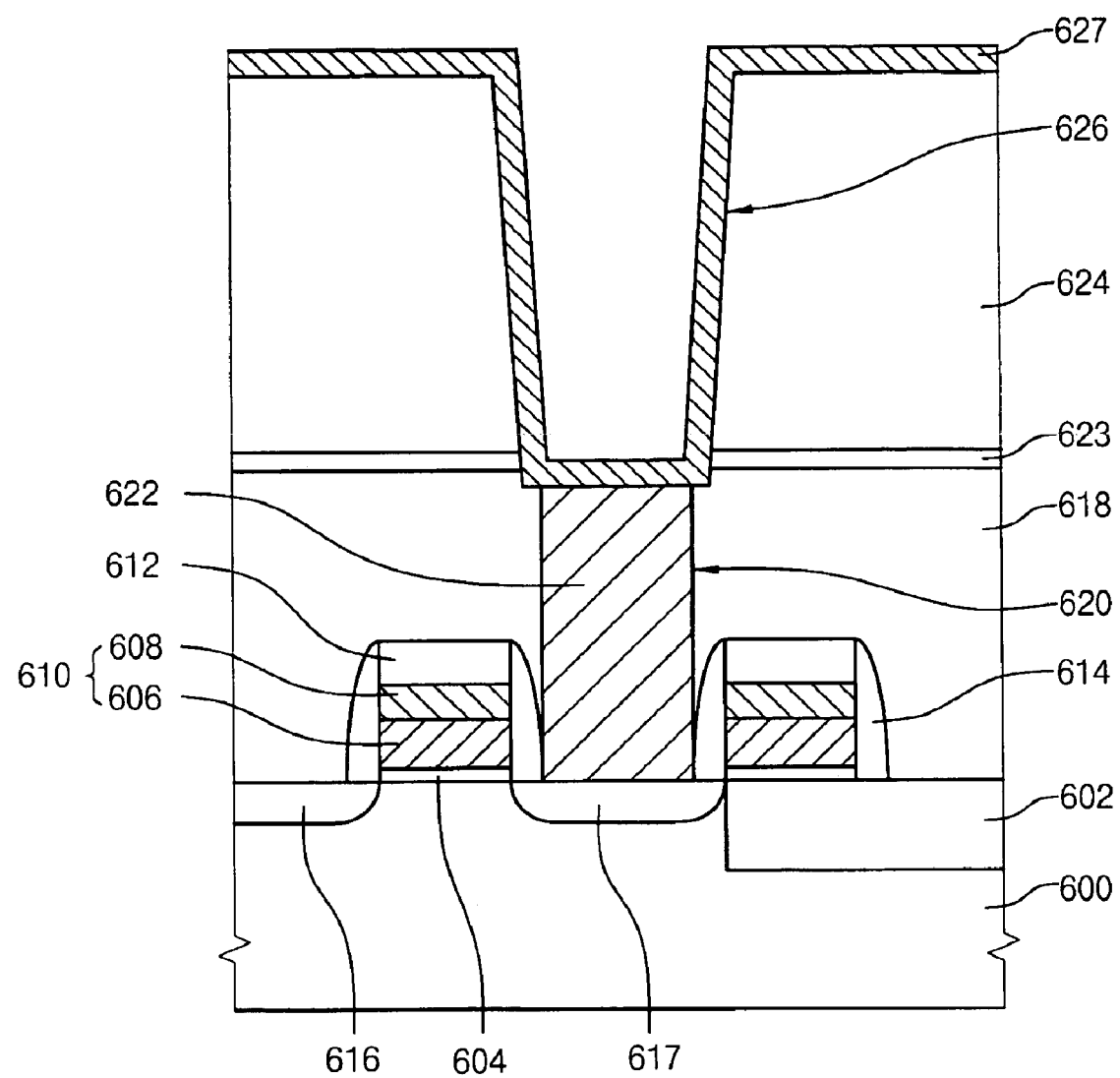

Referring to FIG. 21C, an etch stop layer 623 may be formed on the plug 622 and the insulation layer 618. The etch stop layer 623 may include a material having an etch rate higher, or substantially higher, than that of the insulation layer 618. For example, the etch stop layer 623 may include a nitride such as silicon nitride, an oxynitride such as silicon oxynitride, or any other suitable nitride, oxynitride, or combination thereof. An insulation layer 624 may be formed on the etch stop layer 623, and may include an oxide material, although any suitable insulating material may be used. The insulation layer 624 and the etch stop layer 623 may be etched (e.g., partially etched) to form a contact hole 626, which may expose the plug 622. When the contact hole 626 is formed, the insulation layer 624 may be etched to expose, for example, a portion of the etch stop layer 623. The exposed portion of the etch stop layer 623 may be etched, and the contact hole 626 through the insulation layer 624 and the etch stop layer 623, may be formed. The contact hole 626 may have a lower portion and an upper portion. A rate of etching the insulation layer 624 may decrease (e.g., gradually decrease) between the etching of the upper portion of the insulation layer 624 and the etching of the lower portion of the insulation layer 624, and the upper portion may have a larger, or substantially larger diameter than that of the lower portion. A conductive layer 627 may be formed on the insulation layer 624, the exposed contact plug 622, and an inside of the contact hole 626. The conductive layer 627 may include a conductive material such as TiN, Ru, TaN, WN, a mixture thereof, or any suitable conductive material.

Figure 21D:
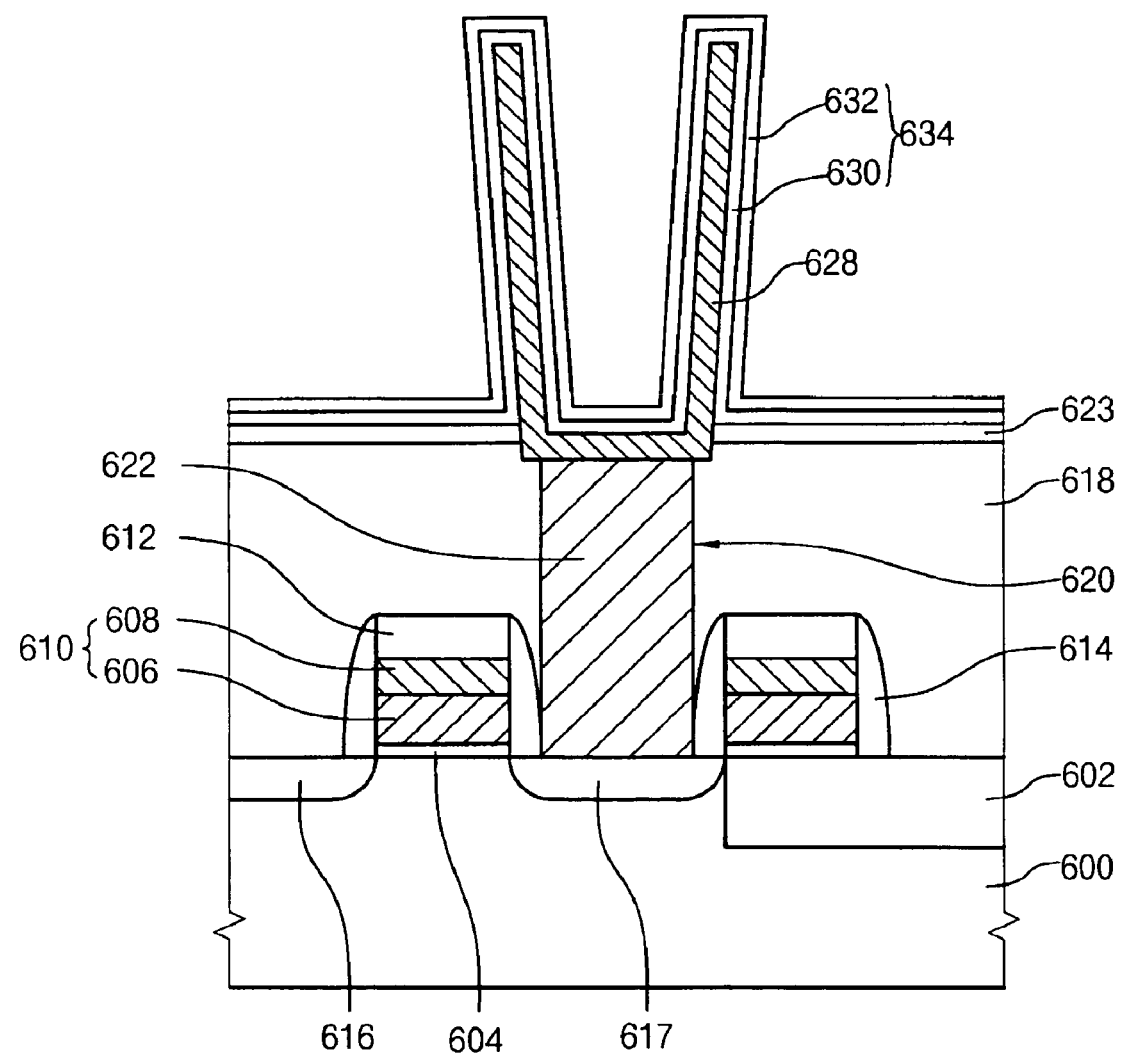

Referring to FIG. 21D, a sacrificial layer (not shown) may be formed on the conductive layer 627, and may fill, or substantially fill, the contact hole 626. The sacrificial layer and the conductive layer 627 may be partially removed, for example, until the insulation layer 624 may be exposed. A lower electrode 628 may be formed on the inside of the contact hole 626 and the exposed portion of the plug 622. A sacrificial layer pattern filling up the contact hole 626 may be formed on the lower electrode 628. The sacrificial layer pattern may be removed, which may create the lower electrode 628 electrically contacting the plug 622. The lower electrode 628 may have, for example, a cylindrical structure which may have an upper diameter, which may be larger, or substantially larger, than a lower diameter, however, any suitable structure and/or diameter may be used. For example, the lower electrode 628 may have a height of about 10,000 Å to about 17,000 Å, inclusive.

A dielectric structure 634 may be formed on the lower electrode 628 and the etch stop layer 623. The dielectric structure 634 may be formed using the same, or substantially the same, process as described with reference to FIGS. 18A to 18J. The dielectric structure 634 may include a thin film 630 of, for example, aluminum oxide and a thin film 632 of, for example, zirconium oxide, however, these oxides may be used interchangeably, in combination with one another, and/or the thin films 630 and/or 632 may be formed using any suitable metal oxide material. The thin film 630 may improve the morphology of the dielectric structure 634 and/or the thin film 632 may increase the dielectric constant of the dielectric structure 634.

The cylindrical lower electrode 628 may have increased height, and the morphology of the dielectric structure 634 may deteriorate. The thin film 630 of, for example, aluminum oxide may improve the morphology of the dielectric structure 634. As described above, the dielectric structure 534 may have a laminated structure, which may include a plurality of thin films (e.g., aluminum oxide films, zirconium oxide films, or films including any suitable metal oxide material) alternately formed on a lower electrode. The dielectric structure 634 may have a sandwich structure in which a thin film (e.g., aluminum oxide) may be formed between two other thin films (zirconium oxide), or a thin film (e.g., zirconium oxide) may be interposed between two other thin films (e.g., aluminum oxide).

Figure 21E:
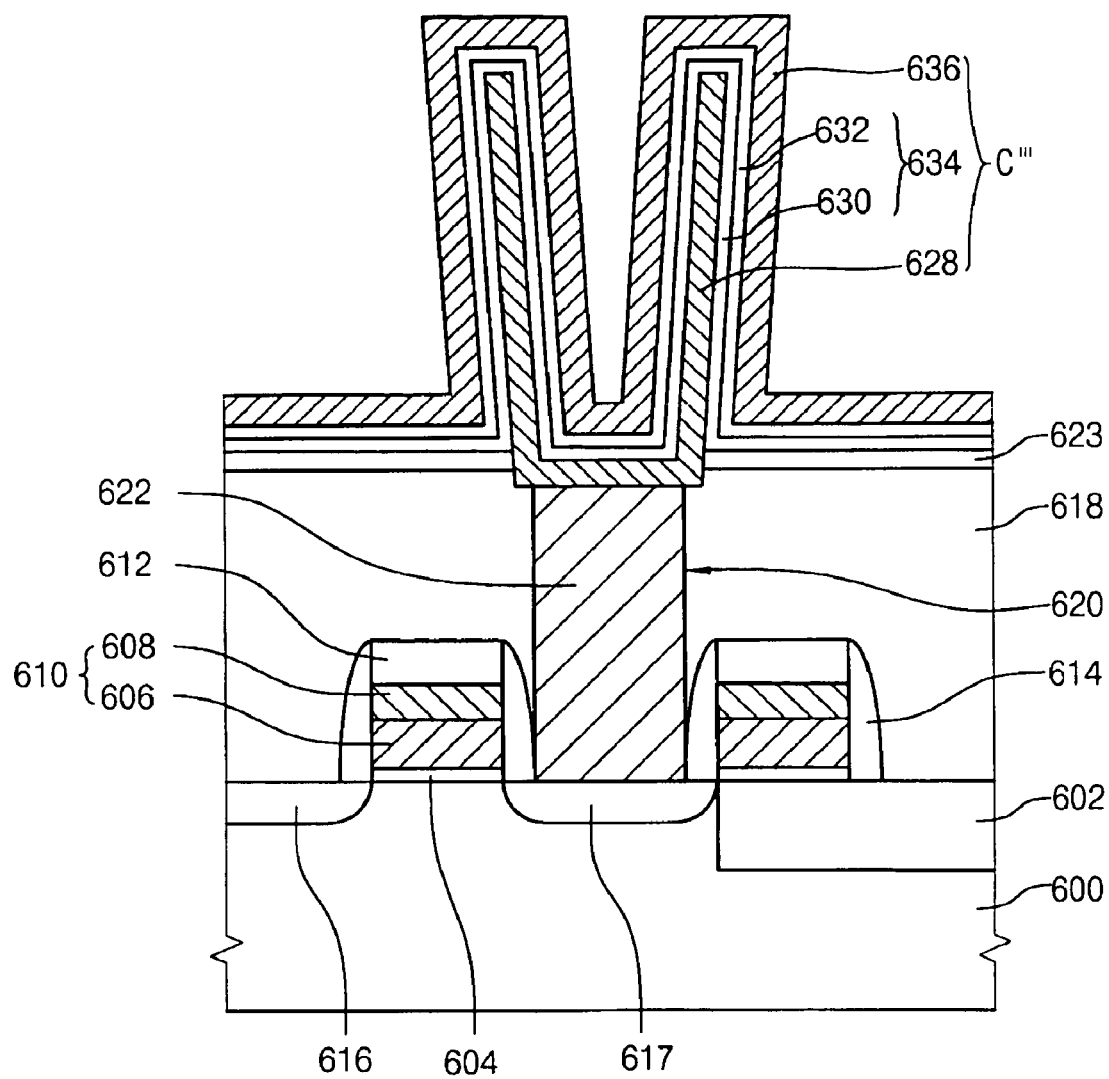

Referring to FIG. 21E, the dielectric structure 634, which may include the thin films 630 and 632 may be thermally treated to cure the dielectric structure 634 and/or suppress impurities, which may be contained in the dielectric structure 634. For example, the dielectric structure 634 may be thermally treated using an ultra violet ray, an ozone gas, an ozone plasma, or any suitable gas or technique for thermally treating a dielectric structure.

An upper electrode 636 may be formed on the dielectric structure 634 to form the capacitor C''', which may include the lower electrode 628, the dielectric structure 634, ,and the upper electrode 636 on the substrate 600. The upper electrode 636 may include a conductive material such as doped polysilicon, metal, metal nitride, a combination thereof, any other suitable material, or combination of suitable materials. For example, the upper electrode 636 may include TiN, Ru, TaN, WN, or a mixture thereof.

Figure 22:
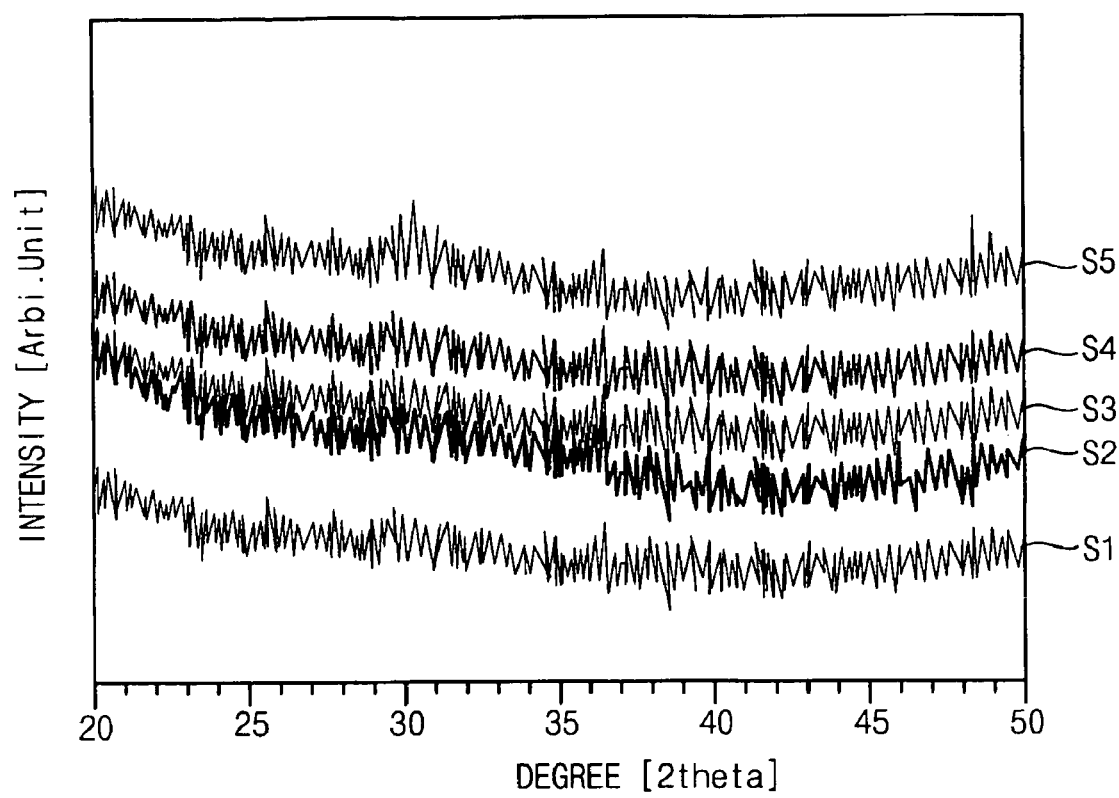
FIG. 22 illustrates a crystalline structure of a thin film including zirconium oxide in accordance with an exemplary embodiment of the present invention.

FIG. 22 illustrates an example crystalline structure of a thin film, which may include zirconium oxide according to an example embodiment of the present invention.

As illustrated in FIG. 22, a first sample S1 of a thin film including zirconium oxide was obtained by an ALD process in which TEMAZ was provided at a temperature of about 350° C. for about 3 seconds, an argon purge gas was provided for about 10 seconds, ozone was provided for about 5 seconds, and a an argon purge gas was provided for about 10 seconds. The process was repeated at least once. The first sample S1 had a thickness of about 60 Å.

A second sample S2 was formed using the same, or substantially the same, process as the first sample S1, however, TEMAZ was not provided. The second sample S2 was manufactured at a temperature of about 325° C. such that the second sample S2 had a thickness of about 60 Å. A third sample S3 was manufactured at a temperature of about 300° C. and had a thickness of about 56 Å. A fourth sample S4 was formed at a temperature of about 275° C. such that the fourth sample S4 had a thickness of about 53 Å. A fifth sample S5 was manufactured at a temperature of about 250° C. and had a thickness of about 48 Å.

Crystalline structures of the first to fifth samples S1, S2, S3, S4 and S5 were analyzed using, for example, an X-ray diffractometer, although any other suitable analyzer may be used. All of the samples S1, S2, S3, S4 and S5 had amorphous structures with suppressed crystallization thereof as shown in FIG. 22. When the thin film is formed using, for example, TEMAZ and/or an oxidant at a temperature of about 250° C. to about 350° C., inclusive, the thin film (e.g., including zirconium oxide) may have an amorphous structure with suppressed crystallization. When a dielectric structure includes, for example, a thin film of zirconium oxide, the crystallization of the dielectric structure may be suppressed during and/or after successive processes at higher temperatures, for example, about 500° C. When a dielectric structure includes a thin film of, for example, aluminum oxide and/or a thin film of zirconium oxide, the dielectric structure may have improved morphology and/or a higher crystallization temperature.

Figure 23:
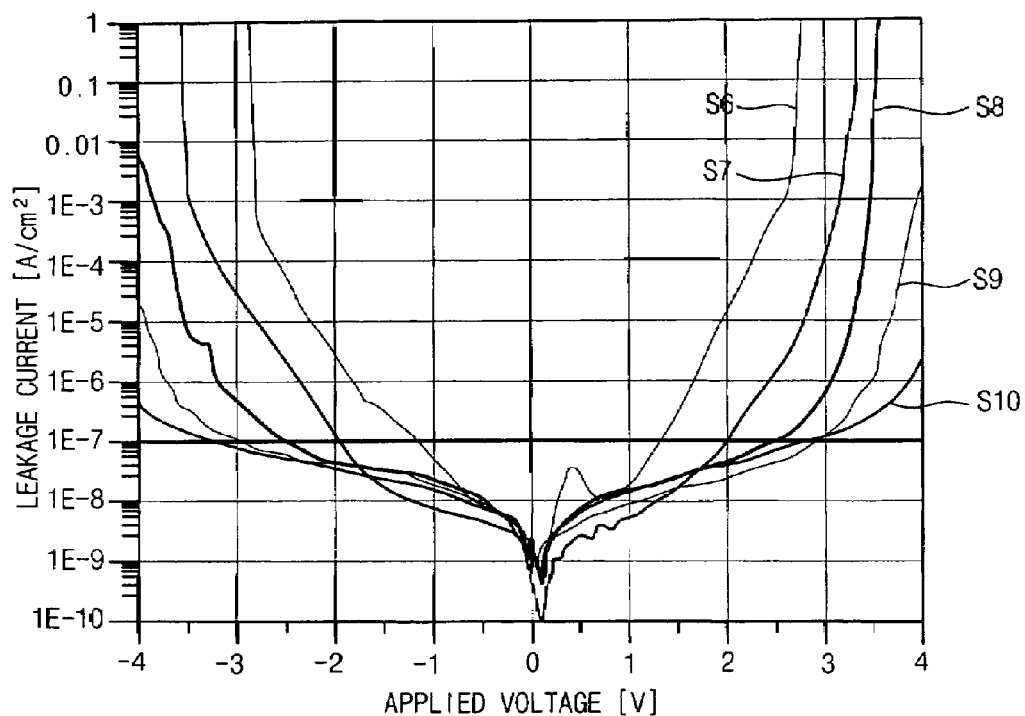
FIG. 23 illustrates a leakage current with respect to voltage of a thin film including zirconium oxide according to an exemplary embodiment of the present invention.

FIG. 23 illustrates a leakage current with respect to voltage of an example thin film (e.g., including zirconium oxide) according to an example embodiment of the present invention. In FIG. 23, a horizontal axis (an x-axis) indicates the applied voltage and a vertical axis (a y-axis) represents the leakage current of the thin film.

Referring to FIG. 23, a sixth sample S6 of a thin film (e.g., including zirconium oxide) was manufactured at a temperature of about 300° C. using the same, or substantially the same, process used for forming the first sample S1, and produced a thickness of about 66 Å. A seventh sample S7 having a thickness of about 90 Å, an eighth sample S8 having a thickness of about 115 Å, a ninth sample S9 having a thickness of about 140 Å, and a tenth sample S10 having a thickness of about 164 Å were manufactured through the same, or substantially the same, process used for forming the sixth sample S6.

As shown in FIG. 23, the sixth sample S6 may have stable leakage current characteristic at an applied voltage of less than about 1.2V, and may have an EOT of about 11.8Å. The seventh sample S7 may have a stable leakage current characteristic at an applied voltage of less than about 1.9V, and may have an EOT of about 10.0 Å. The eighth sample S8 may have a stable leakage current characteristic at an applied voltage of less than about 2.5V, and may have an EOT of about 12.2Å. The ninth sample S9 may have a stable leakage current characteristic at an applied voltage of less than about 2.8V, and may have an EOT of about 15.1 Å. The tenth sample S10 may have a stable leakage current characteristic at an applied voltage of less than about 2.8V, and may have an EOT of about 18.2 Å.

As illustrated by the examples shown in FIG. 23, the thin film according to example embodiments of the present invention (e.g., including zirconium oxide) may have an improved leakage current characteristic and/or a smaller EOT. When the thin film according to example embodiments of the present invention is used in a dielectric structure of a capacitor, the capacitor may have higher and/or improved electrical characteristics.

Figure 24:
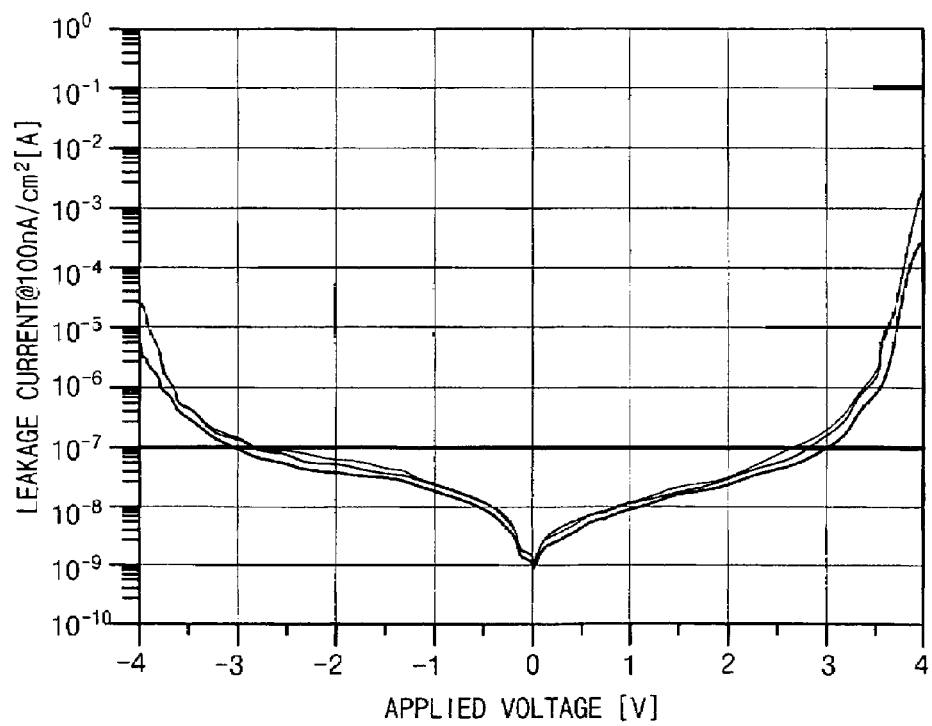
FIG. 24 illustrates a leakage current with respect to voltage of a dielectric structure having a sandwich structure according to an exemplary embodiment of the present invention.

FIG. 24 illustrates a leakage current with respect to voltage of a dielectric structure, which may have a sandwich structure according to an example embodiment of the present invention. In FIG. 24, a horizontal axis (an x-axis) indicates the applied voltage and a vertical axis (a y-axis) represents the leakage current of the dielectric structure, which may have a sandwich structure.

The dielectric structure included a thin film of, for example, zirconium oxide, which may have an EOT of about 11.7 Å, a thin film of, for example, aluminum oxide, which may have an EOT of about 12.6 Å, and an additional thin film of, for example, zirconium oxide, which may have an EOT of about 11.8 Å. The dielectric structure was manufactured using the same, or substantially the same, process as described with reference to FIG. 20.

As illustrated in FIG. 24, the thin films may have stable leakage current characteristics at an applied voltage of less than about 3.0V, and the dielectric structure, according to example embodiments of the present invention, may have improved morphology, higher dielectric constant and/or be thinner.

Figure 25:
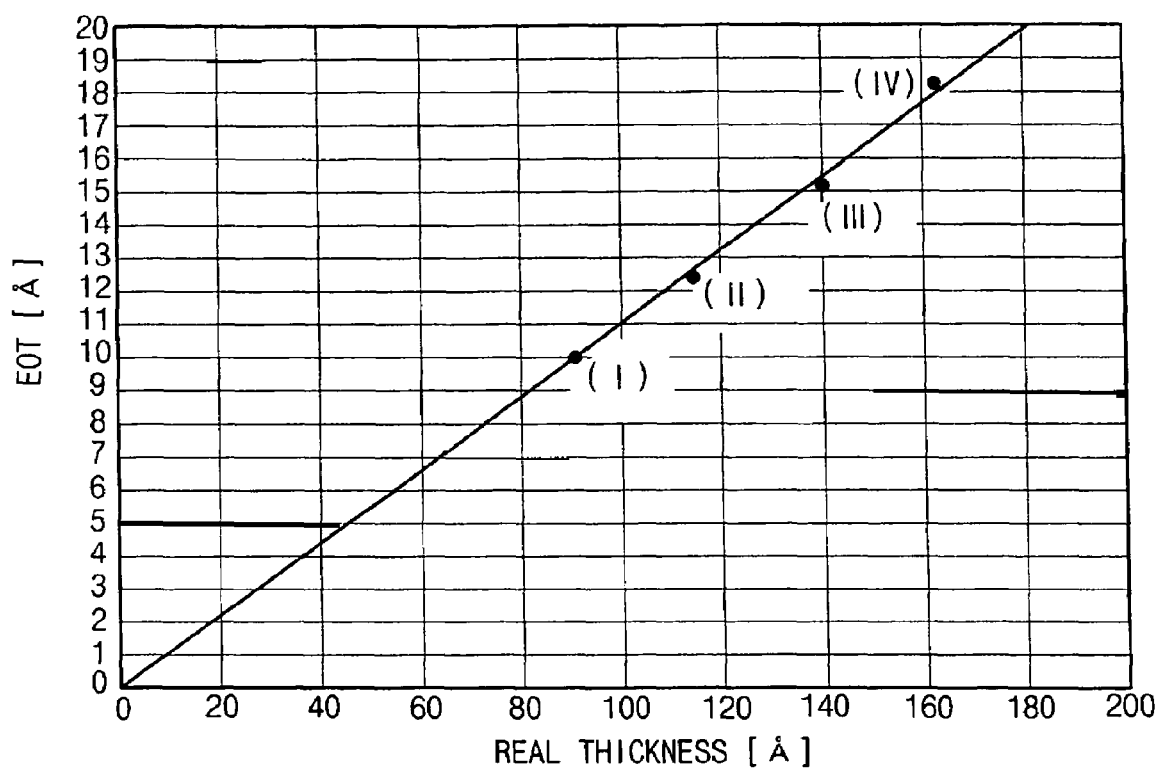
FIG. 25 illustrates an EOT with respect to a real thickness of a thin film including zirconium oxide according to an exemplary embodiment of the present invention.

FIG. 25 illustrates an EOT with respect to a physical thickness of a thin film according to an example embodiment of the present invention (e.g., including zirconium oxide). In FIG. 25, a horizontal axis (an x-axis) indicates the physical thickness of the thin film and a vertical axis (a y-axis) represents the EOT of the thin film. In FIG. 25, (I) indicates a physical thickness and an EOT of the seventh sample S7, and (II) represents a physical thickness) and an EOT of the eighth sample S8. (III) represents a physical thickness and an EOT of the ninth sample S9, and (IV) indicates a physical thickness and an EOT of the tenth sample S10.

As shown in FIG. 25, the EOT may increase, for example, linearly, relative to the physical thickness of a thin film according to one or more example embodiments of the present invention (e.g., including zirconium oxide), and the relationship between the EOT and the physical thickness may be represented by the following equation (1).

$$Y = 0.11109X \times 0.0073 \quad (1)$$

A dielectric constant of the thin film according to an example embodiment of the present invention, (e.g., including zirconium oxide) may be obtained in accordance with the following equations (2) and (3).

$$C_1 = \epsilon_0 \epsilon_{R1} \times A_1 / d_1 \quad (2),$$

wherein $C_1$ represents a capacitance of the thin film, for example, when the thickness of the thin film may be indicated by the EOT converted from the physical thickness, $\epsilon_0$ represents a dielectric constant in a vacuum, $\epsilon_{R1}$ indicates a relative dielectric constant of an oxide film, $A_1$ represents an area of the thin film, and $d_1$ represents the EOT of the thin film. The relative dielectric constant of the oxide film may be about 3.9.

$$C_2 = \epsilon_0 \epsilon_{R2} \times A_2 / d_2 \quad (3),$$

wherein $C_2$ represents the capacitance of the thin film when the thin film has a physical thickness of $d_2$, $\epsilon_{R2}$ represents a relative dielectric constant of the thin film, $A_2$ represents the area of the thin film, and $d_2$ represents the physical thickness of the thin film.

In the above equations (2) and (3), $C_1$ may be equal, or substantially equal, to $C_2$, and the following equation (4) may be obtained by combining the equations (2) and (3).

$$\epsilon_{R2} = 3.9 \times d_2 / d_1 \quad (4)$$

In the above equation (4), a ratio of $d_2$ to $d_1$ may be varied such that the ratio of $d_2$ to $d_1$ may be represented as a slope in the above equation (1), thereby obtaining $\epsilon_{R2}$ of about 35.1. Thus, the thin film according to an example embodiment of the present invention (e.g., including zirconium oxide) may have a higher, or substantially higher, dielectric constant when compared to that of a conventional zirconium oxide film, which may have a dielectric constant of about 20 to about 30, and The dielectric structure in accordance with example embodiments of the present invention may have a higher dielectric constant of greater than about 30.

Although example embodiments of the present invention have been discussed with regard to specific temperature, pressure, and/or layer thickness ranges, it will be understood that any suitable temperature, pressure, and/or layer thickness may be used.

Although example embodiments of the present invention have been described with regard to thin films including at least one of aluminum oxide, zirconium oxide, hafnium oxide, and the like, it will be understood that any suitable metal oxide material may be used.

Although example embodiments of the present invention have been described with regard to oxidants such as ozone ($O_3$), oxygen gas ($O_2$), oxygen plasma, and the like, it will be understood that any suitable oxidant may be used.

Although example embodiments of the present invention have been described with regard to electrodes including TiN, Ru, TaN, WN, and the like, it will be understood that any suitable material may be used.

Although example embodiments of the present invention have been described with regard to processes such as CVD, ALD, and the like, it will be understood that any suitable process may be used.

According to example embodiments of the present invention, a dielectric structure may includes at least two thin films such that the dielectric structure having a higher dielectric constant and/or a higher morphology may be more easily manufactured. The dielectric structure may be included in a capacitor, and the capacitor may have a higher capacitance, improved electrical characteristics, and/or enhanced reliability.

Although example embodiments of the present invention have been described, it is understood that the present invention should not be limited to these example embodiments but various changes and modifications can be made by one skilled in the art within the spirit and scope of the present invention as hereinafter claimed.

What is claimed is:

1. A method of forming a capacitor, the method comprising:
   forming a first electrode on a substrate;
   forming a dielectric structure on the first electrode, the dielectric structure including a first thin film and a second thin film formed on the first thin film, the second thin film having at least one of an equivalent oxide thickness smaller than that of the first thin film and a dielectric constant higher than that of the first thin film, and the second thin film being formed using a material including TEMAZ (tetrakis methyl ethyl amino zirconium; Zr[N(CH$_3$)(C$_2$H$_5$)]$_4$), zirconium butyl oxide (Zr(O-tBu)$_4$) or a mixture thereof; and
   forming a second electrode on the dielectric structure.

2. The method of claim 1, wherein the first electrode includes at least one of titanium nitride (TiN), ruthenium (Ru), tantalum nitride (TaN) and tungsten nitride (WN).

3. The method of claim 1, wherein the first electrode is formed by an atomic layer deposition (ALD) process or a chemical vapor deposition (CVD) process.

4. The method of claim 1, wherein forming the dielectric structure further includes,
forming the first thin film including aluminum oxide on the first electrode using a first material including an aluminum precursor and a first oxidant for oxidizing the first material, and
forming the second thin film including zirconium oxide on the first thin film using a second material including a zirconium precursor and a second oxidant for oxidizing the second material.

5. The method of claim 4, wherein the first material includes TMA (trimethyl aluminum, $l(CH_3)_3$).

6. The method of claim 4, wherein the first and the second oxidants include at least one of ozone ($O_3$), oxygen ($O_2$), water vapor ($H_2O$), oxygen plasma and remote oxygen plasma.

7. The method of claim 4, wherein forming the first thin film further includes,
providing the first material on the first electrode,
chemically absorbing a first portion of the first material to the first electrode and physically absorbing a second portion of the first material to the chemically absorbed first portion of the first material,
removing the physically absorbed second portion of the first material,
providing the first oxidant on the chemically absorbed first portion of the first material,
forming a first metal oxide material on the first electrode by chemically reacting the first oxidant with the chemically absorbed first portion of the first material, and
removing an unreacted first oxidant.

8. The method of claim 7, wherein providing the first material, chemically absorbing the first portion of the first material, physically absorbing the second portion of the first material, removing the physically absorbed second portion of the first material, providing the first oxidant, forming the first metal oxide material, and removing the unreacted first oxidant are repeated at least once.

9. The method of claim 4, wherein forming the second thin film further includes,
providing the second material onto the first thin film,
chemically absorbing a first portion of the second material to the first thin film and physically absorbing a second portion of the second material to the chemically absorbed first portion of the second material,
removing the physically absorbed second portion of the second material,
providing the second oxidant onto the chemically absorbed first portion of the second material,
forming a second metal oxide material on the first thin film by chemically reacting the second oxidant with the chemically absorbed first portion of the second material, and
removing an unreacted second oxidant.

10. The method of claim 9, wherein providing the second material, chemically absorbing the first portion of the second material, physically absorbing the second portion of the second material, removing the physically absorbed second portion of the second material, providing the second oxidant, forming the second metal oxide material, and removing the unreacted second oxidant are repeated at least once.

11. The method of claim 1, wherein the dielectric structure is formed at a temperature of about 200° C. to about 400° C.

12. The method of claim 1, wherein the dielectric structure is formed at a pressure of about 0.1 Torr to about 3.0 Torr.

13. The method of claim 1, wherein forming the dielectric structure having a double-layered structure that has the first thin film and the second thin film, further includes,
forming the first thin film on the first electrode, and
forming the second thin film on the first thin film.

14. The method of claim 1, wherein forming the dielectric structure having a structure in which the second thin film is interposed between two first thin films further includes,
forming the first thin film on the first electrode,
forming the second thin film on the first thin film, and
forming an additional first thin film on the second thin film.

15. The method of claim 1, wherein forming the dielectric structure having a structure in which the first thin film is interposed between two of second thin films further includes,
forming the second thin film on the first electrode,
forming the first thin film on the second thin film, and
forming an additional second thin film on the first thin film.

16. The method of claim 1, wherein forming the dielectric structure having a laminated structure in which a plurality of first thin films and a plurality of second thin films are alternately stacked, further includes,
forming the first thin film on the first electrode,
forming the second thin film on the first thin film and
alternately forming at least one additional first thin film and at least one additional second thin film on the second thin film.

17. The method of claim 1, wherein at least one of the first thin film has a thickness of about 1 Å to about 100 Å, inclusive, and the second thin film has a thickness of about 5 Å to about 400 Å, inclusive.

18. The method of claim 1, wherein the second thin film has a dielectric constant of greater than or equal to about 30.

19. The method of claim 1, wherein the second electrode includes at least one of polysilicon, titanium nitride, ruthenium, tantalum nitride and tungsten nitride.

20. The method of claim 1, wherein the second electrode is formed by an ALD process or a CVD process.

21. A method of forming a capacitor, the method comprising:
forming a first electrode on a substrate;
forming a dielectric structure on the first electrode, the dielectric structure including at least one first thin film and at least one second thin film formed on the first thin film, the second thin film having at least one of an equivalent oxide thickness smaller than that of the first thin film and a dielectric constant higher than that of the first thin film, and the second thin film being formed using a material including TEMAZ (tetrakis methyl ethyl amino zirconium; $Zr[N(CH_3)(C_2H_5)]_4$), zirconium butyl oxide ($Zr(O\text{-}tBu)_4$) or a mixture thereof; and
forming a second electrode on the dielectric structure.

22. The method of claim 21, wherein the first electrode is a cylindrical electrode.

23. The method of claim 21, wherein the first electrode includes at least one of titanium nitride, ruthenium, tantalum nitride and tungsten nitride.

24. The method of claim 21, wherein the dielectric structure is formed at at least one of a temperature of about 200° C. to about 400° C., inclusive, and a pressure of about 0.1 Torr to about 3.0 Torr, inclusive.

25. The method of claim 21, wherein forming the dielectric structure further includes,
providing a first material including TMA onto the first electrode, chemically absorbing a first portion of the first material to the first electrode and physically absorbing a second portion of the first material to the chemically absorbed first portion of the first material, removing the physically absorbed second portion of the first material, providing a first oxidant including at least one of ozone, oxygen, water vapor, oxygen plasma or remote oxygen plasma onto the chemically absorbed first portion of the first material, forming the first thin film on the first electrode by chemically reacting the first oxidant with the chemically absorbed first portion of the first material, removing an unreacted first oxidant, providing a second material including at least one of TEMAZ or zirconium butyl oxide on the first thin film, chemically absorbing a first portion of the second material to the first thin film and physically absorbing a second portion of the second material to the chemically absorbed first portion of the second material, removing the physically absorbed second portion of the second material, providing a second oxidant including at least one of ozone, oxygen, water vapor, oxygen plasma or remote oxygen plasma onto the chemically absorbed first portion of the second material, forming the second thin film on the first thin film by chemically reacting the second oxidant with the chemically absorbed first portion of the second material, and removing an unreacted second oxidant.

26. The method of claim 25, wherein providing the first material, chemically absorbing the first portion of the first material, physically absorbing the second portion of the first material, removing the physically absorbed second portion of the first material, providing the first oxidant, forming the first thin film, and removing the unreacted first oxidant are repeated at least once.

27. The method of claim 25, wherein providing the second material, chemically absorbing the first portion of the second material, physically absorbing the second portion of the second material, removing the physically absorbed second portion of the second material, providing the second oxidant, forming the second thin film, and removing the unreacted second oxidant are repeated at least once.

28. The method of claim 25, wherein providing the first material, chemically absorbing the first portion of the first material, physically absorbing the second portion of the first material, removing the physically absorbed second portion of the first material, providing the first oxidant, forming the first thin film, removing the unreacted first oxidant, providing the second material, chemically absorbing the first portion of the second material, physically absorbing the second portion of the second material, removing the physically absorbed second portion of the second material, providing the second oxidant, forming the second thin film, and removing the unreacted second oxidant are repeated at least once.

29. The method of claim 21, wherein forming the dielectric structure having a double-layered structure that has the first thin film and the second thin film, further includes,
forming the first thin film on the first electrode, and
forming the second thin film on the first thin film.

30. The method of claim 21, wherein forming the dielectric structure having a structure in which the second thin film is interposed between two first thin films further includes,
forming the first thin film on the first electrode,
forming the second thin film on the first thin film, and
forming an additional first thin film on the second thin film.

31. The method of claim 21, wherein forming the dielectric structure having a structure in which the first thin film is interposed between two second thin films further includes,
forming the second thin film on the first electrode,
forming the first thin film on the second thin film, and
forming an additional second thin film on the first thin film.

32. The method of claim 21, wherein forming the dielectric structure having a laminated structure in which a plurality of first thin films and a plurality of second thin films are alternately stacked further includes,
forming the first thin film on the first electrode,
forming the second thin film on the first thin film, and
alternately forming at least one additional first thin film and at least one additional second thin film on the second thin film.

33. The method of claim 21, wherein the second thin film has a dielectric constant of greater than or equal to about 30.

34. The method of claim 21, wherein the at least one of the first thin film has a thickness of about 1 Å to about 100 Å, inclusive, and the second thin film has a thickness of about 5 Å to about 400 Å, inclusive.

35. The method of claim 21, wherein the second electrode is formed by an ALD process or a CVD process using at least one of polysilicon, titanium nitride, ruthenium, tantalum nitride and tungsten nitride.

36. A method of forming a dielectric structure, the method comprising:
forming at least one first thin film; and
forming at least one second thin film on the first thin film, the at least one second thin film having an equivalent oxide thickness smaller than that of the first thin film and a dielectric constant higher than that of the first thin film, and the second thin film being formed using a material including TEMAZ (tetrakis methyl ethyl amino zirconium; $Zr[N(CH_3)(C_2H_5)]_4$), zirconium butyl oxide ($Zr(O-tBu)_4$) or a mixture thereof.

37. A method of forming a capacitor, the method comprising:
forming a first electrode on a substrate;
forming a dielectric structure in accordance with the method of claim 36; and
forming a second electrode on the dielectric structure.

* * * * *